US011955177B2

United States Patent
Song

(10) Patent No.: US 11,955,177 B2
(45) Date of Patent: Apr. 9, 2024

(54) THREE-DIMENSIONAL FLASH MEMORY INCLUDING MIDDLE METALLIZATION LAYER AND MANUFACTURING METHOD THEREOF

(71) Applicant: Samsung Electronics Co., Ltd., Suwon-si (KR)

(72) Inventor: Yun Heub Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 610 days.

(21) Appl. No.: 17/273,188

(22) PCT Filed: Jul. 19, 2019

(86) PCT No.: PCT/KR2019/008931
§ 371 (c)(1),
(2) Date: Mar. 3, 2021

(87) PCT Pub. No.: WO2020/050491
PCT Pub. Date: Mar. 12, 2020

(65) Prior Publication Data
US 2021/0327510 A1    Oct. 21, 2021

(30) Foreign Application Priority Data

| Sep. 5, 2018 | (KR) | 10-2018-0105693 |
| Oct. 5, 2018 | (KR) | 10-2018-0118610 |
| Dec. 4, 2018 | (KR) | 10-2018-0154126 |

(51) Int. Cl.
*G11C 16/04* (2006.01)
*H01L 23/528* (2006.01)
(Continued)

(52) U.S. Cl.
CPC ...... *G11C 16/0483* (2013.01); *H01L 23/5283* (2013.01); *H10B 41/10* (2023.02);
(Continued)

(58) Field of Classification Search
CPC .... G11C 16/0483; H10B 41/10; H10B 41/27; H10B 43/10; H10B 43/27
See application file for complete search history.

(56) References Cited

U.S. PATENT DOCUMENTS

| 8,278,170 B2 | 10/2012 | Lee et al. |
| 8,902,659 B2 | 12/2014 | Chan |

(Continued)

FOREIGN PATENT DOCUMENTS

| KR | 20100100397 A | 9/2010 |
| KR | 20110140018 A | 12/2011 |

(Continued)

OTHER PUBLICATIONS

Notice of Allowance issued in corresponding Korean Application No. 10-2018-0105693 (dated Feb. 17, 2020).

(Continued)

*Primary Examiner* — Daniel P Shook
(74) *Attorney, Agent, or Firm* — Myers Bigel, P.A.

(57) ABSTRACT

A three-dimensional flash memory including an intermediate wiring layer and a method of manufacturing the same are disclosed. According to an embodiment, a method of manufacturing a three-dimensional flash memory by using a back end process includes: forming a lower string in a first block, the first block including a sacrificial layer and an insulation layer which are formed to extend in a first direction and are alternately stacked; generating an inter-string insulation layer on the first block that has the lower string formed therein; etching at least a portion of the inter-string insulation layer to form at least one sacrificial film in a space where the at least a portion is etched; generating a second block on the inter-string insulation layer, where the at least one sacrificial film is formed, the second block including a sacrificial layer and an insulation layer which are formed to extend in the first direction and are alternately stacked;

(Continued)

forming an upper string in the second block; etching the sacrificial layer included in the first block, the at least one sacrificial film, and the sacrificial layer included in the second block; and forming an electrode layer, which is to be used as at least one intermediate wiring layer, in a space where the at least one sacrificial film is etched, and an electrode layer, which is to be used as a word line, in a space where the sacrificial layer included in the first block is etched and a space where the sacrificial layer included in the second block is etched.

20 Claims, 56 Drawing Sheets

(51) Int. Cl.
  *H10B 41/10*  (2023.01)
  *H10B 41/27*  (2023.01)
  *H10B 41/30*  (2023.01)
  *H10B 43/10*  (2023.01)
  *H10B 43/27*  (2023.01)
  *H10B 43/30*  (2023.01)

(52) U.S. Cl.
  CPC ............ *H10B 41/27* (2023.02); *H10B 41/30* (2023.02); *H10B 43/10* (2023.02); *H10B 43/27* (2023.02); *H10B 43/30* (2023.02)

(56) References Cited

U.S. PATENT DOCUMENTS

| | | | |
|---|---|---|---|
| 9,042,177 | B2 | 5/2015 | Aritome |
| 9,076,865 | B2 | 7/2015 | Lee et al. |
| 9,691,783 | B2 | 6/2017 | Yoon |
| 10,229,927 | B2 | 3/2019 | Lee et al. |
| 10,396,093 | B2 | 8/2019 | Song et al. |
| 2011/0316072 | A1 | 12/2011 | Lee |
| 2015/0023103 | A1 | 1/2015 | Aritome |
| 2015/0097155 | A1 | 4/2015 | Bateman |
| 2015/0115455 | A1* | 4/2015 | Chen ............... H10B 43/50 257/773 |
| 2015/0162341 | A1 | 6/2015 | Aritome |
| 2015/0279855 | A1 | 10/2015 | Lu et al. |
| 2018/0175052 | A1 | 6/2018 | Sim et al. |

FOREIGN PATENT DOCUMENTS

| | | |
|---|---|---|
| KR | 20120003351 A | 1/2012 |
| KR | 20140026148 A | 3/2014 |
| KR | 20150008377 A | 1/2015 |
| KR | 20150010134 A | 1/2015 |
| KR | 20150064520 A | 6/2015 |
| KR | 20150066934 A | 6/2015 |
| KR | 20160003977 A | 1/2016 |
| KR | 20160095557 A | 8/2016 |
| KR | 20160111972 A | 9/2016 |
| KR | 20180071716 A | 6/2018 |
| KR | 20180096877 A | 8/2018 |

OTHER PUBLICATIONS

Notice of Allowance issued in corresponding Korean Application No. 10-2018-0118610 (dated Apr. 2, 2020).

Notice of Allowance issued in corresponding Korean Application No. 10-2018-0154126 (dated Jul. 22, 2020).

International Search Report corresponding to International Application No. PCT/KR2019/008931 (dated Nov. 6, 2019).

\* cited by examiner

RELATED ART

RELATED ART

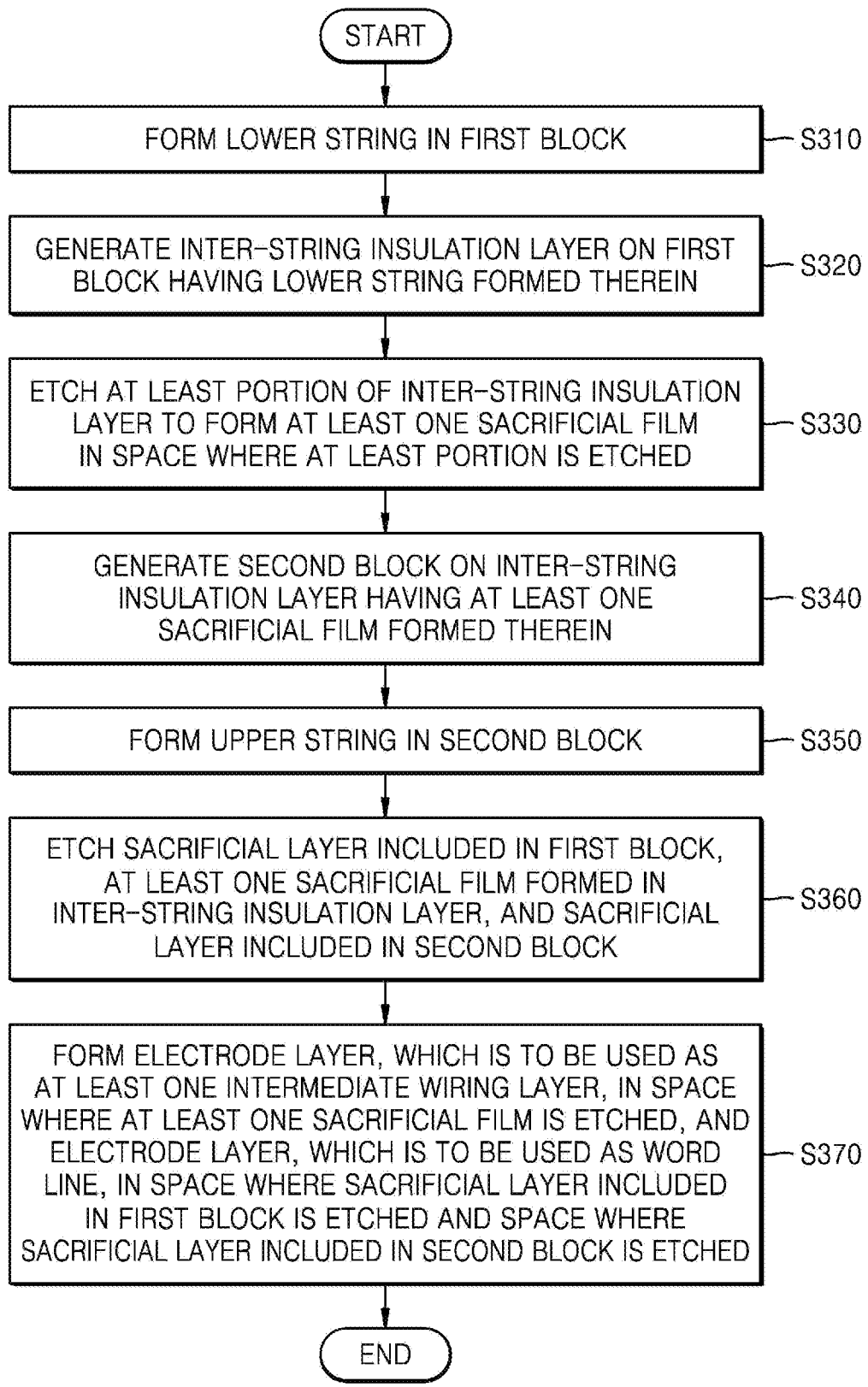

FIG. 4F
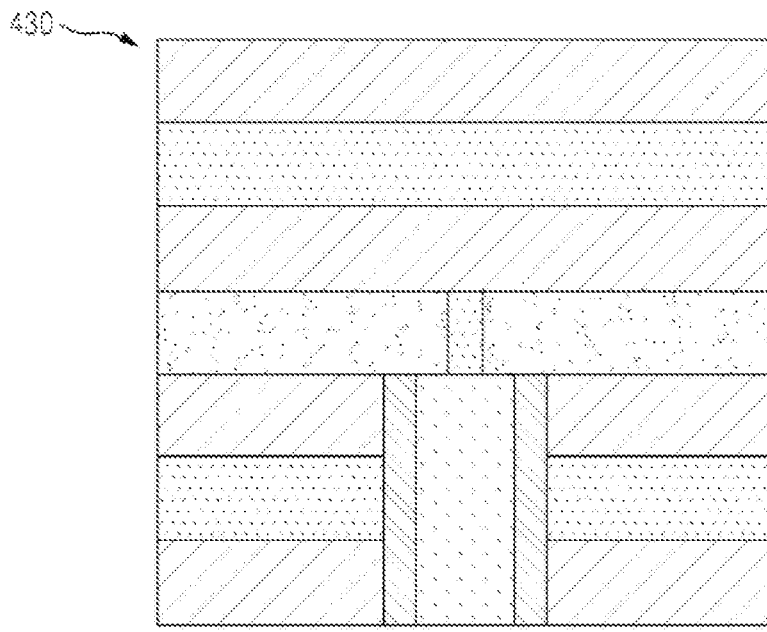
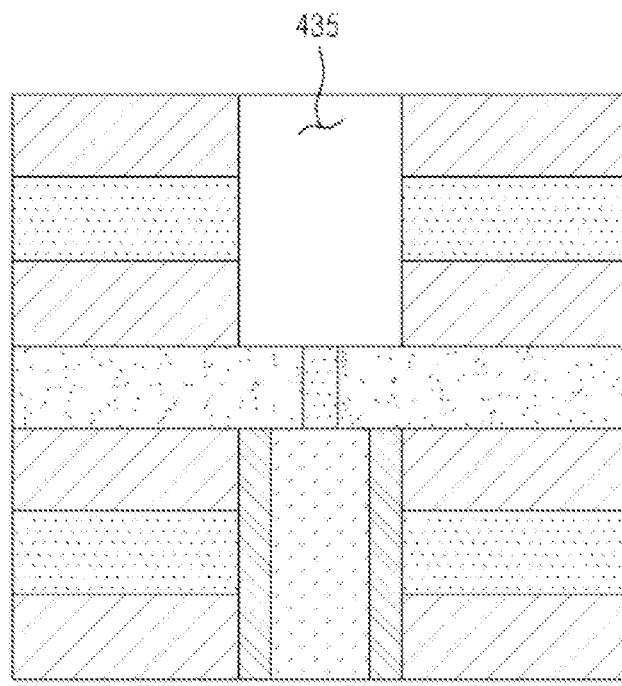

FIG. 4G
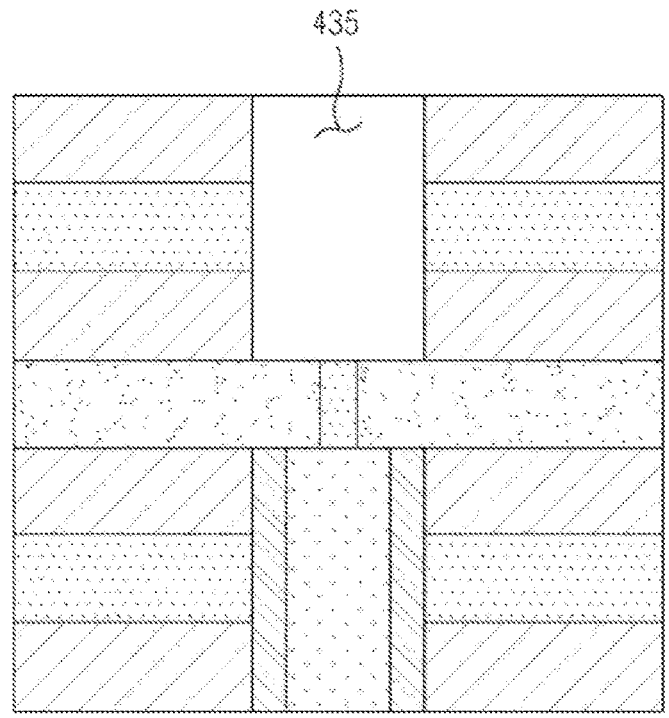
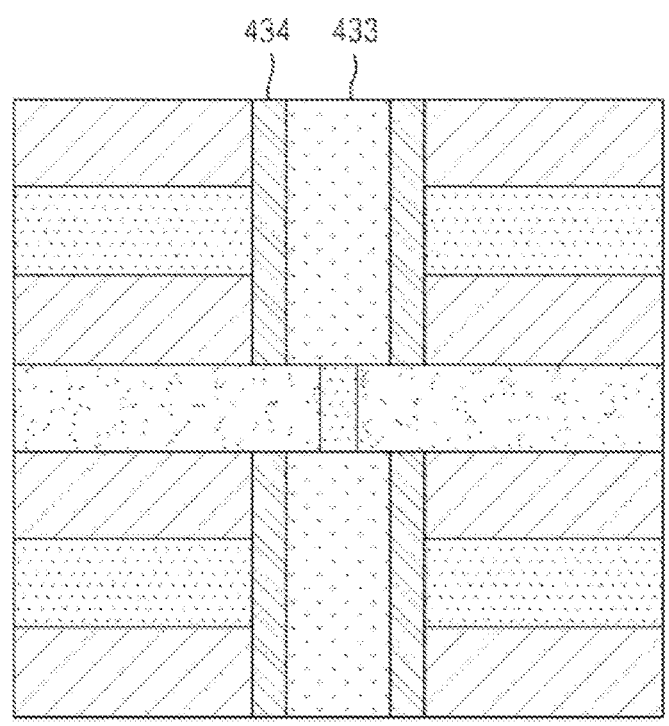

FIG. 4I
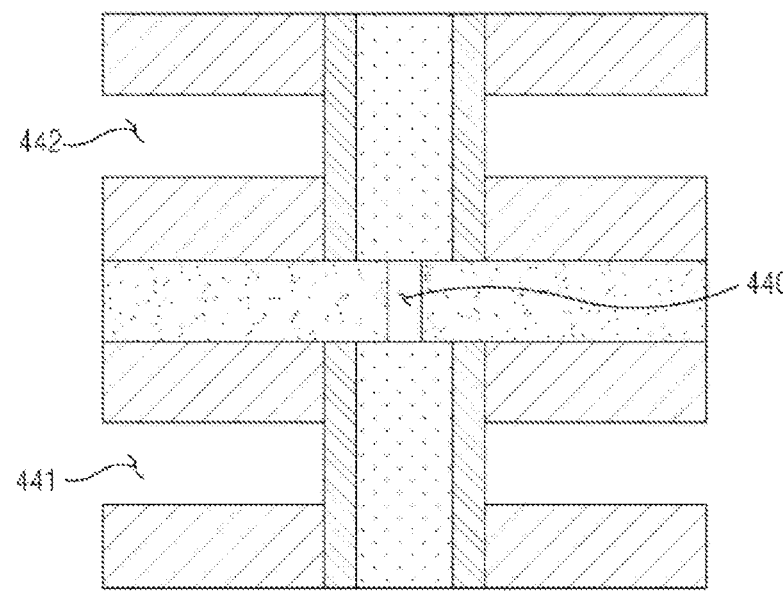
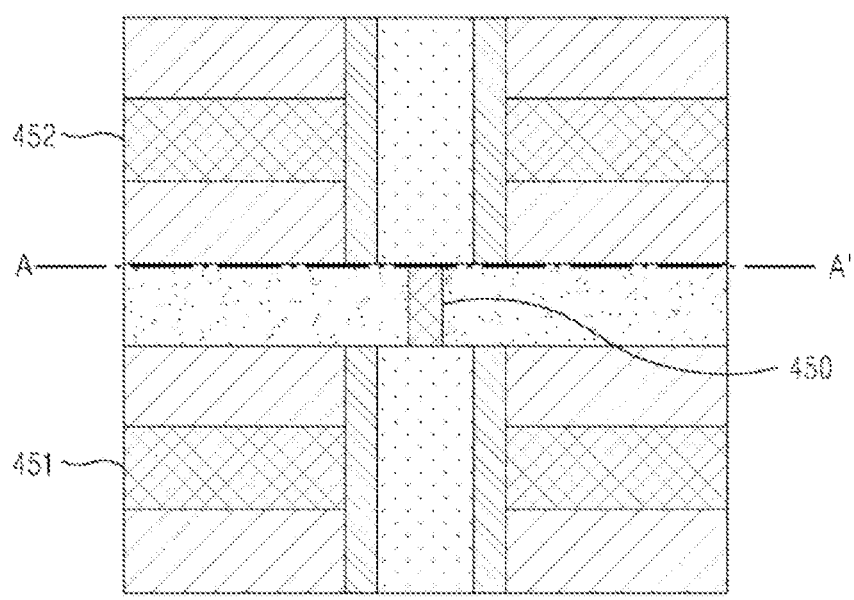

FIG. 6C
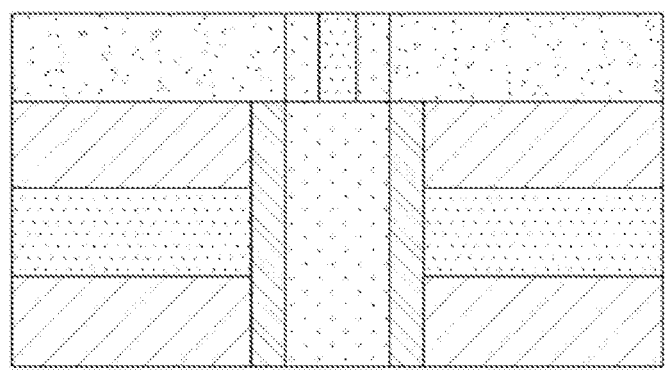
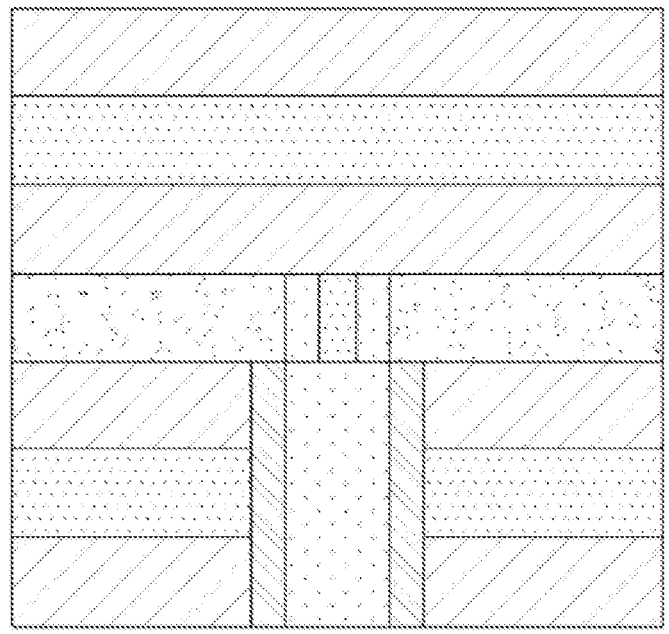

FIG. 6D
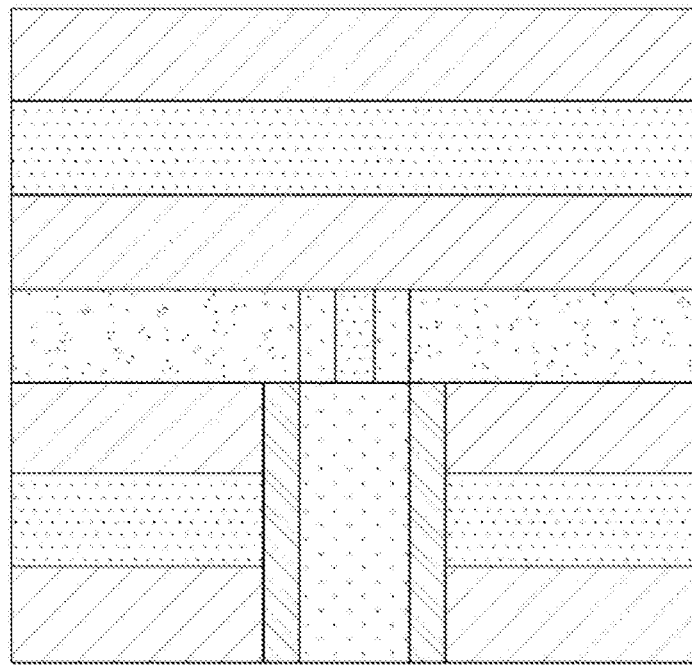
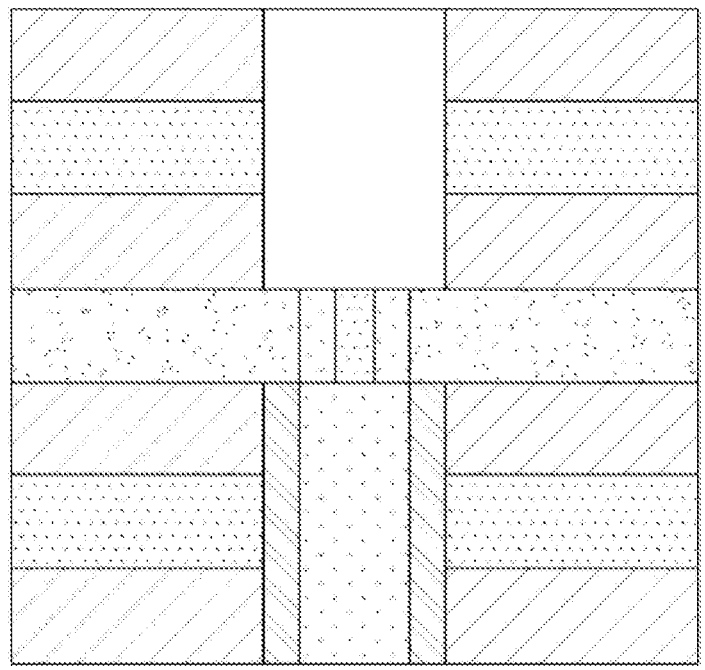

FIG. 6E
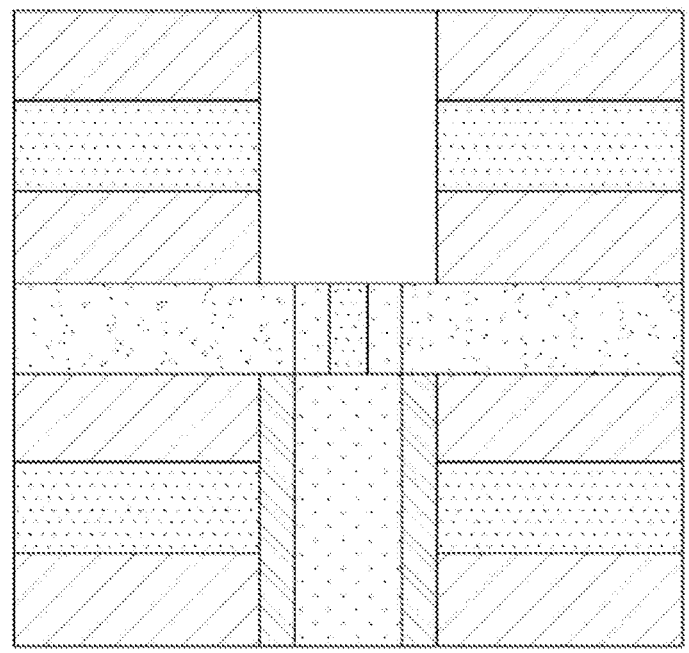
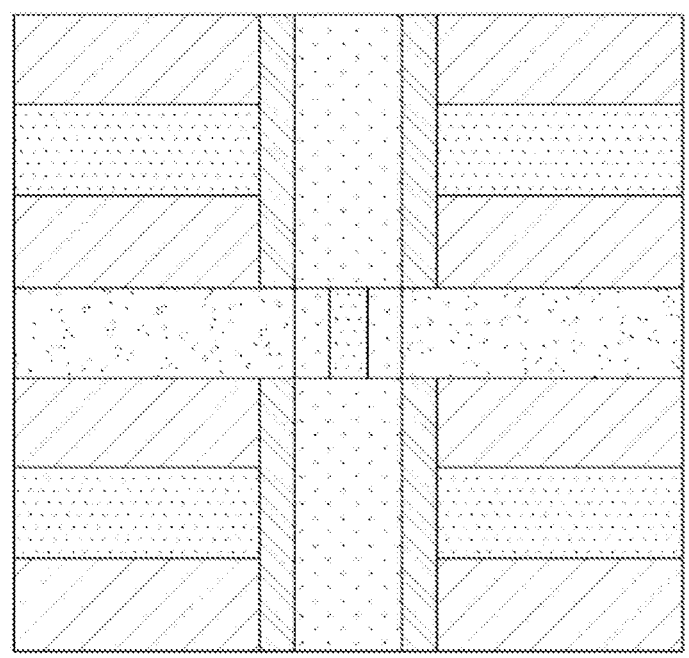

FIG. 6F
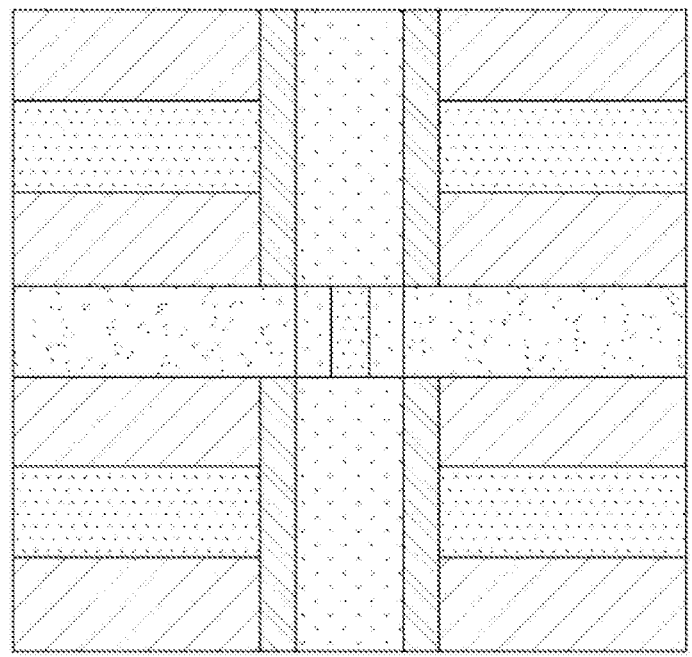
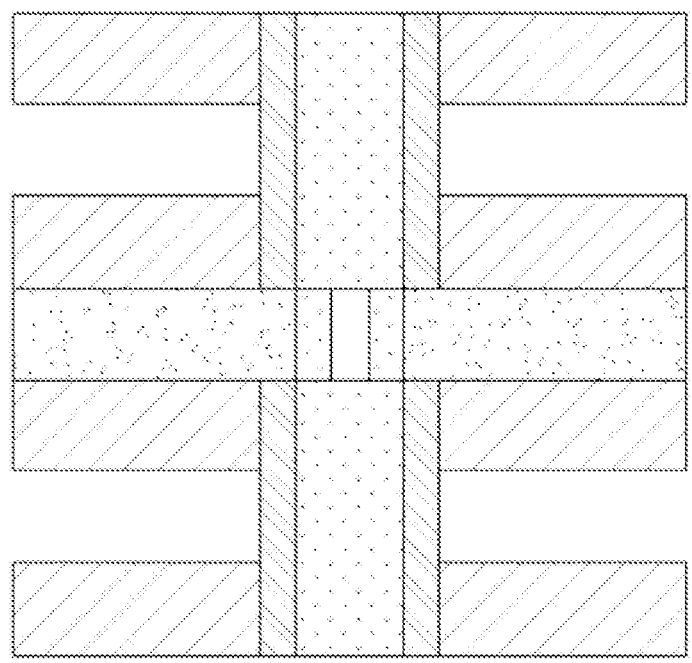

FIG. 6G
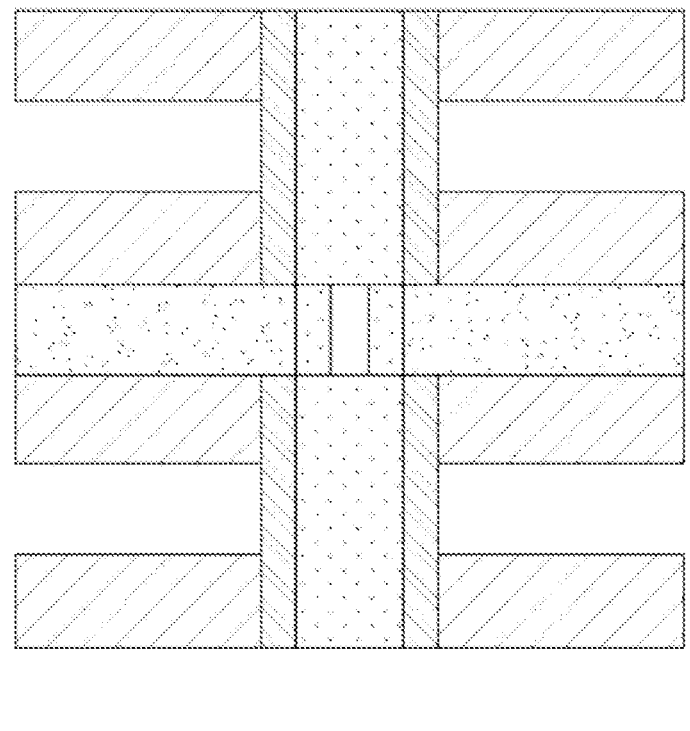
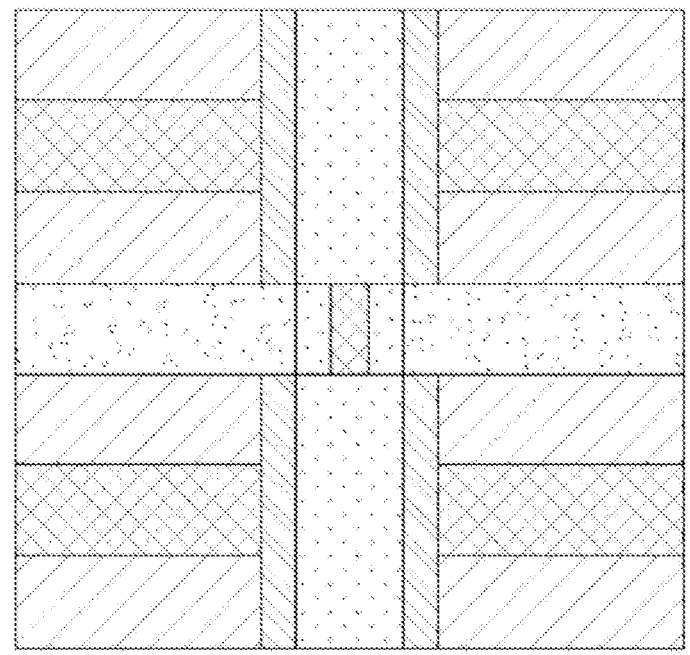

FIG. 8C
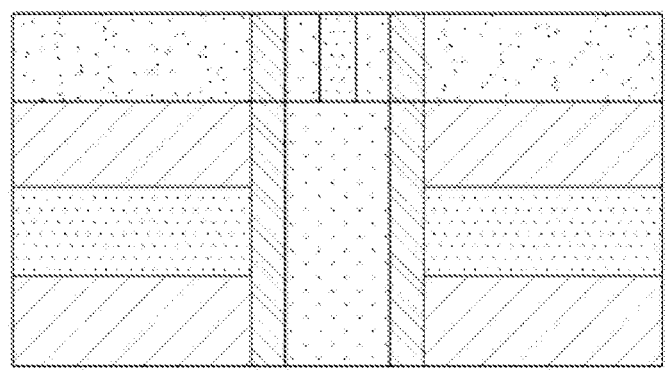
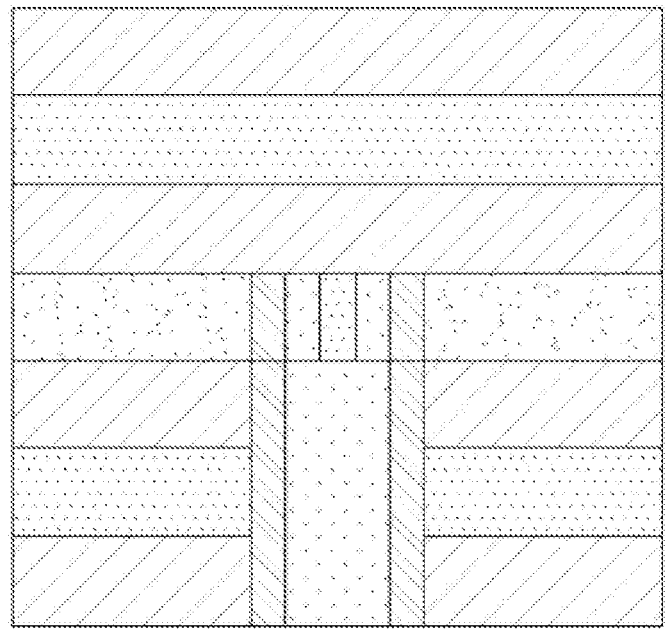

FIG. 8D
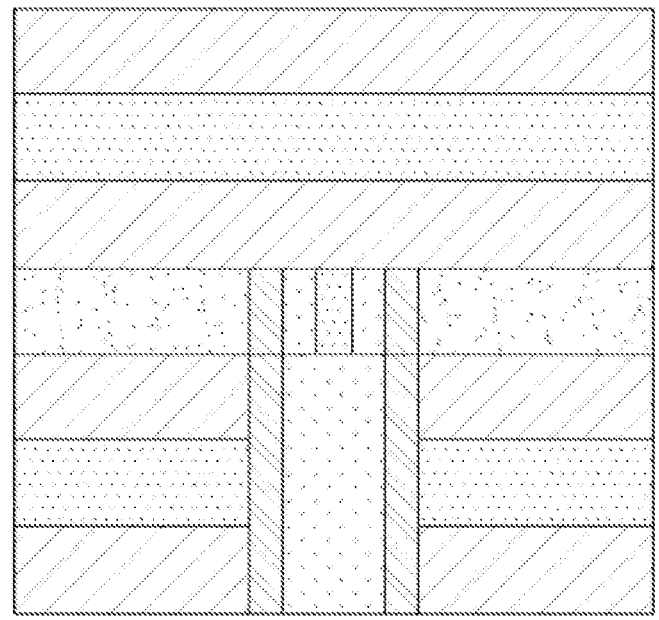
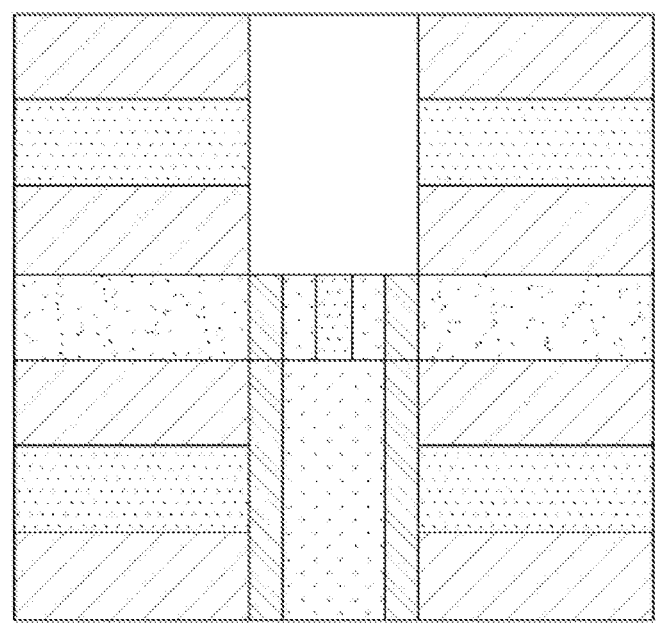

FIG. 8E
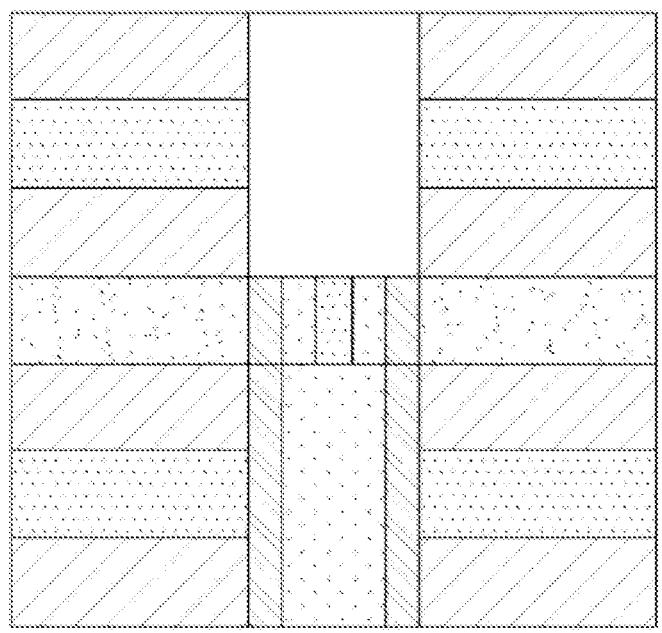
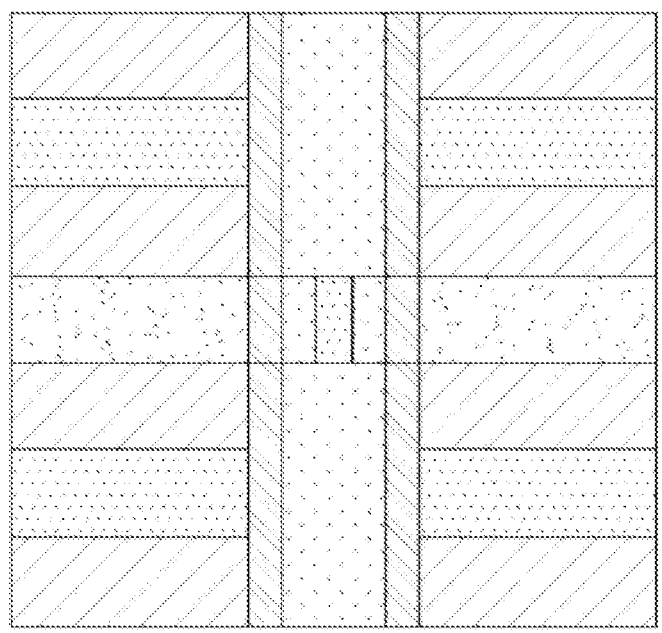

FIG. 8F
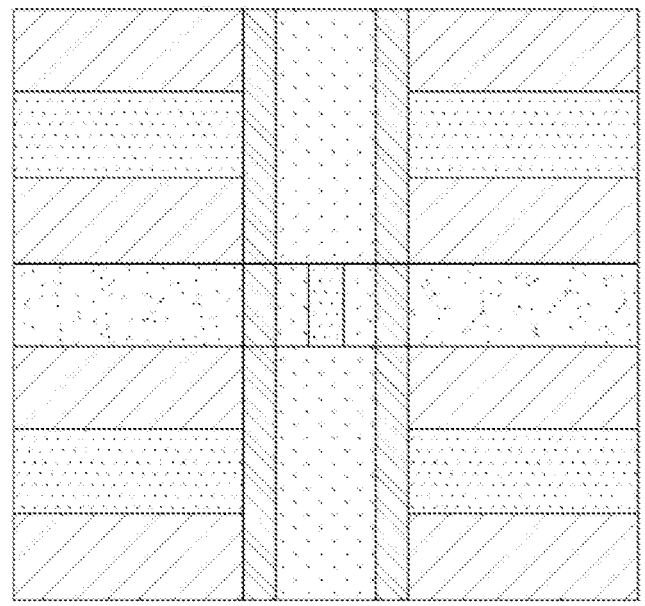
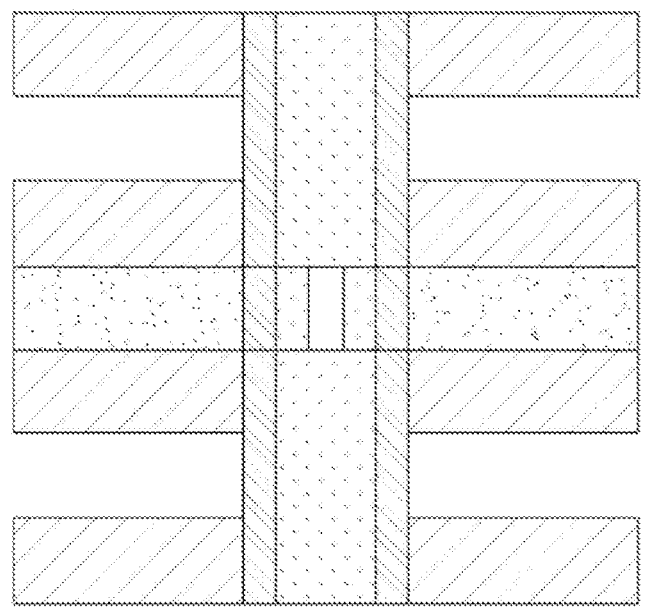

FIG. 8G
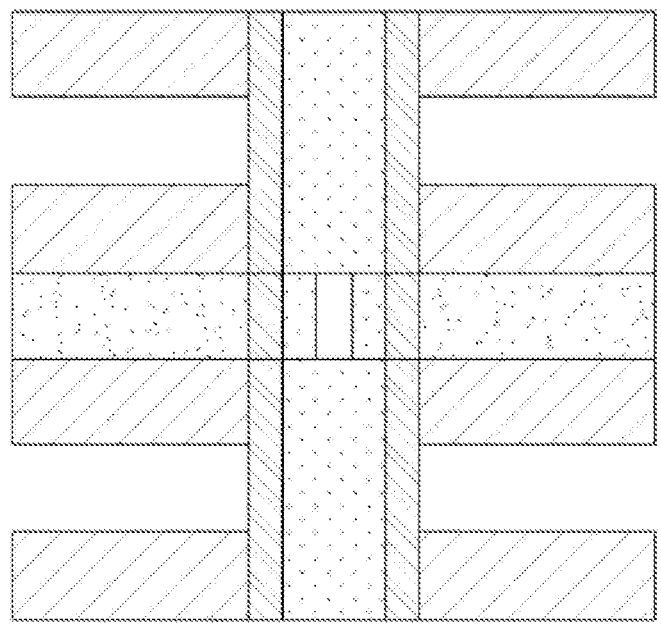
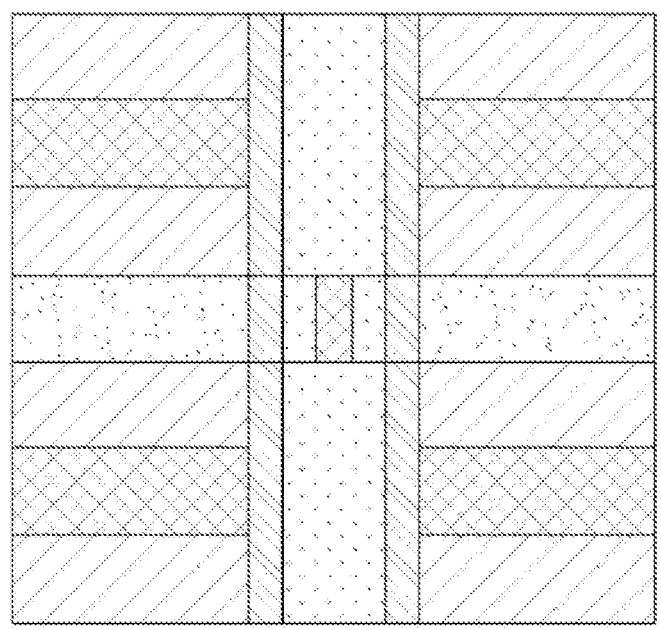

FIG. 11A
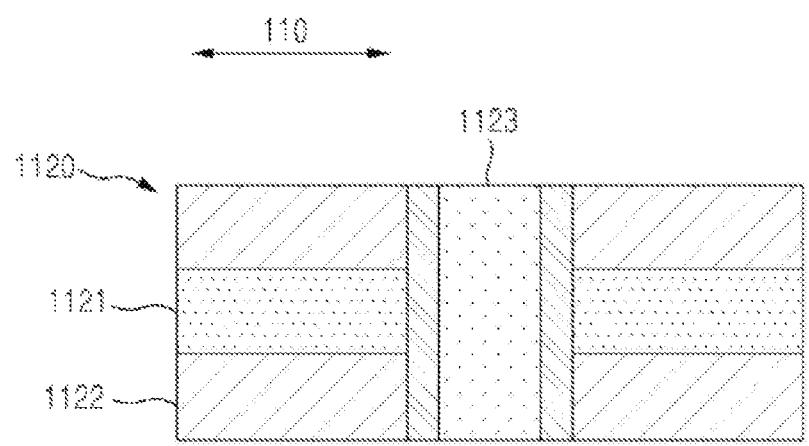
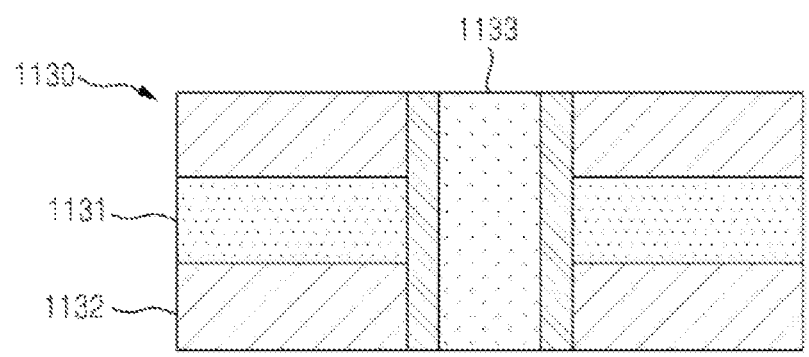

FIG. 11B
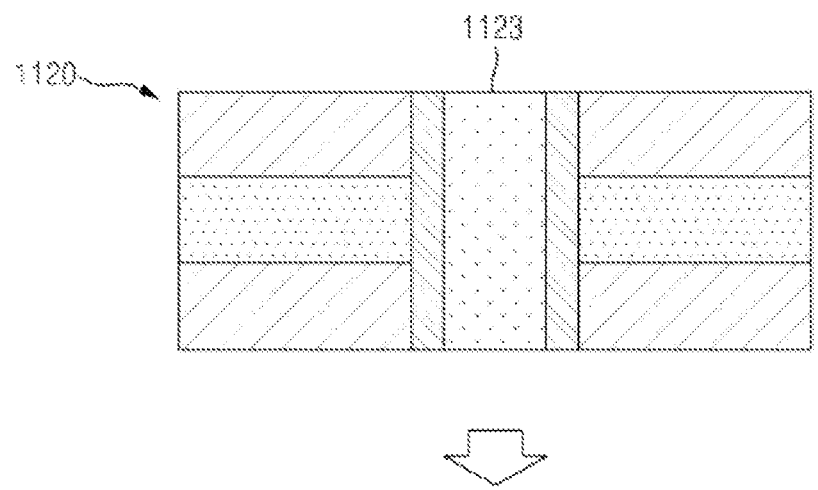
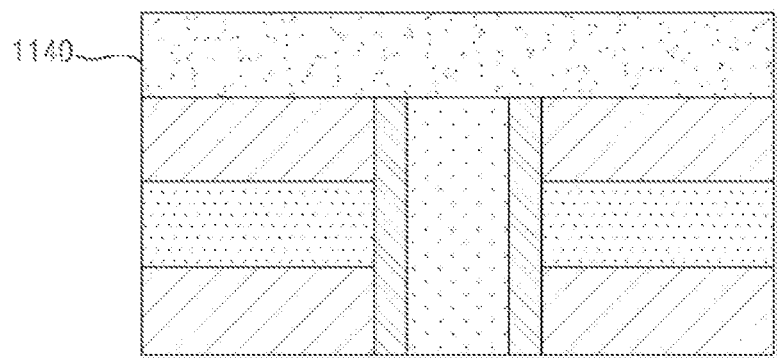

THREE-DIMENSIONAL FLASH MEMORY INCLUDING MIDDLE METALLIZATION LAYER AND MANUFACTURING METHOD THEREOF

CROSS REFERENCE TO RELATED APPLICATIONS

This application is a 35 U.S.C. 371 national stage application of PCT International Application No. PCT/KR2019/008931, filed on Jul. 19, 2019, which claims priority to Korean Patent Application No. 10-2018-0105693, filed Sep. 5, 2018, Korean Patent Application No. 10-2018-0118610, filed Oct. 5, 2018, and Korean Patent Application No. 10-2018-0154126, filed Dec. 4, 2018, the entire disclosures of which are incorporated herein by reference.

TECHNICAL FIELD

The following embodiments relate to a method of manufacturing a three-dimensional flash memory, and more particularly, to a three-dimensional flash memory including an intermediate wiring layer.

BACKGROUND ART

A flash memory device may be electrically erasable programmable read only memory (EEPROM) which is electrically erasable and programmable, and the memory may be commonly used for, for example, a computer, a digital camera, an MP3 player, a game system, a memory stick, etc. The flash memory device electrically controls input/output of data through Fowler-Nordheim (F-N) tunneling or hot electron injection.

In detail, referring to FIG. 1 illustrating an array of a three-dimensional flash memory of the related art, the array of the three-dimensional flash memory may include a common source line CSL, a bit line BL, and a plurality of cell strings CSTR arranged between the common source line CSL and the bit line BL.

Bit lines are two-dimensionally arranged, and the plurality of cell strings CSTR are respectively connected to the bit lines in parallel. The cell strings CSTR may be connected to the common source line CSL in common. That is, the plurality of cell strings CSTR may be arranged between a plurality of bit lines and one common source line CSL. In this case, a plurality of common source lines CSL may be provided, and the plurality of common source lines CSL may be two-dimensionally arranged. Here, electrically the same voltage may be applied to the plurality of common source lines CSL, or each of the plurality of common source lines CSL may be electrically controlled.

Each of the cell strings CSTR may be configured with a ground selection transistor GST connected to the common source line CSL, a string selection transistor SST connected to the bit line BL, and a plurality of memory cell transistors MCT arranged between the ground selection transistor GST and the string selection transistor SST. In addition, the ground selection transistor GST, the string selection transistor SST, and the memory cell transistors MCT may be serially connected to one another.

The common source line CSL may be connected to sources of ground selection transistors GST. Furthermore, a ground selection line GSL, a plurality of word lines WL0 to WL3, and a plurality of string selection lines SSL arranged between the common source line CSL and the bit line BL may be respectively used as electrode layers of the ground selection transistor GST, the memory cell transistors MCT, and the string selection transistors SST. Furthermore, each of the memory cell transistors MCT includes a memory element.

In the three-dimensional flash memory of the related art, in order to satisfy good performance and the low price needed for consumers, cells are vertically stacked, and thus, the degree of integration is increased.

For example, referring to FIG. 2 illustrating a structure of the three-dimensional flash memory of the related art, the three-dimensional flash memory of the related art is manufactured by placing an electrode structure 215, in which interlayer insulation layers 211 and horizontal structures 250 are alternately and repeatedly formed, on a substrate 200. The interlayer insulation layers 211 and the horizontal structures 250 may extend in a first direction. The interlayer insulation layers 211 may be, for example, silicon oxide, and a lowermost interlayer insulation layer 211a of the interlayer insulation layers 211 may have a thickness smaller than those of the other interlayer insulation layers 211. Each of the horizontal structures 250 may include first and second blocking insulation layers 242 and 243 and an electrode layer 245. The electrode structure 215 may be provided in plurality, and the plurality of electrode structures 215 may be arranged to face one another in a second direction intersecting the first direction. The first direction and the second direction may respectively correspond to an x axis and a y axis of FIG. 2. Trenches 240 may extend in the first direction between the plurality of electrode structures 215 such that the plurality of electrode structures 215 are spaced apart from each other. Impurity regions doped at a high concentration may be formed in the substrate 200 exposed by the trenches 240, and thus, the common source line CSL may be arranged therein. Although not shown, isolation layers may further be arranged to fill the trenches 240.

Vertical structures 230 passing through the electrode structures 215 may be arranged. For example, in a plan view, the vertical structures 230 may be arranged in the first and second directions and may be arranged in a matrix form. As another example, the vertical structures 230 may be arranged in the second direction and may be arranged in a zigzag form in the first direction. Each of the vertical structures 230 may include a passivation layer 224, a charge storage layer 225, a tunnel insulation layer 226, and a channel layer 227. For example, the channel layer 227 may be arranged in a hollow tube form, and in this case, a buried layer 228 filling the inside of the channel layer 227 may be further arranged. A drain region D may be arranged on the channel layer 227, and a conductive pattern 229 may be formed on the drain region D and may be connected to the bit line BL. The bit line BL may extend a direction (for example, the second direction) intersecting with the horizontal electrodes 250. For example, the vertical structures 230 arranged in the second direction may be connected to one bit line BL.

The first and second blocking insulation layers 242 and 243 included in the horizontal structures 250 and the charge storage layer 225 and the tunnel insulation layer 226 included in the vertical structures 230 may be defined as an oxide-nitride-oxide (ONO) layer which is an information storage element of a three-dimensional flash memory. That is, a portion of the information storage element may be included in the vertical structures 230, and the remaining portion thereof may be included in the horizontal structures 250. For example, the charge storage layer 225 and the tunnel insulation layer 226 among the information storage element may be included in the vertical structures 230, and the first and second blocking insulation layers 242 and 243 may be included in the horizontal structures 250.

Epitaxial patterns 222 may be arranged between the substrate 200 and the vertical structures 230. The epitaxial patterns 222 may connect the substrate 200 to the vertical structures 230. The epitaxial patterns 222 may contact at least one horizontal structures 250. That is, the epitaxial patterns 222 may be arranged to contact a lowermost horizontal structure 250a. According to another embodiment, the epitaxial patterns 222 may be arranged to contact a plurality of horizontal structures 250 (for example, two horizontal structures 250). In addition, in a case where the epitaxial patterns 222 are arranged to contact the lowermost horizontal structure 250a, the lowermost horizontal structure 250a may be arranged to be thicker than the other horizontal structures 250. The lowermost horizontal structures 250a contacting the epitaxial patterns 222 may correspond to the ground selection line GSL of the three-dimensional flash memory described with reference to FIG. 1, and the other horizontal structures 250 contacting the vertical structures 230 may correspond to the plurality of word lines WL0 to WL3.

Each of the epitaxial patterns 222 may have a recessed sidewall 222a. Therefore, the lowermost horizontal structures 250a contacting the epitaxial patterns 222 are arranged along a profile of the recessed sidewall 222a. That is, the lowermost horizontal structure 250a may be arranged in a shape which is convex inward along the recessed sidewall 222a of the epitaxial patterns 222.

In the three-dimensional flash memory of the related art having such a structure, as the number of vertically stacked layers increases, a length of the channel layer 227 increases, causing a reduction in a cell current and a degradation in cell characteristics.

Therefore, in a three-dimensional flash memory, a structure where at least one intermediate wiring layer is arranged in a middle region of a string has been proposed to increase a cell current, which is reduced as a length of a channel layer increases, and to decrease a degradation in cell characteristics caused by a reduction in a cell current.

In a three-dimensional flash memory having the proposed structure, a manufacturing process is performed in the order in which a lower string arranged under at least one intermediate wiring layer is formed, the at least one intermediate wiring layer is formed subsequently, and an upper string is formed thereon.

However, conventional manufacturing technology including at least one intermediate wiring layer formed of tungsten (W) has a problem, in which a material of the at least one intermediate wiring layer is inevitably degraded in a process of forming a channel layer with poly-silicon (poly-Si) at a high temperature of 600° C. or more in a process of forming an upper string, and a drawback in that a W layer forming process is a process having a relatively high cost.

Therefore, it is necessary to propose a manufacturing method for overcoming the problem and the drawback.

DESCRIPTION OF EMBODIMENTS

Technical Problem

Embodiments propose a method of manufacturing a three-dimensional flash memory, in which at least one intermediate wiring layer is formed by using a back end process, thereby overcoming a problem, where a material is degraded, and a drawback, where the process cost is high, of conventional manufacturing technology which forms at least one intermediate wiring layer before an upper string is formed.

Also, embodiments propose technology for overcoming a limitation of miniaturization and integration in a horizontal direction in a three-dimensional flash memory.

In more detail, embodiments propose a three-dimensional flash memory, including at least one bit line respectively connected to adjacent strings of a plurality of strings and shared by adjacent strings, and a method of manufacturing the three-dimensional flash memory.

Embodiments propose a three-dimensional flash memory which includes an intermediate wiring layer having a plate shape formed to surround a connection portion connecting an upper string to a lower string in each of a plurality of strings, and thus, increases a cell current which is reduced as a length of a channel layer increases, decreases a degradation in cell characteristic caused by a reduction in a cell current, supports a bulk erase operation based on a bulk of a substrate, enhances the degree of integration, and simplifies a wiring process.

Other embodiments propose a three-dimensional flash memory which includes at least one intermediate wiring layer having a line shape formed with being buried into each of a plurality of strings, and thus, increases a cell current which is reduced as a length of a channel layer increases, decreases a degradation in cell characteristic caused by a reduction in a cell current, supports a bulk erase operation based on a bulk of a substrate, enhances the degree of integration, and simplifies a wiring process.

Other embodiments propose a three-dimensional flash memory which includes at least one intermediate wiring layer having a line shape formed to be connected to each of a plurality of strings and a lower buffer layer, and thus, increases a cell current which is reduced as a length of a channel layer increases, decreases a degradation in cell characteristic caused by a reduction in a cell current, supports a bulk erase operation based on a bulk of a substrate, enhances the degree of integration, and simplifies a wiring process.

Solution to Problem

According to an embodiment, a method of manufacturing a three-dimensional flash memory by using a back end process includes: forming a lower string in a first block, the first block including a sacrificial layer and an insulation layer which are formed to extend in a first direction and are alternately stacked; generating an inter-string insulation layer on the first block having the lower string formed therein; etching at least a portion of the inter-string insulation layer to form at least one sacrificial film in a space where the at least a portion is etched; generating a second block on the inter-string insulation layer, where the at least one sacrificial film is formed, the second block including a sacrificial layer and an insulation layer which are formed to extend in the first direction and are alternately stacked; forming an upper string in the second block; etching the sacrificial layer included in the first block, the at least one sacrificial film, and the sacrificial layer included in the second block; and forming an electrode layer, which is to be used as at least one intermediate wiring layer, in a space where the at least one sacrificial film is etched, and an electrode layer, which is to be used as a word line, in a space where the sacrificial layer included in the first block is etched and a space where the sacrificial layer included in the second block is etched.

According to an aspect, the forming of the at least one sacrificial film may further include: etching other at least a portion, except a portion where the at least one sacrificial film is formed, of the inter-string insulation layer; and forming at least one channel connection portion in a space where the other at least a portion is etched, the at least one channel connection portion connecting a channel layer of the upper string to a channel layer of the lower string.

According to another aspect, the etching of the other at least a portion may include etching the other at least a portion so that the at least one channel connection portion, which is to be formed in a space where the other at least a portion is etched, contacts at least a portion of the channel layer of the upper string and at least a portion of the channel layer of the lower string.

According to another aspect, the forming of the at least one sacrificial film may further include etching other at least a portion, except a portion where the at least one sacrificial film is formed, of the inter-string insulation layer, and the forming of the upper string in the second block may further include forming a connection string in a space where the other at least a portion is etched.

According to an embodiment, a method of manufacturing a three-dimensional flash memory by using a back end process includes: preparing two blocks each including a string formed in a sacrificial layer and an insulation layer, which are formed to extend in a first direction and are alternately stacked, and the string formed in a direction vertical to the first direction; generating an inter-string insulation layer on a first block of the two blocks; etching at least a portion of the inter-string insulation layer to form at least one sacrificial film in a space where the at least a portion is etched; stacking a second block, except the first block, of the two blocks on the inter-string insulation layer, where the at least one sacrificial film is formed; etching a sacrificial layer included in the first block, the at least one sacrificial film, and a sacrificial layer included in the second block; and forming an electrode layer, which is to be used as at least one intermediate wiring layer, in a space where the at least one sacrificial film is etched, and an electrode layer, which is to be used as a word line, in a space where the sacrificial layer included in the first block is etched and a space where the sacrificial layer included in the second block is etched.

According to an aspect, the forming of the at least one sacrificial film may further include: etching other at least a portion, except a portion where the at least one sacrificial film is formed, of the inter-string insulation layer; and forming at least one channel connection portion in a space where the other at least a portion is etched, the at least one channel connection portion connecting a channel layer of a string included in the first block to a channel layer of a string included in the second block.

According to another aspect, the etching of the other at least a portion may include etching the other at least a portion so that the at least one channel connection portion, which is to be formed in a space where the other at least a portion is etched, contacts at least a portion of the channel layer of the string included in the first block and at least a portion of the channel layer of the string included in the second block.

According to another aspect, the forming of the at least one sacrificial film may further include: etching other at least a portion, except a portion where the at least one sacrificial film is formed, of the inter-string insulation layer; and forming a connection string in a space where the other at least a portion is etched.

According to an embodiment, a three-dimensional flash memory includes: a plurality of strings each including a channel layer formed to extend in one direction; and at least one bit line connected to each of adjacent strings of the plurality of strings and shared by the adjacent strings, with being disposed between the plurality of strings and on the plurality of strings in a direction perpendicular to the one direction.

According to an aspect, the at least one bit line may be connected to each of strings adjacent to each other in a diagonal direction, a horizontal direction, or a vertical direction among the plurality of strings.

According to another aspect, the three-dimensional flash memory may further include at least one intermediate wiring layer formed at a middle point of each of the plurality of strings in the one direction, the at least one intermediate wiring layer being selectively usable as one of a source electrode or a drain electrode.

According to another aspect, the at least one bit line may be connected to each of adjacent strings of the plurality of strings on the basis of a state where the at least one intermediate wiring layer is connected to the plurality of strings, for enabling selective driving of each of the plurality of strings.

According to another aspect, the at least one bit line may be connected to each of strings adjacent to each other in a diagonal direction or each of strings adjacent to each other in a horizontal direction or a vertical direction among the plurality of strings, based on a state where the at least one intermediate wiring layer is connected to the plurality of strings.

According to an embodiment, a three-dimensional flash memory includes: a plurality of strings each including a channel layer formed to extend in one direction; at least one intermediate wiring layer formed at a middle point of each of the plurality of strings in the one direction, the at least one intermediate wiring layer being selectively usable as one of a source electrode or a drain electrode; and at least one bit line connected to each of adjacent strings of the plurality of strings and shared by the adjacent strings on the basis of a state where the at least one intermediate wiring layer is connected to the plurality of strings so as to enable selective driving of each of the plurality of strings, with being disposed between the plurality of strings and on the plurality of strings in a direction perpendicular to the one direction.

According to another aspect, the at least one bit line may be connected to each of strings adjacent to each other in a diagonal direction or each of strings adjacent to each other in a horizontal direction or a vertical direction among the plurality of strings on the basis of a state where the at least one intermediate wiring layer is connected to the plurality of strings, for enabling selective driving of each of the plurality of strings.

According to an embodiment, a method of manufacturing a three-dimensional flash memory includes: forming a plurality of strings each including a channel layer formed to extend in one direction; and generating at least one bit line connected to each of adjacent strings of the plurality of strings and shared by the adjacent strings, with being disposed between the plurality of strings and on the plurality of strings in a direction perpendicular to the one direction.

According to an aspect, the forming may include forming at least one intermediate wiring layer formed at a middle point of each of the plurality of strings in the one direction, the at least one intermediate wiring layer being selectively usable as one of a source electrode or a drain electrode, and the generating may include forming the at least bit line to be connected to each of strings adjacent to each other in a diagonal direction or each of strings adjacent to each other in a horizontal direction or a vertical direction among the plurality of strings on the basis of a state where the at least one intermediate wiring layer is connected to the plurality of strings, for enabling selective driving of each of the plurality of strings.

According to an embodiment, a three-dimensional flash memory includes: a plurality of strings each including a channel layer formed to extend in one direction on a substrate; a connection portion connecting an upper string of each of the plurality of strings to a lower string of each of the plurality of strings in a middle region of each of the plurality of strings in a direction in which each of the plurality of strings is formed to extend; and an intermediate wiring layer selectively usable as one of a source electrode or a drain electrode corresponding to each of the plurality of strings, with being formed to surround a connection portion of each of the plurality of strings.

According to an aspect, the intermediate wiring layer may be formed in a plate shape and is shared by each of the plurality of strings.

According to another aspect, a plurality of upper selection lines (USL) and a plurality of lower selection lines (LSL) connected to the plurality of strings may be formed to extend in a direction perpendicular to each other in terms of a plane.

According to another aspect, the three-dimensional flash memory may be configured to apply a read voltage, having a value to which a compensation voltage value is added, to the lower string of each of the plurality of strings, for compensating for a cell threshold voltage difference between the upper string and the lower string of each of the plurality of strings.

According to an embodiment, a three-dimensional flash memory includes: a plurality of strings each including a channel layer formed to extend in one direction on a substrate; a connection portion connecting an upper string of each of the plurality of strings to a lower string of each of the plurality of strings in a middle region of each of the plurality of strings in a direction in which each of the plurality of strings is formed to extend; and at least one intermediate wiring layer where at least a portion thereof is formed to contact a connection portion of each of the plurality of strings with being buried into each of the plurality of strings, the at least one intermediate wiring layer being selectively usable as one of a source electrode or a drain electrode corresponding to each of the plurality of strings.

According to an aspect, each of the at least one intermediate wiring layer may be formed in a line shape and is shared by each of strings arranged in one row among the plurality of strings.

According to another aspect, the three-dimensional flash memory may be configured to apply a read voltage, having a value to which a compensation voltage value is added, to the lower string of each of the plurality of strings, for compensating for a cell threshold voltage difference between the upper string and the lower string of each of the plurality of strings.

According to another aspect, the at least one intermediate wiring layer may be connected to a connection portion of each of the plurality of strings through an insulation layer surrounding the at least one intermediate wiring layer.

According to an embodiment, a method of a three-dimensional flash memory includes: extending and forming a lower string in one direction on a substrate; generating an insulation layer in an upper region of the lower string; etching an edge, except a center, of the upper region of the lower string in the insulation layer; forming at least one intermediate wiring layer in the etched edge space; etching the center of the upper region of the lower string in the insulation layer; forming a connection portion in the etched center space; and extending and forming an upper string in the one direction on the connection portion.

According to an embodiment, a three-dimensional flash memory includes: a plurality of strings each including a channel layer formed to extend in one direction on a substrate; a connection portion connecting an upper string of each of the plurality of strings to a lower string of each of the plurality of strings in a middle region of each of the plurality of strings in a direction in which each of the plurality of strings is formed to extend; and at least one intermediate wiring layer formed to be connected to a connection portion of each of the plurality of strings by a lower buffer layer with being disposed in the middle region of each of the plurality of strings in a direction, in which each of the plurality of strings is formed to extend, between the plurality of strings, the at least one intermediate wiring layer being selectively usable as one of a source electrode or a drain electrode corresponding to each of the plurality of strings.

According to an aspect, each of the at least one intermediate wiring layer may be formed in a line shape and is shared by each of strings arranged in one row among the plurality of strings.

According to another aspect, the three-dimensional flash memory may be configured to apply a read voltage, having a value to which a compensation voltage value is added, to the lower string of each of the plurality of strings, for compensating for a cell threshold voltage difference between the upper string and the lower string of each of the plurality of strings.

Advantageous Effects of Disclosure

Embodiments may propose a method of manufacturing a three-dimensional flash memory, in which at least one intermediate wiring layer is formed by using a back end process, thereby overcoming a problem, where a material is degraded, and a drawback, where the process cost is high, of conventional manufacturing technology which forms at least one intermediate wiring layer before an upper string is formed.

Also, embodiments may propose technology for overcoming a limitation of miniaturization and integration in a horizontal direction in a three-dimensional flash memory.

In more detail, embodiments may propose a three-dimensional flash memory, including at least one bit line respectively connected to adjacent strings of a plurality of strings and shared by adjacent strings, and a method of manufacturing the three-dimensional flash memory.

Embodiments may propose a three-dimensional flash memory which includes an intermediate wiring layer having a plate shape formed to surround a connection portion connecting an upper string to a lower string in each of a plurality of strings, and thus, increases a cell current which is reduced as a length of a channel layer increases, decreases a degradation in cell characteristic caused by a reduction in a cell current, supports a bulk erase operation based on a bulk of a substrate, enhances the degree of integration, and simplifies a wiring process.

Other embodiments may propose a three-dimensional flash memory which includes at least one intermediate wiring layer having a line shape formed with being buried into each of a plurality of strings, and thus, increases a cell current which is reduced as a length of a channel layer increases, decreases a degradation in cell characteristic caused by a reduction in a cell current, supports a bulk erase operation based on a bulk of a substrate, enhances the degree of integration, and simplifies a wiring process.

Other embodiments may propose a three-dimensional flash memory which includes at least one intermediate wiring layer having a line shape formed to be connected to each of a plurality of strings and a lower buffer layer, and thus, increases a cell current which is reduced as a length of a channel layer increases, decreases a degradation in cell characteristic caused by a reduction in a cell current, supports a bulk erase operation based on a bulk of a substrate, enhances the degree of integration, and simplifies a wiring process.

BRIEF DESCRIPTION OF DRAWINGS

FIG. 3 is a flowchart illustrating a method of manufacturing a three-dimensional flash memory according to an embodiment;

FIGS. 4A to 4J are diagrams illustrating a first embodiment for describing the method of manufacturing a three-dimensional flash memory illustrated in FIG. 3;

FIGS. 6A to 6G are diagrams illustrating a second embodiment for describing the method of manufacturing the three-dimensional flash memory illustrated in FIG. 3;

FIGS. 8A to 8G are diagrams illustrating a third embodiment for describing the method of manufacturing a three-dimensional flash memory illustrated in FIG. 3;

FIGS. 11A to 11G are diagrams illustrating an embodiment for describing the method of manufacturing a three-dimensional flash memory illustrated in FIG. 10;

BEST MODE

Figure 1:
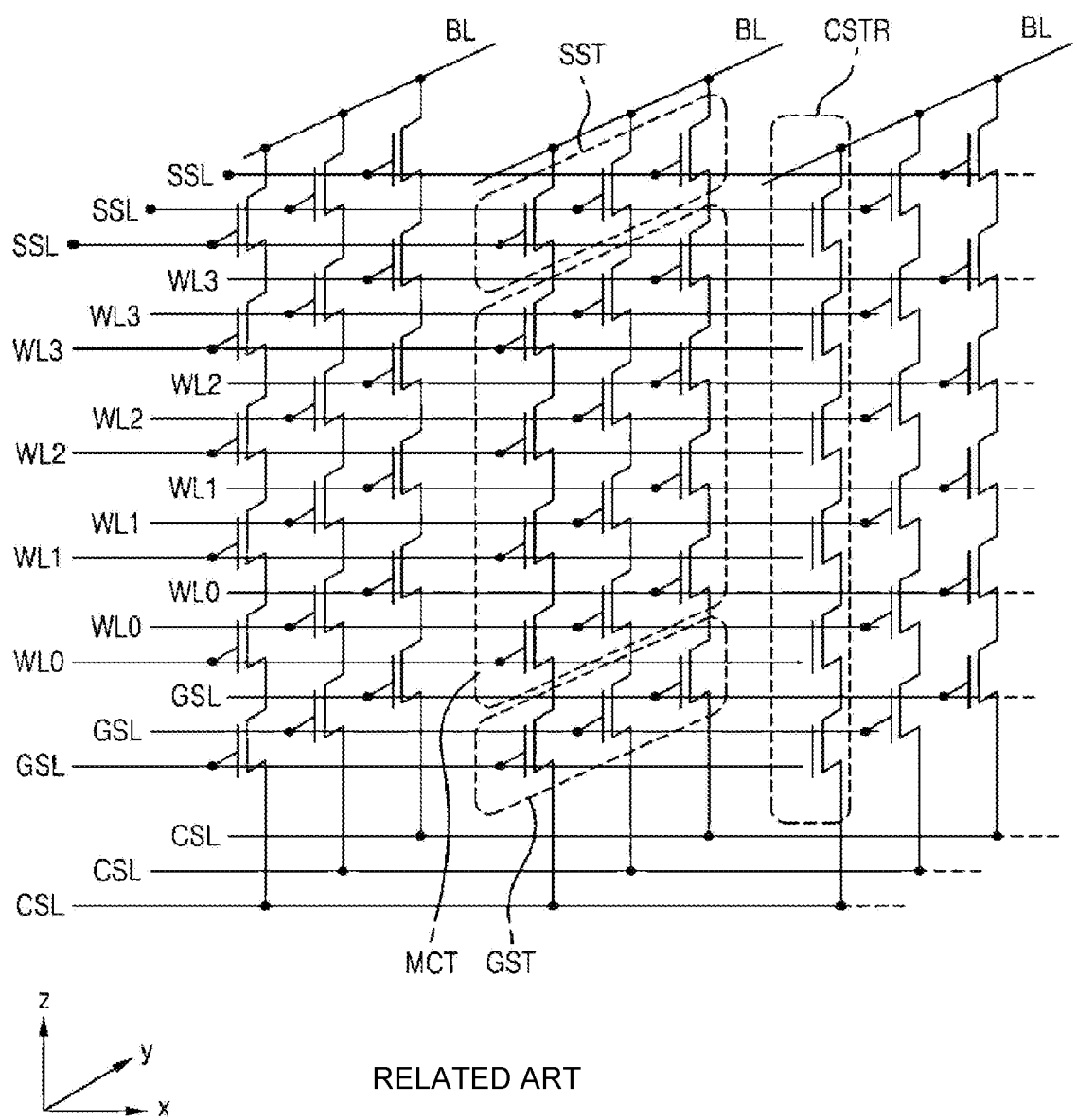
FIG. 1 is a schematic circuit diagram illustrating an array of a three-dimensional flash memory of the related art.

Hereinafter, embodiments will be described in detail with reference to the accompanying drawings. However, the present invention is not restricted or limited by embodiments. Also, like reference numeral illustrated in each drawing refers to like element.

Also, the terminologies used herein may be terminologies used for appropriately expressing a preferable embodiment of the present invention and may be changed based on the intent of a user or an operator or the convention of ordinary skill in the art. Therefore, definitions of the terminologies has to be determined based on content described in the specification.

FIG. 3 is a flowchart illustrating a method of manufacturing a three-dimensional flash memory according to an embodiment, and FIGS. 4A to 4J are diagrams illustrating a first embodiment for describing the method of manufacturing the three-dimensional flash memory illustrated in FIG. 3. Hereinafter, it is assumed that a method of manufacturing a three-dimensional flash memory described is performed by an automated and mechanized manufacturing system.

Figure 4A:
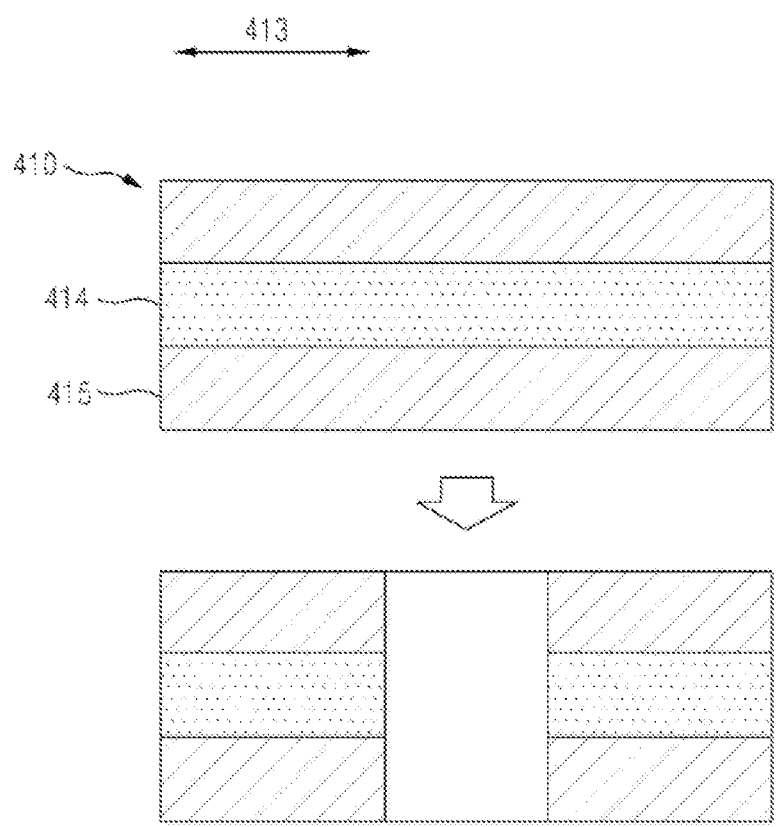
Figure 4B:
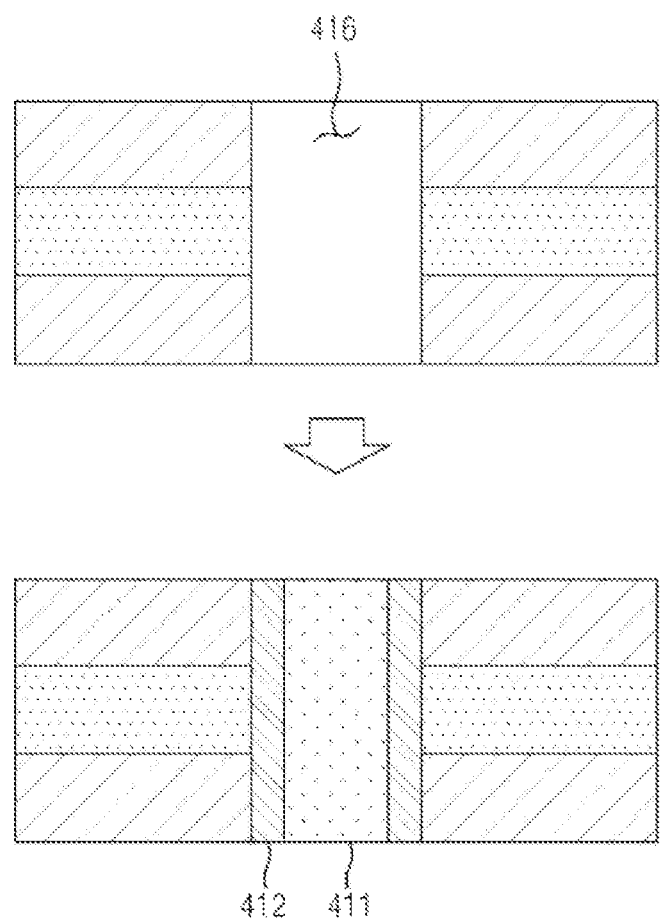
Figure 4C:
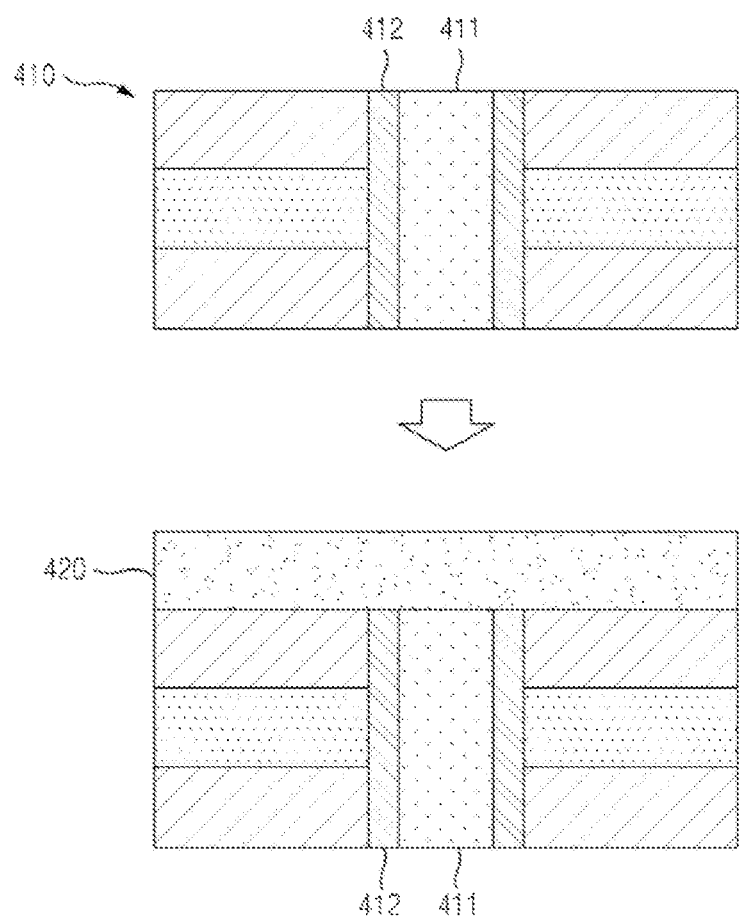
Figure 4D:
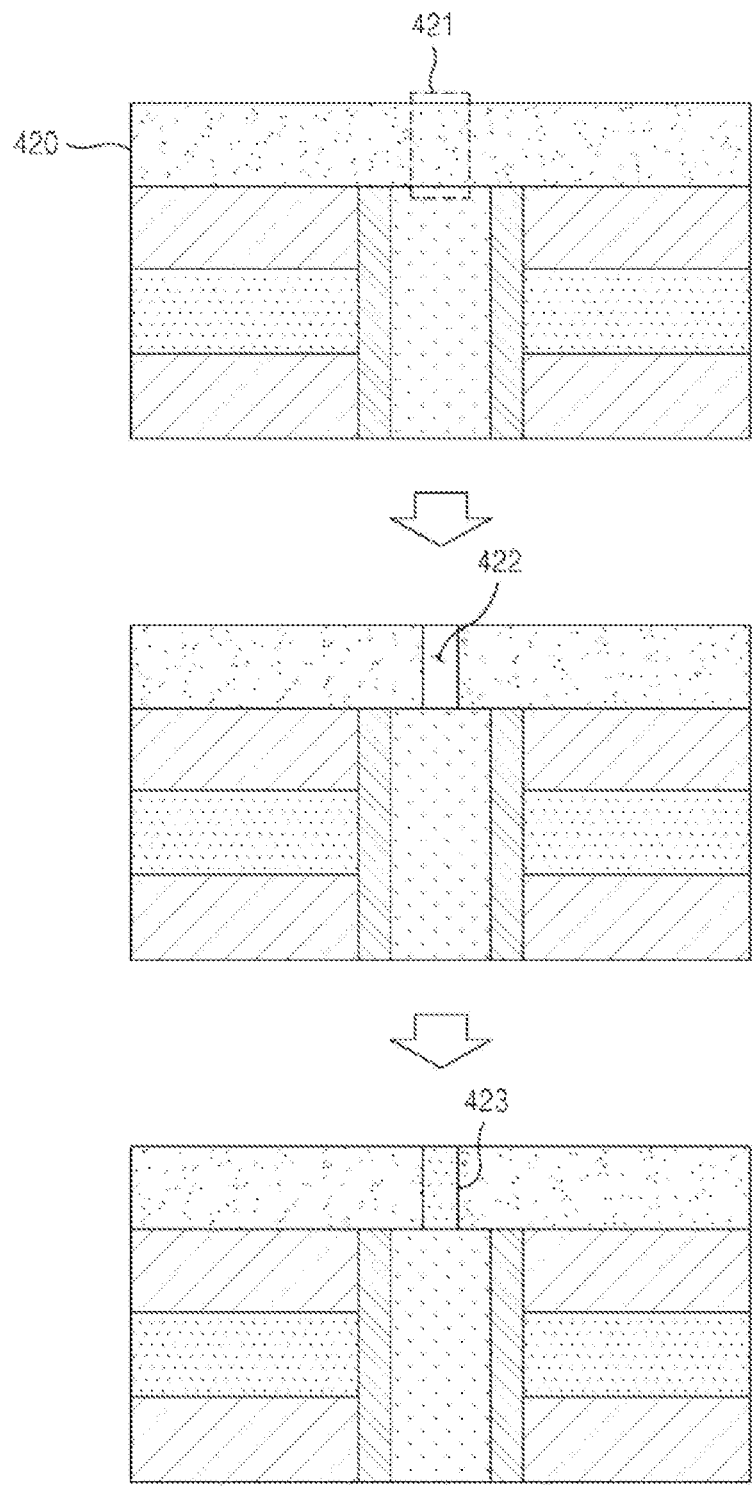
Figure 4E:
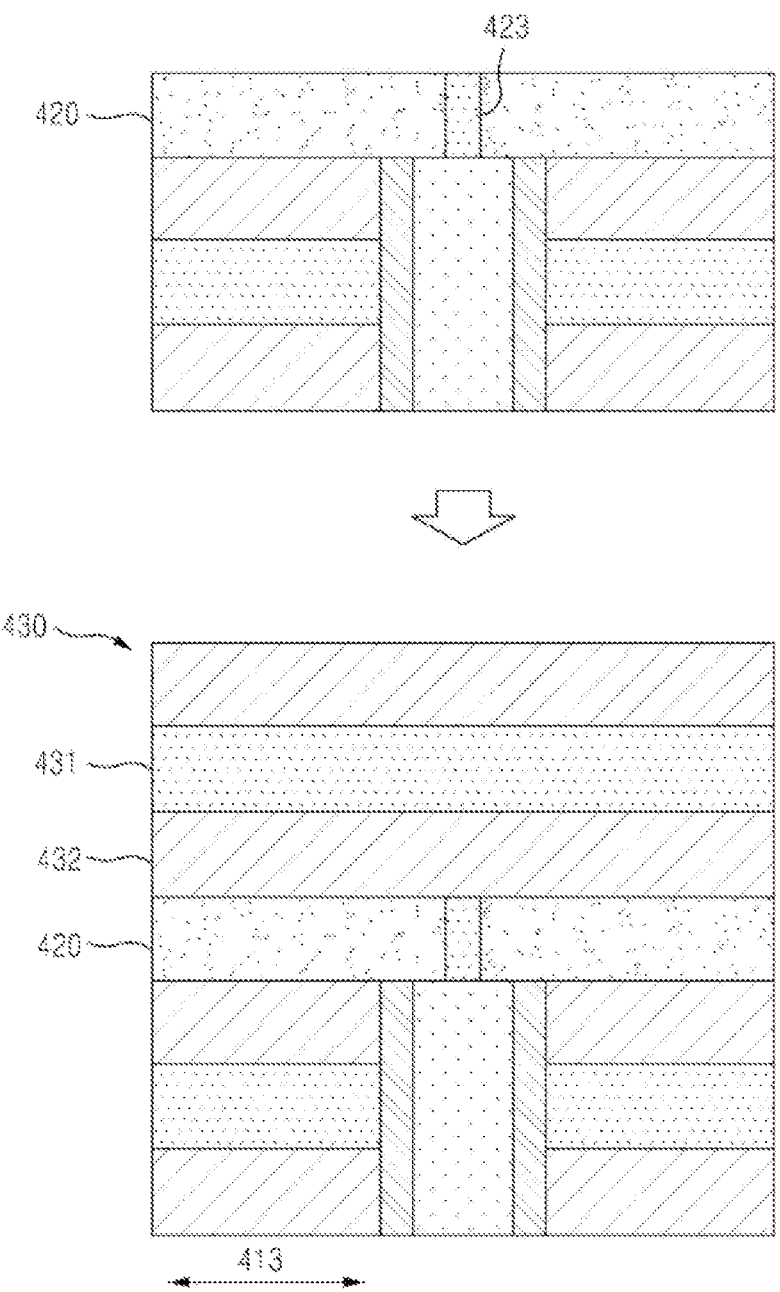
Figure 4H:
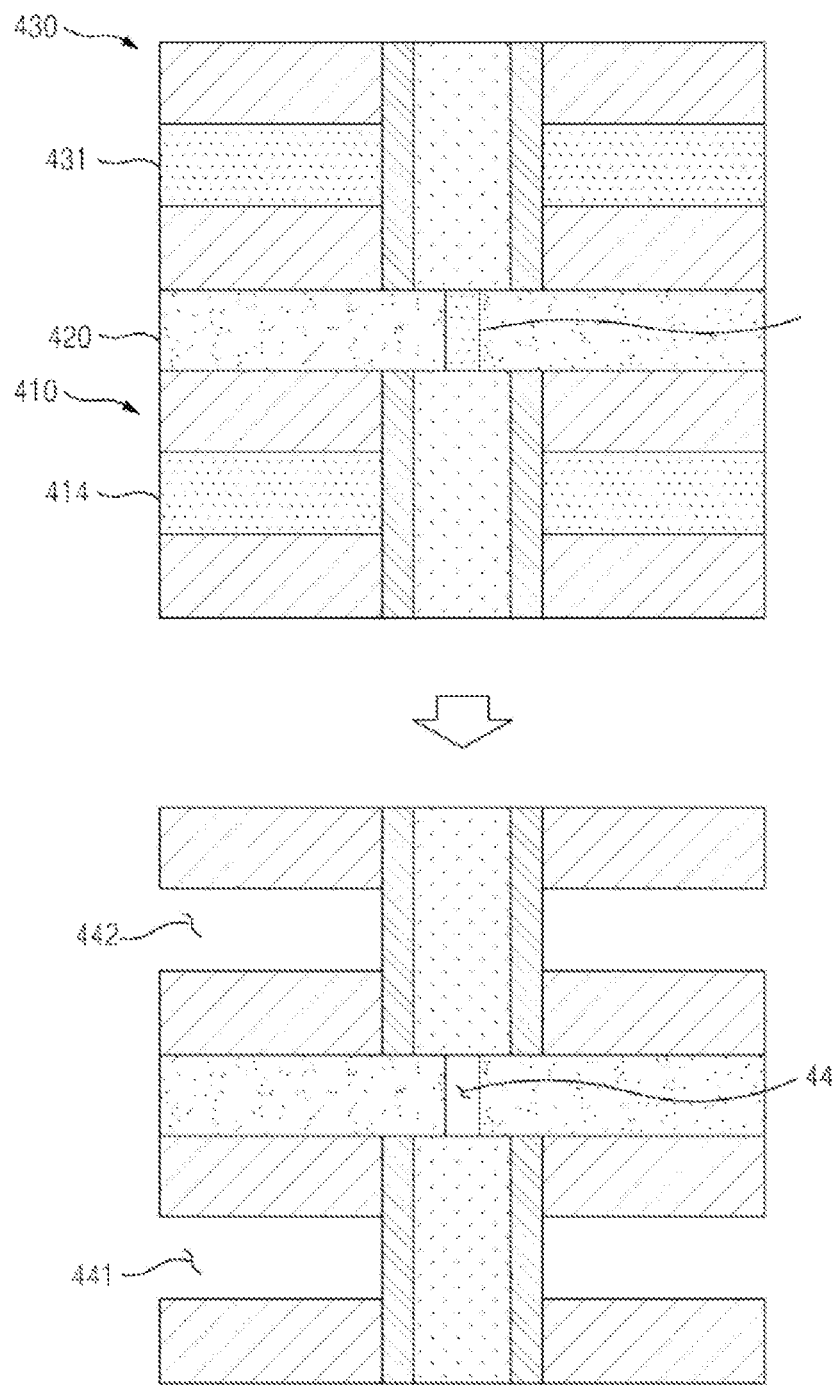
Figure 4J:
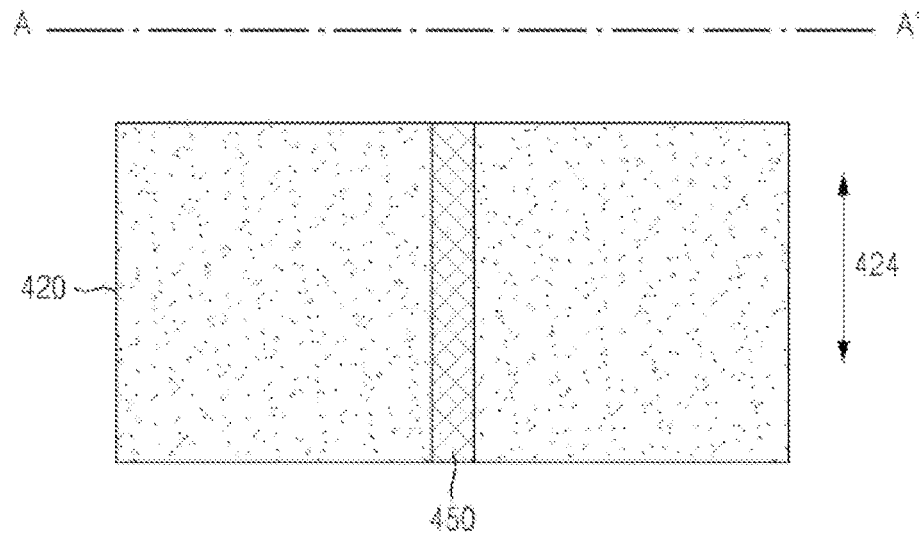

Referring to FIGS. 3 to 4J, the manufacturing system forms lower strings 411 and 412 in a first block 410 in operation S310. For example, as in FIG. 4A, the manufacturing system may etch a center region of the first block 410, including a sacrificial layer 414 and an insulation layer 415 which extend in a first direction and are alternately stacked, in a hole shape, and then, may form the lower strings 411 and 412 in a space 416 etched as in FIG. 4B. Hereinafter, the lower strings 411 and 412 are described and illustrated as including a channel layer 411 and a charge storage layer 412 surrounding the channel layer 411 but are not restricted or limited thereto, and in a case where the channel layer 411 is formed in a tube shape, the lower strings 411 and 412 may further include a buried layer (not shown) filled into an inner portion of the channel layer 411 and an insulation layer (not shown) disposed between the channel layer 411 and the charge storage layer 412 or disposed outside the charge storage layer 412.

Subsequently, in operation S320, the manufacturing system generates an inter-string insulation layer 420 on the first block 410 with the lower strings 411 and 412 formed therein.

Subsequently, in operation S330, the manufacturing system etches at least a portion 421 of the inter-string insulation layer 420 to form at least one sacrificial film 423 in the space 422 where the at least a portion 421 is etched.

In an embodiment of operations S320 to S330, the manufacturing system may generate the inter-string insulation layer 420 on the first block 410 having the lower strings 411 and 412 formed therein as in FIG. 4C, and then, as in FIG. 4D, may etch the at least a portion 421 of the inter-string insulation layer 420 in a second direction 424 perpendicular to a first direction 413 and may form the at least one sacrificial film 423 in the space 422 where the at least a portion 421 is etched in the second direction 424.

At this time, in forming the at least one sacrificial film 423, the manufacturing system may etch the at least a portion 421 of the inter-string insulation layer 420 so that at least one intermediate wiring layer 450, which is to be formed in a space 440 where the at least one sacrificial film 423 is etched, contacts at least a portion of a channel layer 433 included in the upper strings 433 and 434 and at least a portion of the channel layer 411 included in the lower strings 411 and 412. In the drawing, the at least a portion 421 etched in the inter-string insulation layer 420 is illustrated as one trench disposed at a center of the inter-string insulation layer 420, but is not restricted and limited thereto and may be disposed at an arbitrary position, contacting at least a portion of the channel layer 433 included in the upper strings 433 and 434 and at least a portion of the channel layer 411 included in the lower strings 411 and 412, of the inter-string insulation layer 420, and the number of etched trenches may be two instead of one. This will be described below in detail with reference to FIGS. 5A to 5C.

Also, in operation S330, the manufacturing system may form at least one channel connection portion (not shown) connecting the channel layer 411 of the lower strings 411 and 412 to the channel layer 433 of the upper strings 433 and 434. This will be described below in detail with reference to FIGS. 6A to 6G.

Subsequently, in operation S340, the manufacturing system generates a second block 430 on the inter-string insulation layer 420 having the at least one sacrificial film 423 formed therein. For example, as in FIG. 4E, the manufacturing system may generate a second block 430, including a sacrificial layer 431 and an insulation layer 432 which are formed to extend in the first direction and are alternately stacked, on the inter-string insulation layer 420.

Subsequently, in operation S350, the manufacturing system forms upper strings 433 and 434 in the second block 430. For example, as in FIG. 4F, the manufacturing system may etch a center region of the second block 430 in a hole shape, and then, may form the upper strings 433 and 434 in an etched space 435 as in FIG. 4G. Herein, like the lower strings 411 and 412, the upper strings 433 and 434 are described and illustrated as including a channel layer 433 and a charge storage layer 434 surrounding the channel layer 433 but are not restricted or limited thereto, and in a case where the channel layer 433 is formed in a tube shape, the lower strings 433 and 434 may further include a buried layer (not shown) filled into an inner portion of the channel layer 433 and an insulation layer (not shown) disposed between the channel layer 433 and the charge storage layer 434 or disposed outside the charge storage layer 434.

Subsequently, in operation S360, the manufacturing system etches the sacrificial layer 414 included in the first block 410, the at least one sacrificial film 423 formed in the inter-string insulation layer 420, and the sacrificial layer 431 included in the second block 430. For example, as in FIG. 4H, the manufacturing system may etch the sacrificial layer 414 included in the first block 410, the at least one sacrificial film 423 formed in the inter-string insulation layer 420, and the sacrificial layer 431 included in the second block 430 by a chemical process, and thus, may secure the space 440 where the at least one sacrificial film 423 is etched, the space 441 where the sacrificial layer 414 included in the first block 410 is etched, and the space 442 where the sacrificial layer 431 included in the second block 430 is etched.

Subsequently, in operation S370, the manufacturing system forms an electrode layer 450, which is to be used as at least one intermediate wiring layer, in the space 440 where the at least one sacrificial film 423 is etched, forms an electrode layer 451, which is to be used as a word line, in the space 441 where the sacrificial layer 414 included in the first block 410 is etched, and forms an electrode layer 452, which is to be used as a word line, in the space 442 where the sacrificial layer 431 included in the second block 430 is etched. For example, as in FIG. 4I, by using a deposition process, the manufacturing system may form the electrode layers 450, 451, and 452 with a metal material (for example, at least one of tungsten (W), titanium (Ti), tantalum (Ta), copper (Cu), or gold (Au)) in the space 440 where the at least one sacrificial film 423 is etched, the space 441 where the sacrificial layer 414 included in the first block 410 is etched, and the space 442 where the sacrificial layer 431 included in the second block 430 is etched. In this case, the electrode layer 450 formed in the space 440 where the at least one sacrificial film 423 is etched is used as at least one intermediate wiring layer, the electrode layer 451 formed in the space 441 where the sacrificial layer 414 included in the first block 410 is etched is used as a word line, and the electrode layer 452 formed in the space 442 where the sacrificial layer 431 included in the second block 430 is etched is used as a word line.

Here, the at least one intermediate wiring layer is a wiring layer which is usable as one of a source electrode or a drain electrode corresponding to the upper strings 433 and 434 and the lower strings 411 and 412, and for example, in a case where an upper wiring layer (not shown) included in a three-dimensional flash memory is used as the source electrode, the at least one intermediate wiring layer 450 closest to the upper wiring layer with a memory cell to be controlled therebetween may be used as the drain electrode, and in a case where the upper wiring layer is used as the drain electrode, at least one intermediate wiring layer 450 closest to the upper wiring layer with a memory cell to be controlled therebetween may be used as the source electrode.

A top view of a three-dimensional flash memory (a cross-sectional view taken with respect to the at least one intermediate wiring layer 450 in the three-dimensional flash memory) manufactured through operations S310 to S370 is as illustrated in FIG. 4J.

As described above, the manufacturing system may be characterized by performing a process of manufacturing the at least one intermediate wiring layer 450 after all of the lower strings 411 and 412 and the upper strings 433 and 434 are formed (i.e., the at least one intermediate wiring layer 450 is manufactured by using a back end process) and may overcome a problem, where a material is degraded, and a drawback, where the process cost is high, of conventional manufacturing technology by using the characteristic.

Furthermore, because the manufacturing system performs a process where a process of manufacturing the at least one intermediate wiring layer 450 and a process of manufacturing a word line are integrated, the manufacturing system may obtain an effect of more reducing the process cost.

Figure 5A:
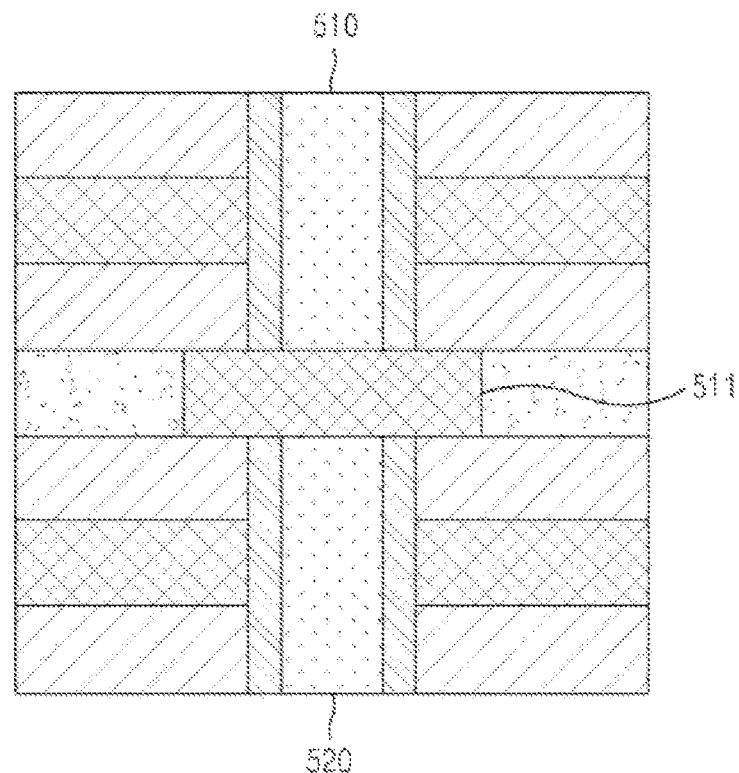
FIGS. 5A to 5C are diagrams illustrating three-dimensional flash memories having various structures manufactured by the method of manufacturing a three-dimensional flash memory illustrated in FIG. 3.
Figure 5B:
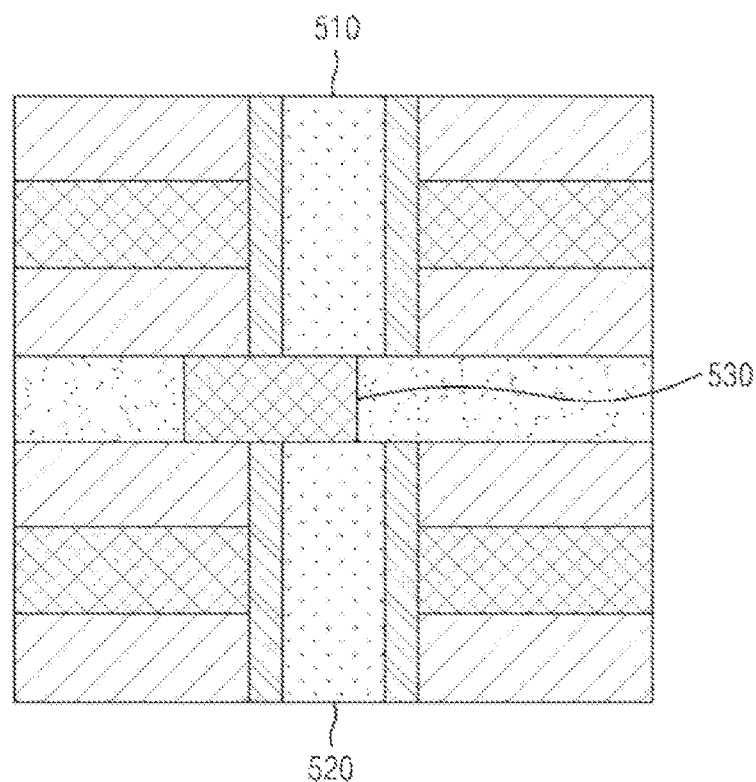
Figure 5C:
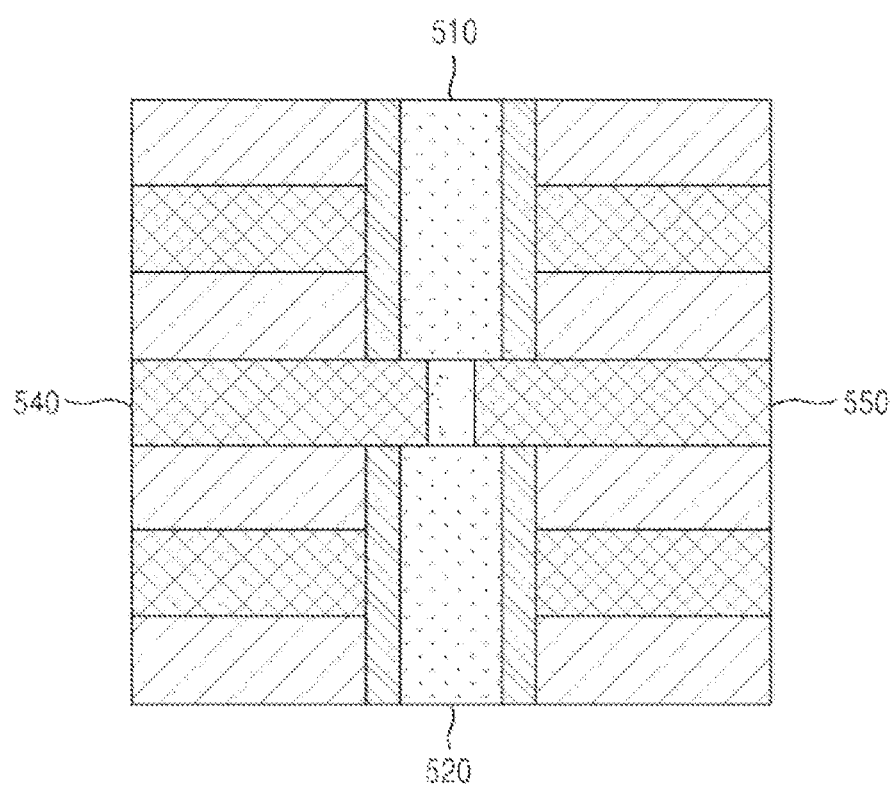
Figure 6A:
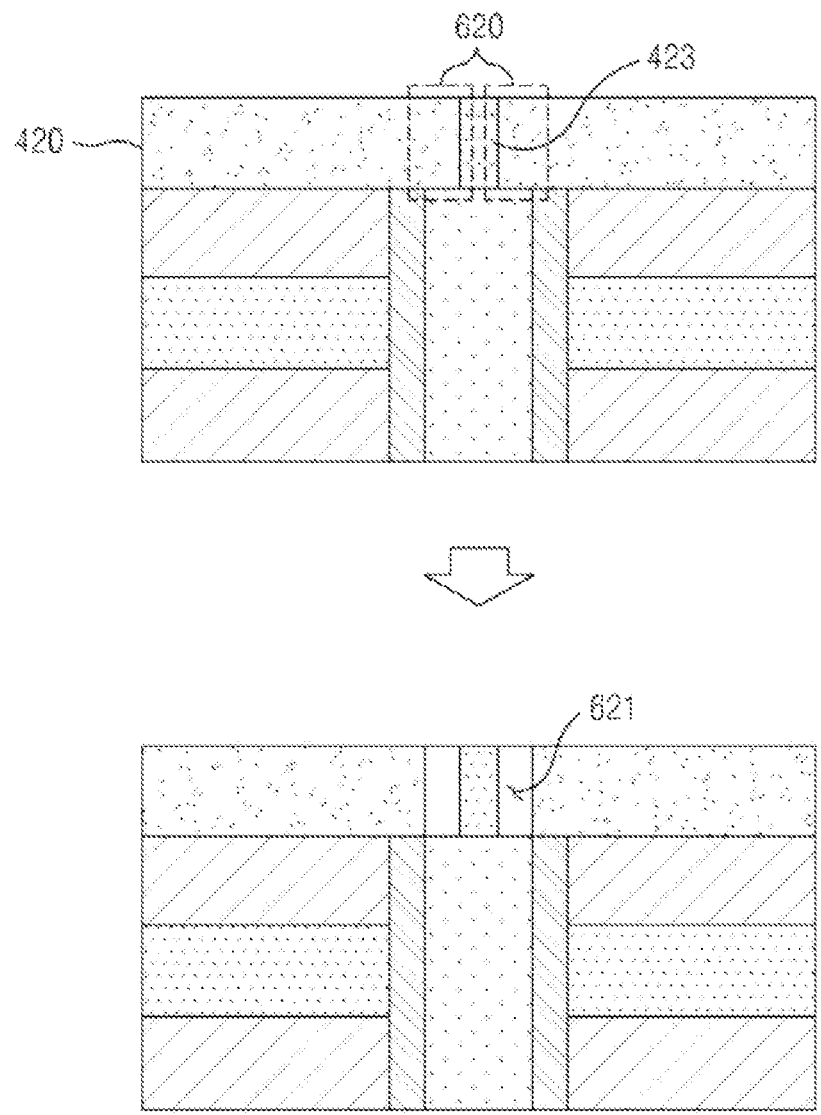
Figure 6B:
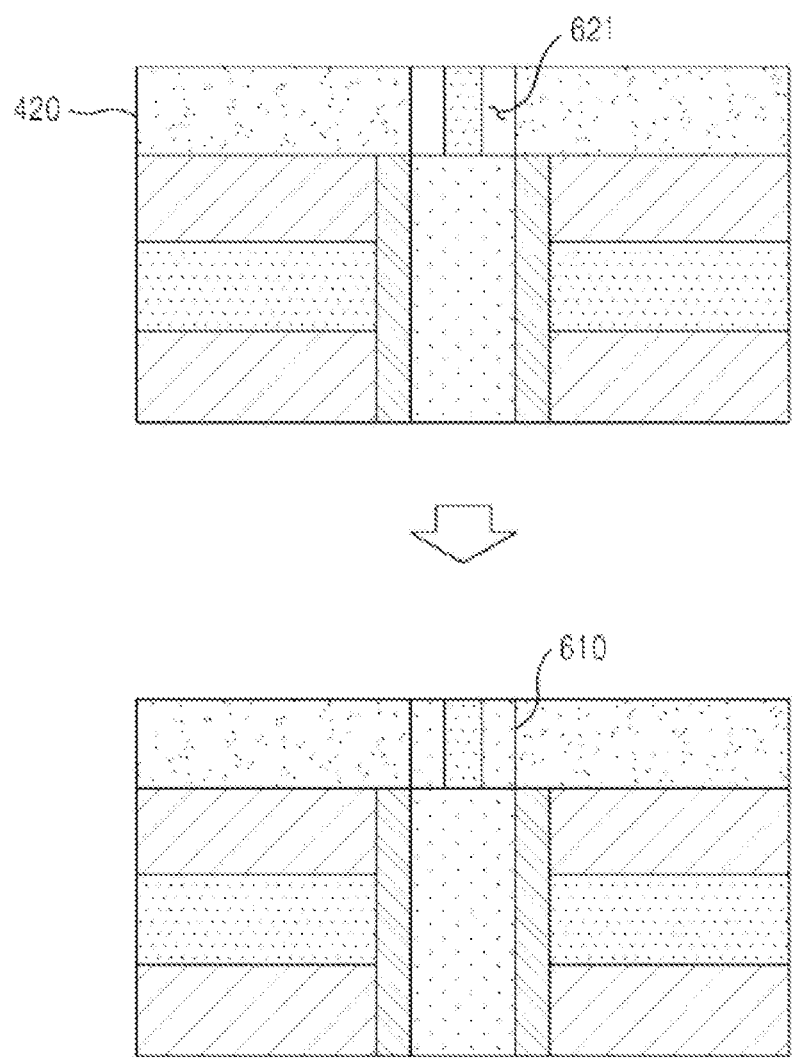

FIGS. 5A to 5C are diagrams illustrating three-dimensional flash memories having various structures manufactured by the method of manufacturing the three-dimensional flash memory illustrated in FIG. 3.

Referring to FIG. 5A, as in the drawing, a three-dimensional flash memory may include at least one intermediate wiring layer 511 which is largely formed to contact whole cross-sectional surfaces of an upper string 510 and a lower string 520. In this case, the manufacturing system may etch a wider space than FIG. 4D in generating a space (a space with at least one sacrificial film etched therein) where the at least one intermediate wiring layer 511 is to be formed.

Referring to FIG. 5B, as in the drawing, a three-dimensional flash memory may include at least one intermediate wiring layer 530 which is formed to contact a portion of a left portion of each of an upper string 510 and a lower string 520. In this case, unlike FIG. 4D, the manufacturing system may etch a space at a position moved to the left with respect to an inter-string insulation layer in generating a space (a space with at least one sacrificial film etched therein) where the at least one intermediate wiring layer 530 is to be formed.

Referring to FIG. 5C, as in the drawing, a three-dimensional flash memory may include a first intermediate wiring layer 540 which is formed to contact a portion of a left portion of each of an upper string 510 and a lower string 520 and a second intermediate wiring layer 550 which is formed to contact a portion of a right portion of each of the upper string 510 and the lower string 520. In this case, the manufacturing system may etch two trenches of the inter-string insulation layer, for generating two intermediate wiring layers 540 and 550, and thus, may generate the two intermediate wiring layers 540 and 550.

FIGS. 6A to 6G are diagrams illustrating a second embodiment for describing the method of manufacturing the three-dimensional flash memory illustrated in FIG. 3.

Hereinafter, a manufacturing method to be described is characterized by including an additional operation of forming at least one channel connection portion 610 on the basis of operations S310 to S370 described above with reference to FIGS. 3 to 4I.

Referring to FIGS. 6A to 6G, after operations S310 and S320 illustrated in FIG. 3 are performed as in FIGS. 4A to 4C, the manufacturing system may form the at least one channel connection portion 610 in operation S330 of forming at least one sacrificial film 423. For example, the manufacturing system may etch other at least a portion 620, except a portion with the at least one sacrificial film 423 formed therein, of an inter-string insulation layer 420 as in FIG. 6A, and then, may form the at least one channel connection portion 610 in a space 621 where the other at least a portion 620 is etched as in FIG. 6B. Hereinafter, the at least one channel connection portion 610 is an element connecting a channel layer 433, included in upper strings 433 and 434, to a channel layer 411 included in lower strings 411 and 412 and is characterized in that the channel layer 433 included in the upper strings 433 and 434 and the channel layer 411 included in the lower strings 411 and 412 are formed of the same material.

In this case, the manufacturing system may etch the other at least a portion 620 of the inter-string insulation layer 420 so that the at least one channel connection portion 610, which is to be formed in a space 621 where the other at least a portion 620 is etched, contacts at least a portion of the channel layer 433 included in the upper strings 433 and 434 and at least a portion of the channel layer 411 included in the lower strings 411 and 412, in forming the at least one channel connection portion 610.

In the drawing, the space 621 where the other at least a portion 620 is etched is illustrated in a tube shape, but is not restricted or limited thereto and may have a groove shape where an inner portion thereof is buried. This will be described below in detail with reference to FIG. 7.

The at least one channel connection portion 610 formed in this manner may be formed of a material having the same type as the channel layer 433 included in the upper strings 433 and 434 and the channel layer 411 included in the lower strings 411 and 412. For example, in a case where the channel layer 433 included in the upper strings 433 and 434 and the channel layer 411 included in the lower strings 411 and 412 are formed of an N-type material through an N-type ion implantation process, the at least one channel connection portion 610 may be formed of an N-type material through the N-type ion implantation process. Therefore, all of the channel layer 433 included in the upper strings 433 and 434 and the channel layer 411 included in the lower strings 411 and 412 may be connected to a substrate, on which a three-dimensional flash memory is formed, through the at least one channel connection portion 610, and thus, a bulk-based erase operation may be performed.

When the at least one channel connection portion 610 is formed, the manufacturing system may perform operations S340 to S370 illustrated in FIG. 3 as in FIGS. 6C to 6G to manufacture a three-dimensional flash memory. A detailed process is the same as a process described above with reference to FIGS. 4E to 4I, and thus, its detailed description is omitted.

Also, in operation S330, the manufacturing system may form a connection string (not shown), instead of forming the at least one channel connection portion 610. Hereinafter, the connection string is an element which connects the channel layer 433 included in the upper strings 433 and 434 to the channel layer 411 included in the lower strings 411 and 412 and is characterized by including a channel connection portion, formed of the same material as that of a channel layer (the channel layer 433 included in the upper strings 433 and 434 and the channel layer 411 included in the lower strings 411 and 412), and a charge storage layer connection portion formed of the same material as that of a charge storage layer (a charge storage layer 434 included in the upper strings 433 and 434 and a charge storage layer 412 included in the lower strings 411 and 412). This will be described below in detail with reference to FIGS. 8A to 8G.

Figure 7:
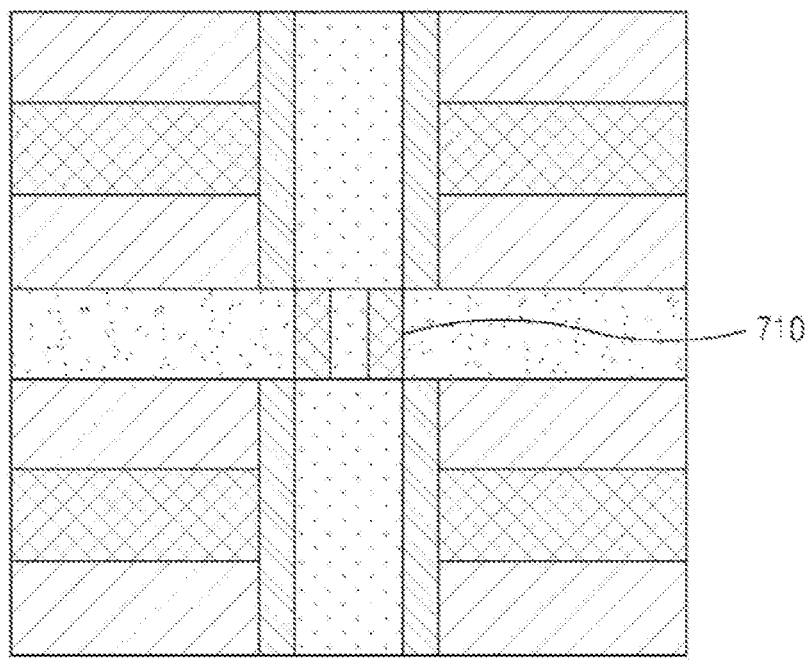
FIG. 7 is a diagram illustrating a three-dimensional flash memory having various structures manufactured by the method of manufacturing a three-dimensional flash memory illustrated in FIGS. 6A to 6G.
Figure 8A:
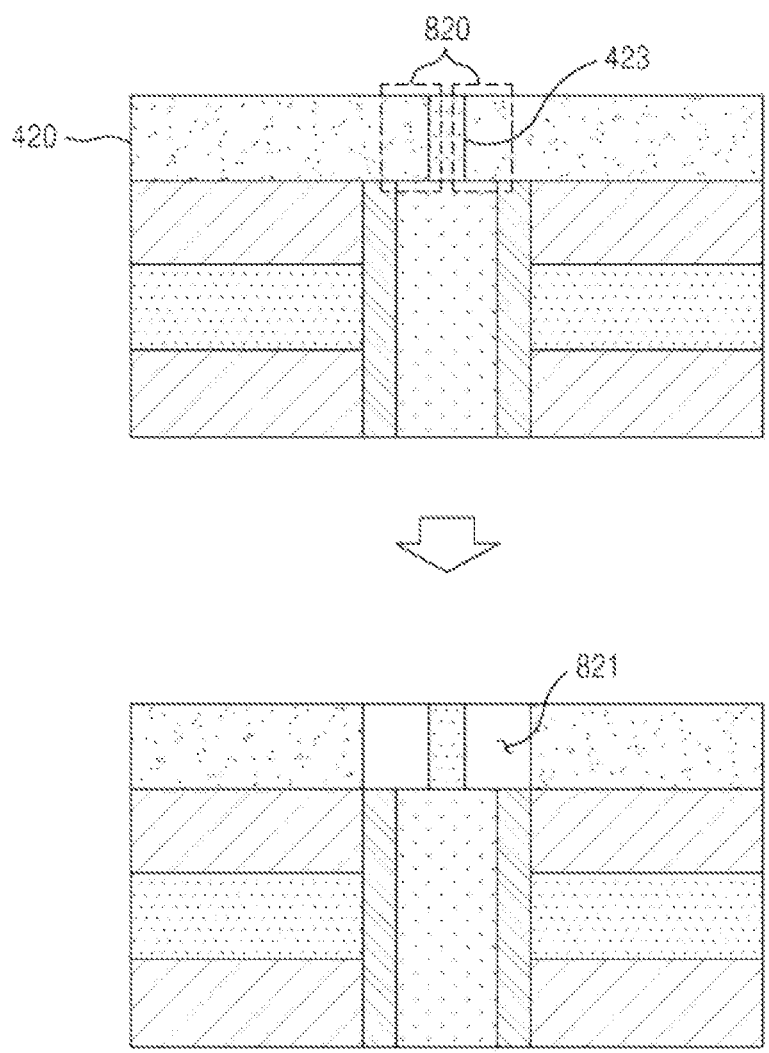
Figure 8B:
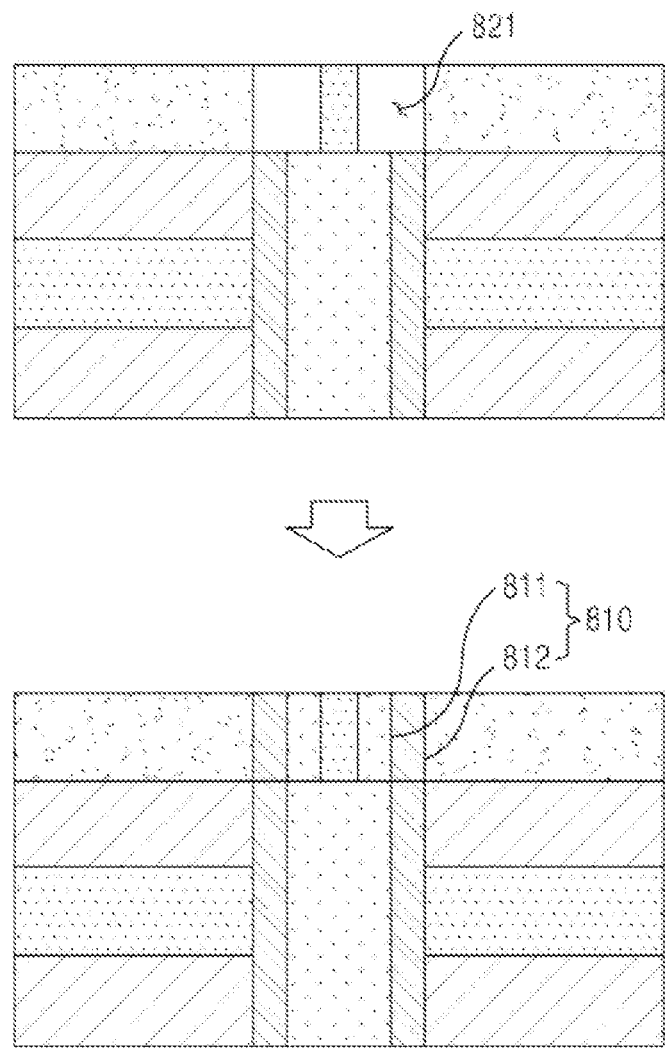

FIG. 7 is a diagram illustrating a three-dimensional flash memory having various structures manufactured by the method of manufacturing the three-dimensional flash memory illustrated in FIGS. 6A to 6G.

Referring to FIG. 7, in the three-dimensional flash memory, as in the drawing, a space where other at least a portion, except a portion with at least one sacrificial film 423 formed therein, of an inter-string insulation layer 420 is etched may have a groove shape (a case where at least one intermediate wiring layer which is to be generated at a portion with the at least one sacrificial film 423 formed therein is generated as two), and thus, a channel connection portion 710 may have a pillar shape where an inner portion thereof is filled, instead of a tube shape.

FIGS. 8A to 8G are diagrams illustrating a third embodiment for describing the method of manufacturing the three-dimensional flash memory illustrated in FIG. 3.

Hereinafter, a manufacturing method to be described is characterized by including an additional operation of forming a connection string 810 on the basis of operations S310 to S370 described above with reference to FIGS. 3 to 4I.

Referring to FIGS. 8A to 8G, after operations S310 and S320 illustrated in FIG. 3 are performed as in FIGS. 4A to 4C, the manufacturing system may form the connection string 810 in operation S330 of forming at least one sacrificial film 423. For example, the manufacturing system may etch other at least a portion 820, except a portion with the at least one sacrificial film 423 formed therein, of an inter-string insulation layer 420 as in FIG. 8A, and then, may form the connection string 810 in a space 821 where the other at least a portion 820 is etched as in FIG. 8B. Here, the connection string 810 may include a channel connection portion 811, formed of the same material as that of a channel layer (a channel layer 433 included in upper strings 433 and 434 and a channel layer 411 included in lower strings 411 and 412), and a charge storage layer connection portion 812 formed of the same material as that of a charge storage layer (a charge storage layer 434 included in the upper strings 433 and 434 and a charge storage layer 412 included in the lower strings 411 and 412).

In this case, the manufacturing system may etch the other at least a portion 820 of the inter-string insulation layer 420 so that the connection string 810, which is to be formed in a space 821 where the other at least a portion 820 is etched, contacts the upper strings 433 and 434 and the lower strings 411 and 412, in forming the connection string 810.

In the drawing, the space 821 where the other at least a portion 820 is etched is illustrated in a tube shape, but is not restricted or limited thereto and may have a groove shape where a tube-shaped groove surrounding at least one sacrificial film 423 and an inner portion thereof surrounded by the at least one sacrificial film 423 are buried. This will be described below in detail with reference to FIG. 9.

Therefore, all of the channel layer 433 included in the upper strings 433 and 434 and the channel layer 411 included in the lower strings 411 and 412 may be connected to a substrate, on which a three-dimensional flash memory is formed, through the connection string 810 formed as described above, and thus, a bulk-based erase operation may be performed.

When the connection string 810 is formed, the manufacturing system may perform operations S340 to S370 illustrated in FIG. 3 as in FIGS. 8C to 8G to manufacture a three-dimensional flash memory. A detailed process is the same as a process described above with reference to FIGS. 4E to 4I, and thus, its detailed description is omitted.

Figure 9:
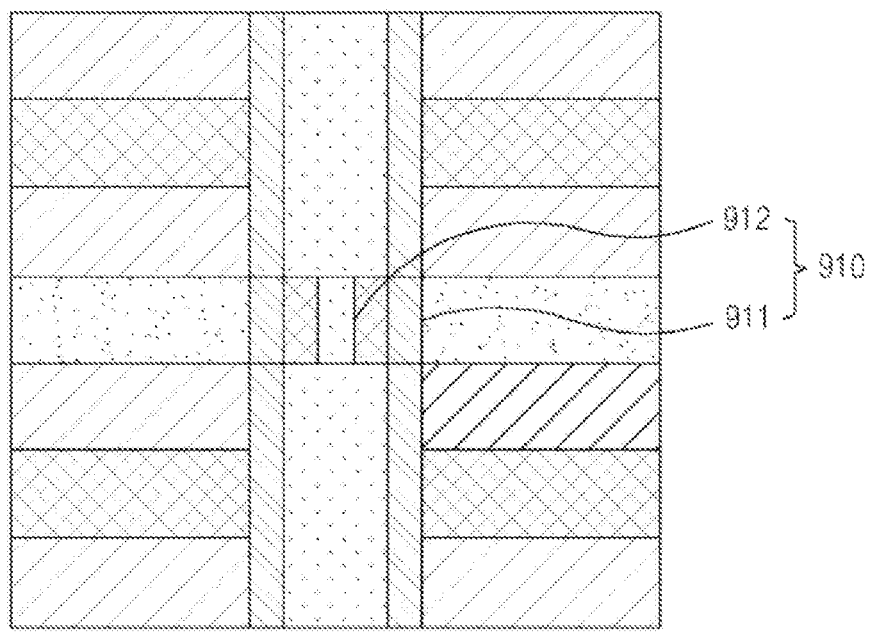
FIG. 9 is a diagram illustrating a three-dimensional flash memory having another structure manufactured by the method of manufacturing a three-dimensional flash memory illustrated in FIGS. 8A to 8G.

FIG. 9 is a diagram illustrating a three-dimensional flash memory having another structure manufactured by the method of manufacturing the three-dimensional flash memory illustrated in FIGS. 8A to 8G.

Referring to FIG. 9, as in the drawing, a space where other at least a portion, except a portion with at least one sacrificial film 423 formed therein, of an inter-string insulation layer 420 is etched may have a groove shape where a tube-shaped groove surrounding at least one sacrificial film 423 and an inner portion thereof surrounded by the at least one sacrificial film 423 are buried, and thus, a connection string 910 may be configured with a charge storage layer 911 having a tube shape, surrounding the at least one sacrificial film 423, and a channel connection portion 912 having a pillar shape where an inner portion thereof surrounded by the at least one sacrificial film 423 is filled.

Hereinabove, the method of manufacturing the three-dimensional flash memory has been described as including an operation of forming the lower strings 411 and 412 in the first block 410 and an operation of forming the upper strings 433 and 434 in the second block 430, but by using blocks with a string each formed therein, the operation of forming the lower strings 411 and 412 and the operation of forming the upper strings 433 and 434 may be omitted. This will be described below in detail with reference to FIG. 10.

Figure 10:
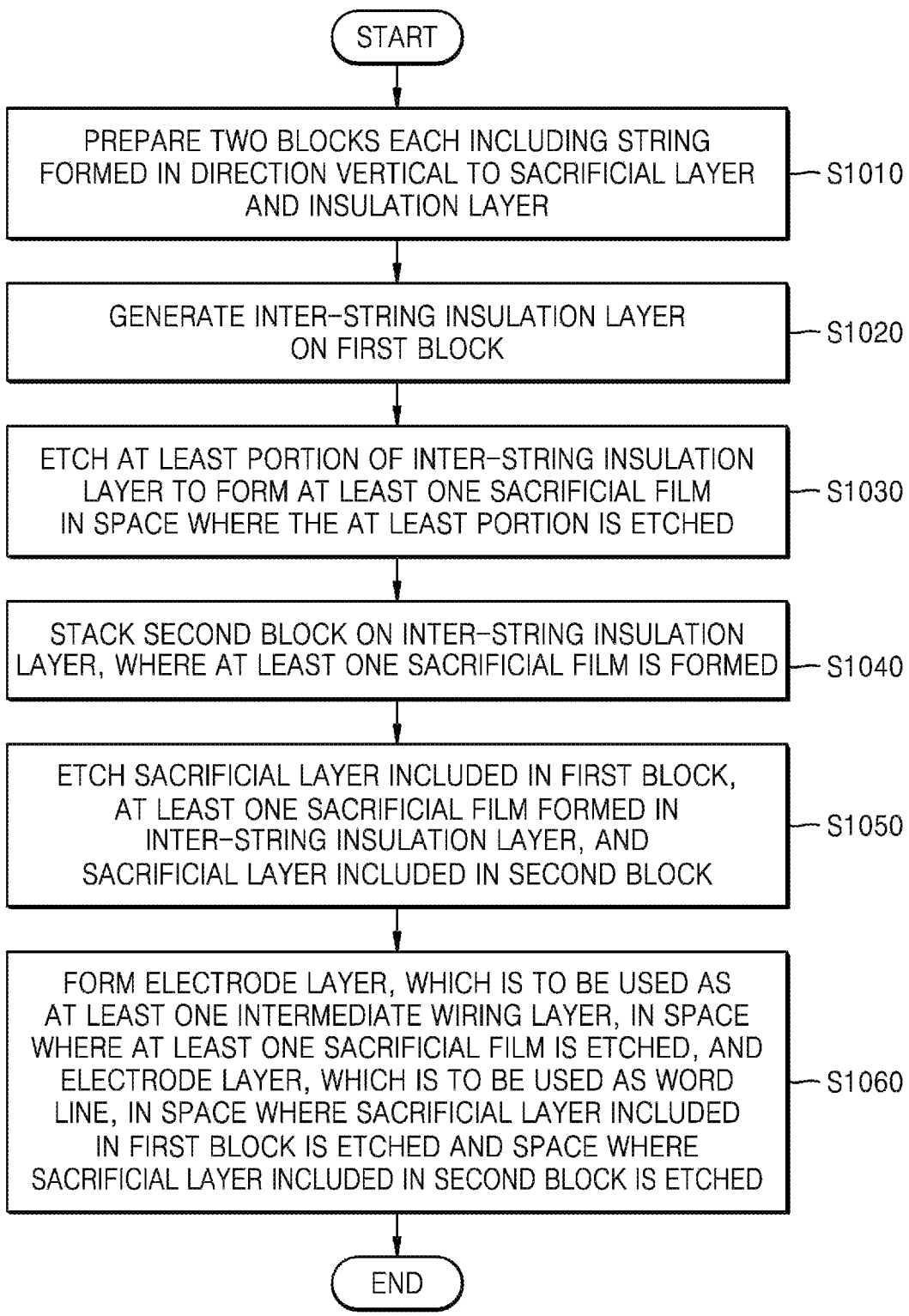
FIG. 10 is a flowchart illustrating a method of manufacturing a three-dimensional flash memory according to another embodiment.

FIG. 10 is a flowchart illustrating a method of manufacturing a three-dimensional flash memory according to another embodiment, and FIGS. 11A to 11G are diagrams illustrating an embodiment for describing the method of manufacturing the three-dimensional flash memory illustrated in FIG. 10. Hereinafter, it is assumed that a method of manufacturing a three-dimensional flash memory described is performed by an automated and mechanized manufacturing system.

Figure 11C:
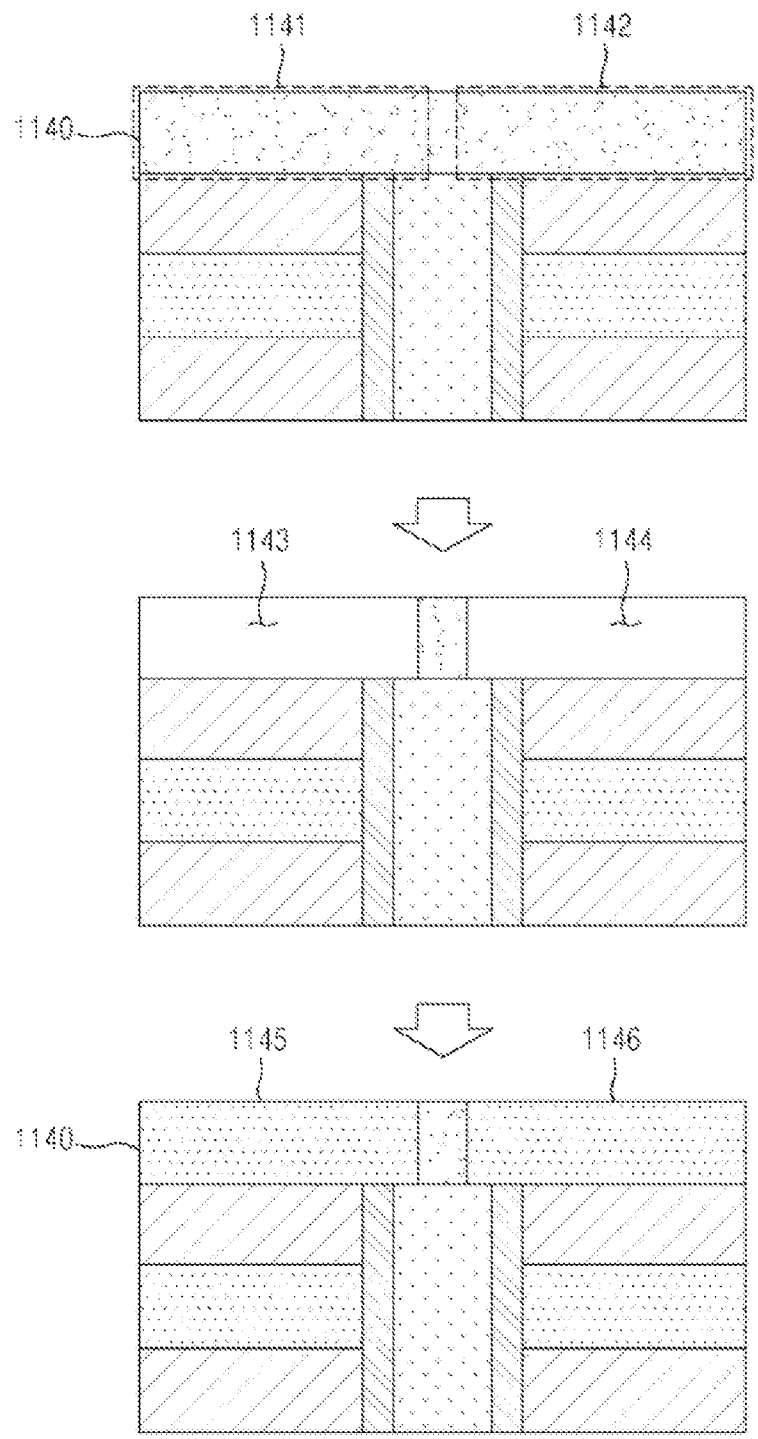
Figure 11D:
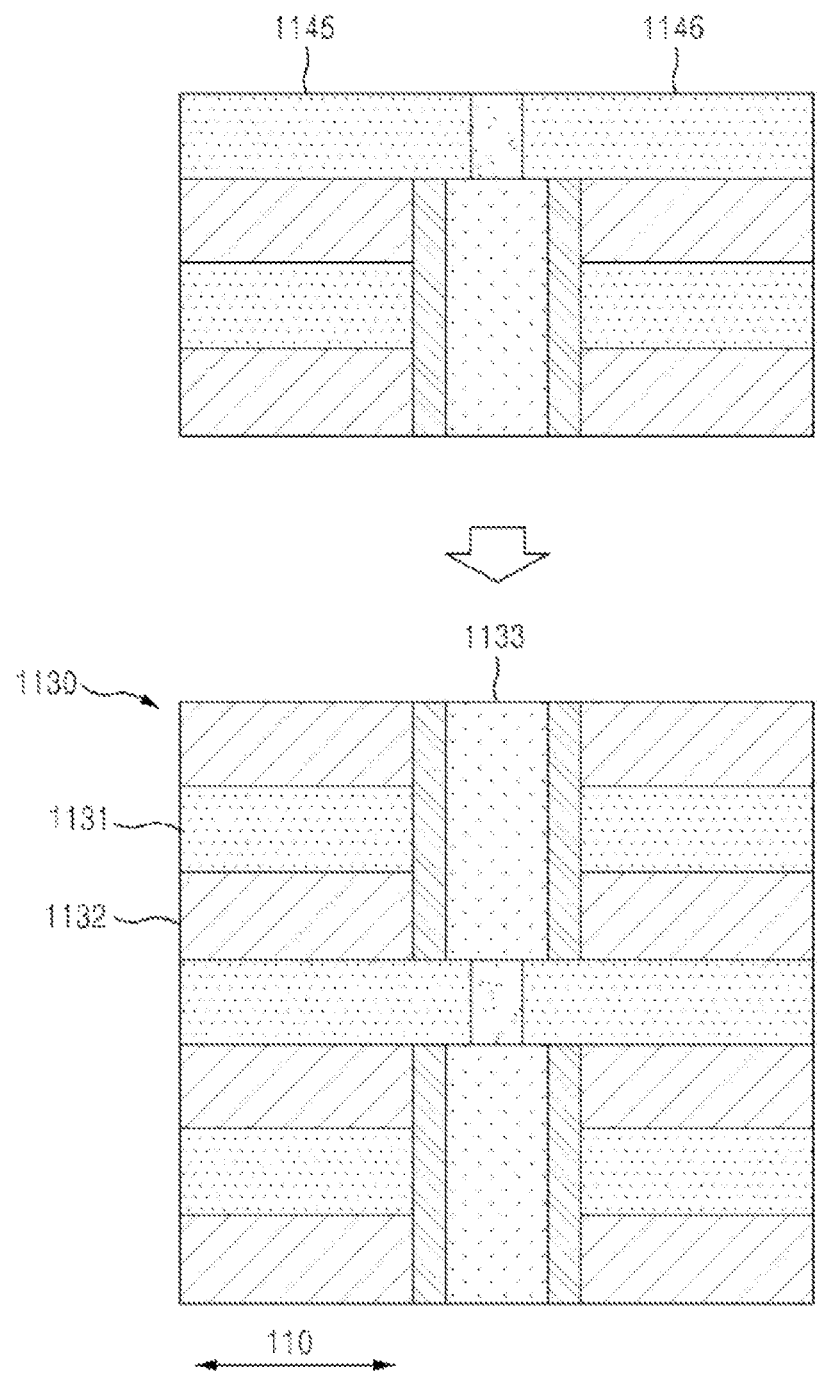
Figure 11E:
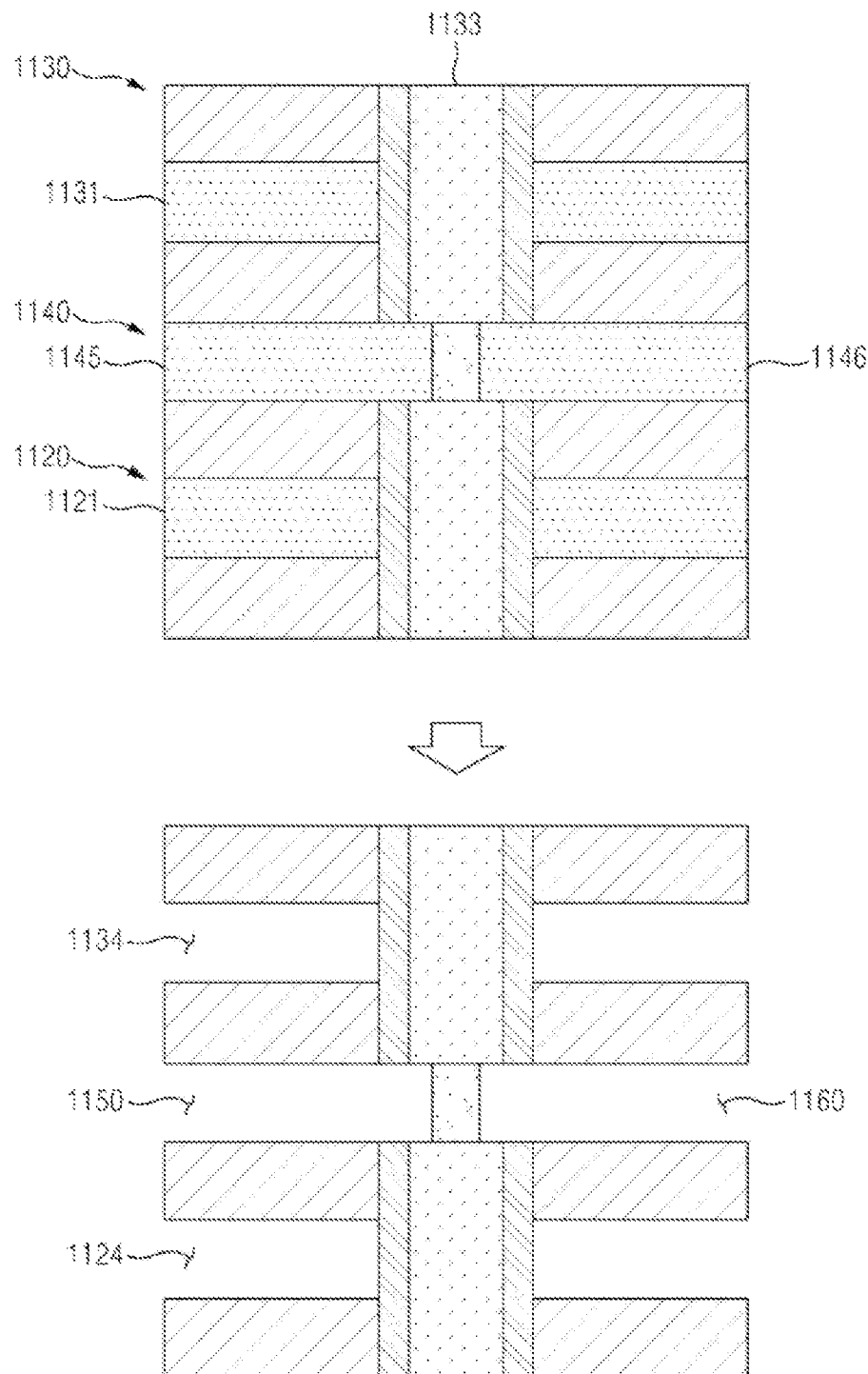
Figure 11F:
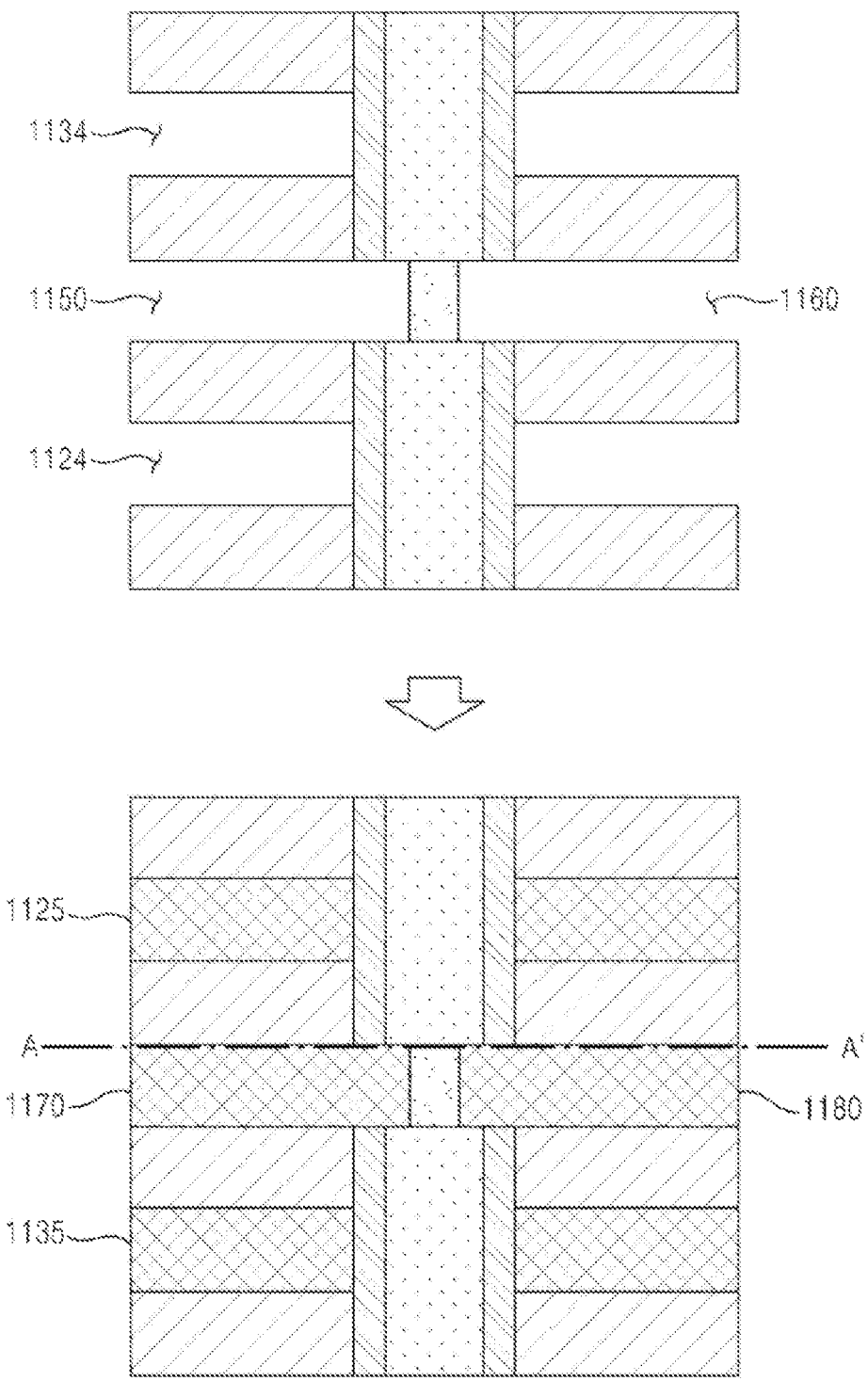
Figure 11G:
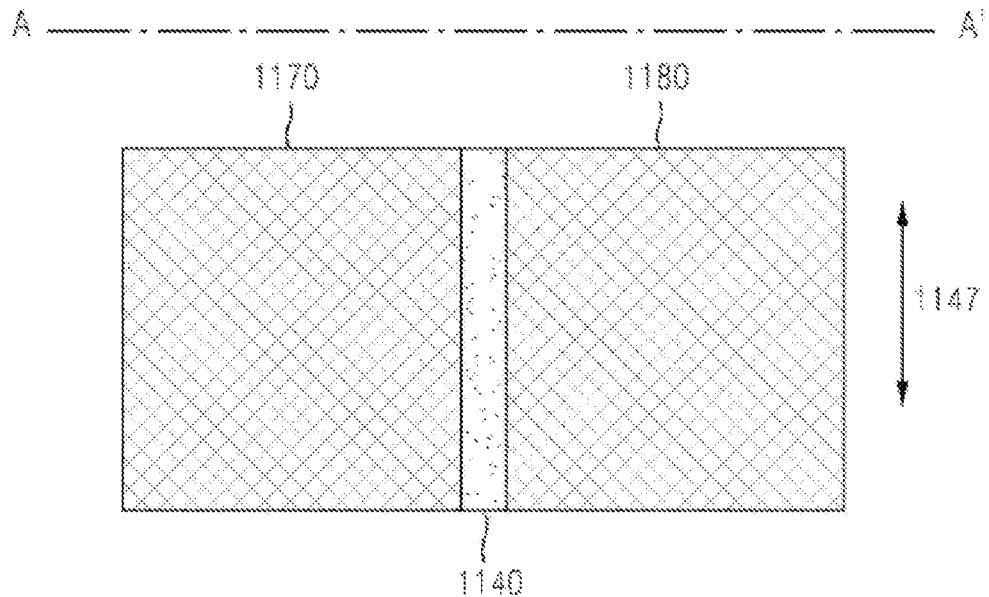

Referring to FIGS. 10 to 11G, as in FIG. 11A, the manufacturing system prepares two blocks 1120 and 1130 respectively including sacrificial layers 1121 and 1131 and insulation layers 1122 and 1133, which are formed to extend in a first direction 110 and are alternately stacked, and strings 1123 and 1133 formed in a direction vertical to the first direction 1110. A process of respectively forming the strings 1123 and 1133 in the two blocks 1120 and 1130 is the same as a process of forming the lower strings 411 and 412 described above with reference to FIGS. 4A and 4B, and thus, its detailed description is omitted.

Subsequently, in operation S1020, the manufacturing system generates an inter-string insulation layer 1140 on a first block 1120 of the two blocks 1120 and 1130.

Subsequently, in operation S1030, the manufacturing system etches at least some portions 1141 and 1142 of the inter-string insulation layer 1140 to respectively form at least one sacrificial films 1145 and 1146 in spaces 1143 and 1144 where the at least some portions 1141 and 1142 are etched.

In an embodiment of operations S1020 and S1030, the manufacturing system may generate the inter-string insulation layer 1140 on the first block 1120 as in FIG. 11B, etch the at least some portions 1141 and 1142 of the inter-string insulation layer 1140 in a second direction 1147 perpendicular to the first direction 1110 as in FIG. 11C, and form the at least one sacrificial films 1145 and 1146 in the etched spaces 1143 and 1144 in the second direction 1147.

In this case, in forming the at least one sacrificial films 1145 and 1146, the at least some portions 1141 and 1142 of the inter-string insulation layer 1140 may be etched so that at least one intermediate wiring layers 1170 and 1180, which are to be formed in spaces 1150 and 1160 where the at least one sacrificial films 1145 and 1146 are etched, contact at least a portion of a channel layer of the string 1123 included in the first block 1120 and at least a portion of a channel layer of the string 1133 included in the second block 1130. In the drawing, the at least some portions 1141 and 1142 etched in the inter-string insulation layer 420 is illustrated as two trenches in the inter-string insulation layer 1140, but are not restricted or limited thereto and may be one trench disposed at a center of the inter-string insulation layer 1140. This has been described above with reference to FIGS. 5A to 5C, and thus, is omitted.

Also, in operation S1030, the manufacturing system may form at least one channel connection portion (not shown) which connects the channel layer of the string 1123, included in the first block 1120, to the channel layer of the string 1133 included in the second block 1130. This has been described above with reference to FIGS. 6A to 6G, and thus, is omitted.

Also, in operation S1030, the manufacturing system may form a connection string (not shown), instead of forming at least one channel connection portion. This has been described above with reference to FIGS. 8A to 8G, and thus, is omitted.

Subsequently, in operation S1040, the manufacturing system may stack the second block 1130 on the inter-string insulation layer 1140 where the at least one sacrificial films 1145 and 1146 are formed. For example, as in FIG. 11D, the manufacturing system may stack the second block 1130, including the sacrificial layer 1121 and the insulation layer 1122 which are formed to extend in the first direction 1110 and are alternately stacked and the string 1133 formed in a direction vertical to the first direction 1110, on the inter-string insulation layer 1140.

Subsequently, in operation S1050, the manufacturing system etches the sacrificial layer 1121 included in the first block 1120, the at least one sacrificial films 1145 and 1146 formed in the inter-string insulation layer 1140, and the sacrificial layer 1131 included in the second block 1130. For example, as in FIG. 11E, the manufacturing system may etch the sacrificial layer 1121 included in the first block 1120, the at least one sacrificial films 1145 and 1146 formed in the inter-string insulation layer 1140, and the sacrificial layer 1131 included in the second block 1130 by using a chemical process, and thus, may secure the spaces 1150 and 1160 where the at least one sacrificial films 1145 and 1146 are etched, the space 1124 where the sacrificial layer 1121 included in the first block 1120 is etched, and the space 1134 where the sacrificial layer 1131 included in the second block 1130 is etched.

Subsequently, in operation S1060, the manufacturing system forms the electrode layers 1170 and 1180, which are to be used as at least one intermediate wiring layer, in the spaces 1150 and 1160 where the at least one sacrificial films 1145 and 1146 are etched and forms the electrode layers 1125 and 1135, which are to be used as word lines, in the space 1124 where the sacrificial layer 1121 included in the first block 1120 is etched and the space 1134 where the sacrificial layer 1131 included in the second block 1130 is etched. For example, as in FIG. 11F, by using a deposition process, the manufacturing system may form the electrode layers 1170, 1180, 1125, and 1135 with a metal material (for example, at least one of tungsten (W), titanium (Ti), tantalum (Ta), copper (Cu), or gold (Au)) in the spaces 1150 and 1160 where the at least one sacrificial films 1145 and 1146 are etched, the space 1124 where the sacrificial layer 1121 included in the first block 1120 is etched, and the space 1134 where the sacrificial layer 1131 included in the second block 1130 is etched. In this case, the electrode layers 1170 and 1180 formed in the spaces 1150 and 1160 where the at least one sacrificial films 1145 and 1146 are etched are used as at least one intermediate wiring layer, and the electrode layers 1125 and 1135 formed in the space 1124 where the sacrificial layer 1121 included in the first block 1120 is etched and the space 1134 where the sacrificial layer 1131 included in the second block 1130 is etched are used as word lines.

Here, the at least one intermediate wiring layer is a wiring layer which is usable as one of a source electrode or a drain electrode corresponding to the strings 1123 and 1133, and for example, in a case where an upper wiring layer (not shown) included in a three-dimensional flash memory is used as the source electrode, the at least one intermediate wiring layers 1170 and 1180 closest to the upper wiring layer with a memory cell to be controlled therebetween may be used as the drain electrode, and in a case where the upper wiring layer is used as the drain electrode, at least one intermediate wiring layers 1170 and 1180 closest to the upper wiring layer with a memory cell to be controlled therebetween may be used as the source electrode.

A top view of a three-dimensional flash memory (a cross-sectional view taken with respect to the at least one intermediate wiring layers 1170 and 1180 in the three-dimensional flash memory) manufactured through operations S1010 to S1060 is as illustrated in FIG. 11G.

As described above, the manufacturing system may be characterized by performing a process of manufacturing the at least one intermediate wiring layers 1170 and 1180 after all of the strings 1123 and 1133 are formed (i.e., the at least one intermediate wiring layers 1170 and 1180 are manufactured by using a back end process) and may overcome a problem, where a material is degraded, and a drawback, where the process cost is high, of conventional manufacturing technology by using the characteristic.

Furthermore, because the manufacturing system performs a process where a process of manufacturing the at least one intermediate wiring layers 1170 and 1180 and a process of manufacturing a word line are integrated, the manufacturing system may obtain an effect of more reducing the process cost.

Figure 12:
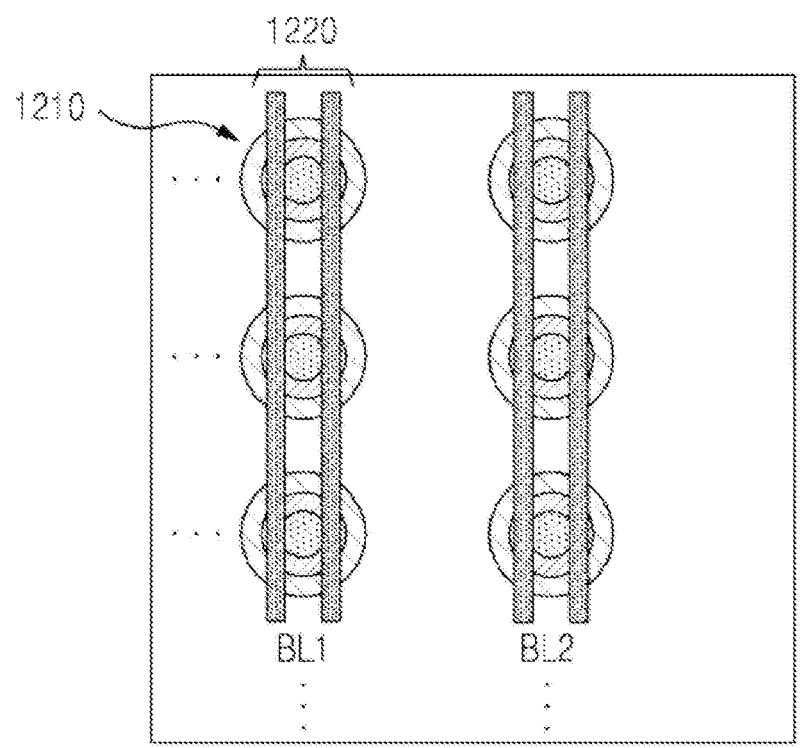
FIG. 12 is a top view of a three-dimensional flash memory for describing a structure of a bit line of the related art.

FIG. 12 is a top view of a three-dimensional flash memory for describing a structure of a bit line of the related art.

Referring to FIG. 12, as seen in a top view of a cell string, because a three-dimensional flash memory of the related art includes a bit line 1220 configured with two lines connected to a cell string 1210, the three-dimensional flash memory of the related art has a limitation of miniaturization and integration in a horizontal direction.

Therefore, technology for overcoming a limitation of miniaturization and integration in a horizontal direction is needed.

Figure 13:
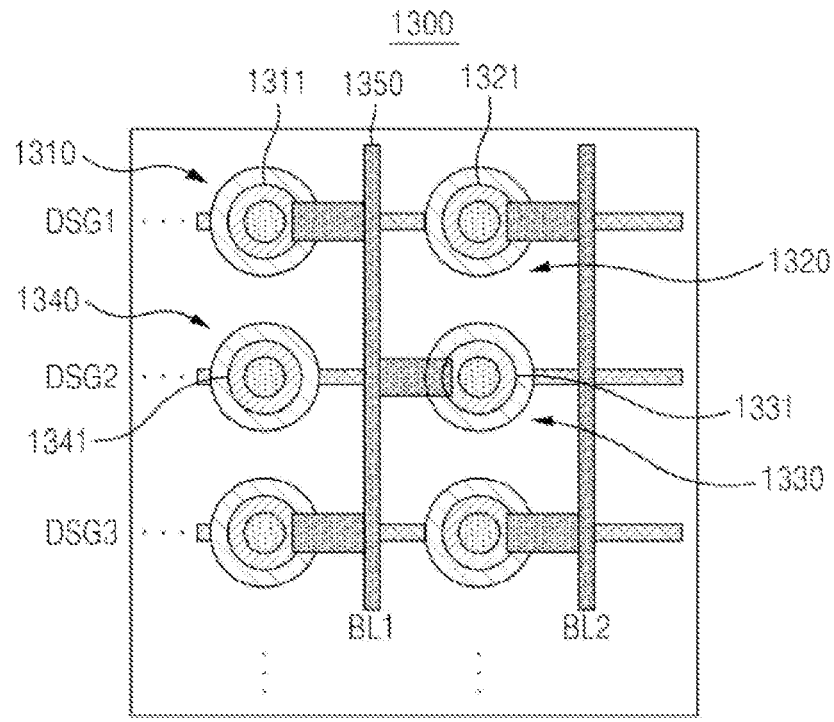
FIG. 13 is a top view illustrating a three-dimensional flash memory having a bit line structure according to an embodiment.

FIG. 13 is a top view illustrating a three-dimensional flash memory having a bit line structure according to an embodiment. In more detail, FIG. 13 is a top view as a three-dimensional flash memory 1300 is seen in the Z-axis direction in FIG. 2.

Referring to FIG. 13, the three-dimensional flash memory 1300 according to an embodiment includes a plurality of strings 1310, 1320, 1330, and 1340 and at least one bit line 1350.

The plurality of strings 1310, 1320, 1330, and 1340 include channel layers 1311, 1321, 1331, and 1341 formed to extend in one direction (for example, the Z-axis direction in FIG. 2), respectively. Each of the plurality of strings 1310, 1320, 1330, and 1340 has the same structure and material as those of the cell string in the three-dimensional flash memory of the related art described above with reference to FIG. 2, and thus, its detailed description is omitted.

The at least one bit line 1350 may be disposed between the plurality of strings 1310, 1320, 1330, and 1340 and on the plurality of strings 1310, 1320, 1330, and 1340 in a direction (for example, a Y-axis direction (hereinafter referred to as a vertical direction) in FIG. 2) perpendicular to one direction. Therefore, the at least one bit line 1350 may be connected to adjacent strings 1310 and 1330 of the plurality of strings 1310, 1320, 1330, and 1340 and may be shared by the adjacent strings 1310 and 1330. Hereinafter, the at least one bit line 1350 being shared by the strings 1310 and 1330 denotes that the at least one bit line 1350 is used in common so that a current flows in a direction from a source to a drain, with respect to the strings 1310 and 1330. For example, the at least one bit line 1350 may be connected to the strings 1310 and 1330 adjacent to each other in a diagonal direction among the plurality of strings 1310, 1320, 1330, and 1340 and may be shared by the adjacent strings 1310 and 1330.

Particularly, the strings 1310 and 1330, which is to be connected to the at least one bit line 1350, of the plurality of strings 1310, 1320, 1330, and 1340 may be determined based on a state where at least one intermediate wiring layer (not shown) included in the three-dimensional flash memory 1300 is connected to the plurality of strings 1310, 1320, 1330, and 1340. This will be described below in detail with reference to FIG. 14.

Here, the at least one intermediate wiring layer (not shown) is a wiring layer which is formed at a middle point in one direction (the Z-axis direction in FIG. 2) of each of the plurality of strings 1310, 1320, 1330, and 1340 and is selectively usable as one of a source electrode or a drain electrode and may be formed to extend in a direction (an X-axis direction in FIG. 2) one-dimensionally perpendicular to a direction (the Y-axis direction in FIG. 2) in which the at least one bit line 1350 is formed.

Figure 14:
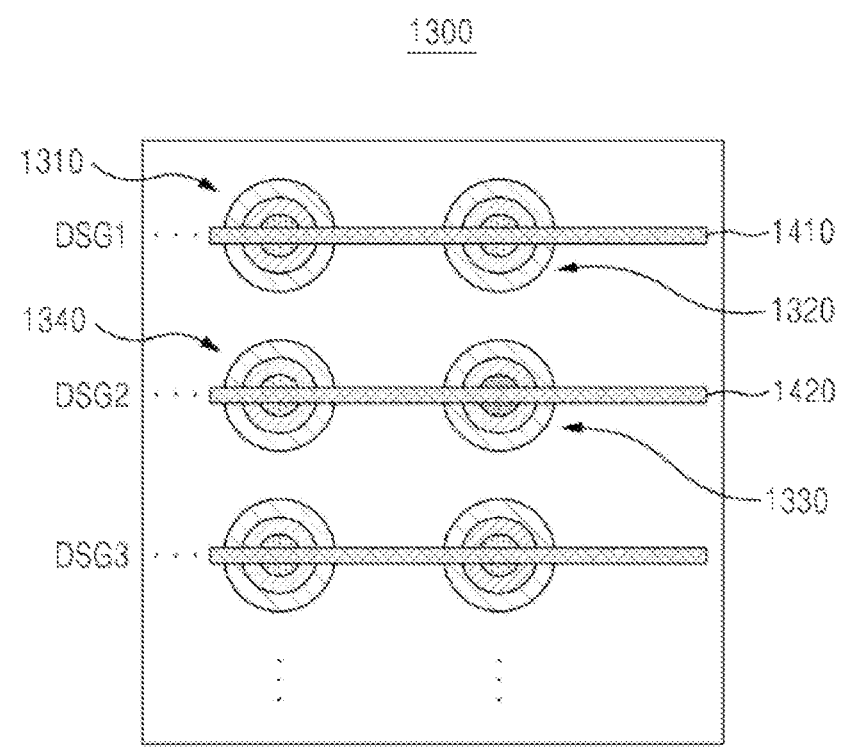
FIG. 14 is a cross-sectional view for describing an intermediate wiring layer structure of the three-dimensional flash memory having a bit line structure illustrated in FIG. 13.

FIG. 14 is a cross-sectional view for describing an intermediate wiring layer structure of the three-dimensional flash memory having the bit line structure illustrated in FIG. 13. In more detail, FIG. 14 illustrates a cross-sectional view at a middle point in the Z-axis direction in FIG. 2, in the three-dimensional flash memory 1300 of FIG. 13.

Referring to FIG. 14, in the three-dimensional flash memory 1300 illustrated in FIG. 13, the at least one bit line 1350 being respectively connected to the strings 1310 and 1330 adjacent to each other in the diagonal direction among the plurality of strings 1310, 1320, 1330, and 1340 is for enabling selective driving of each of the plurality of strings 1310, 1320, 1330, and 1340 in a state where at least one intermediate wiring layer 1410 is connected to the adjacent strings 1310 and 1320 in a horizontal direction as in the drawing. For example, in a state where a first intermediate wiring layer 1410 is connected to a first string 1310 and a second string 1320 adjacent to each other in a horizontal direction and a second intermediate wiring layer 1420 is connected to a third string 1330 and a fourth string 1340 adjacent to each other in a horizontal direction, the at least one bit line 1350 has to be connected to the strings 1310 and 1330 adjacent to each other in the diagonal direction as in FIG. 13, for enabling selective driving of each of the first string 1310, the second string 1320, the third string 1330, and the fourth string 1340.

That is, in a three-dimensional flash memory 1300 according to an embodiment, at least one bit line 1350 may be connected to each of strings 1310 and 1330 adjacent to each other in a specific direction among a plurality of strings 1310, 1320, 1330, and 1340 on the basis of a state where at least one intermediate wiring layers 1410 and 1420 are connected to the plurality of strings 1310, 1320, 1330, and 1340, in order to enable selective driving of each of the plurality of strings 1310, 1320, 1330, and 1340.

Figure 2:
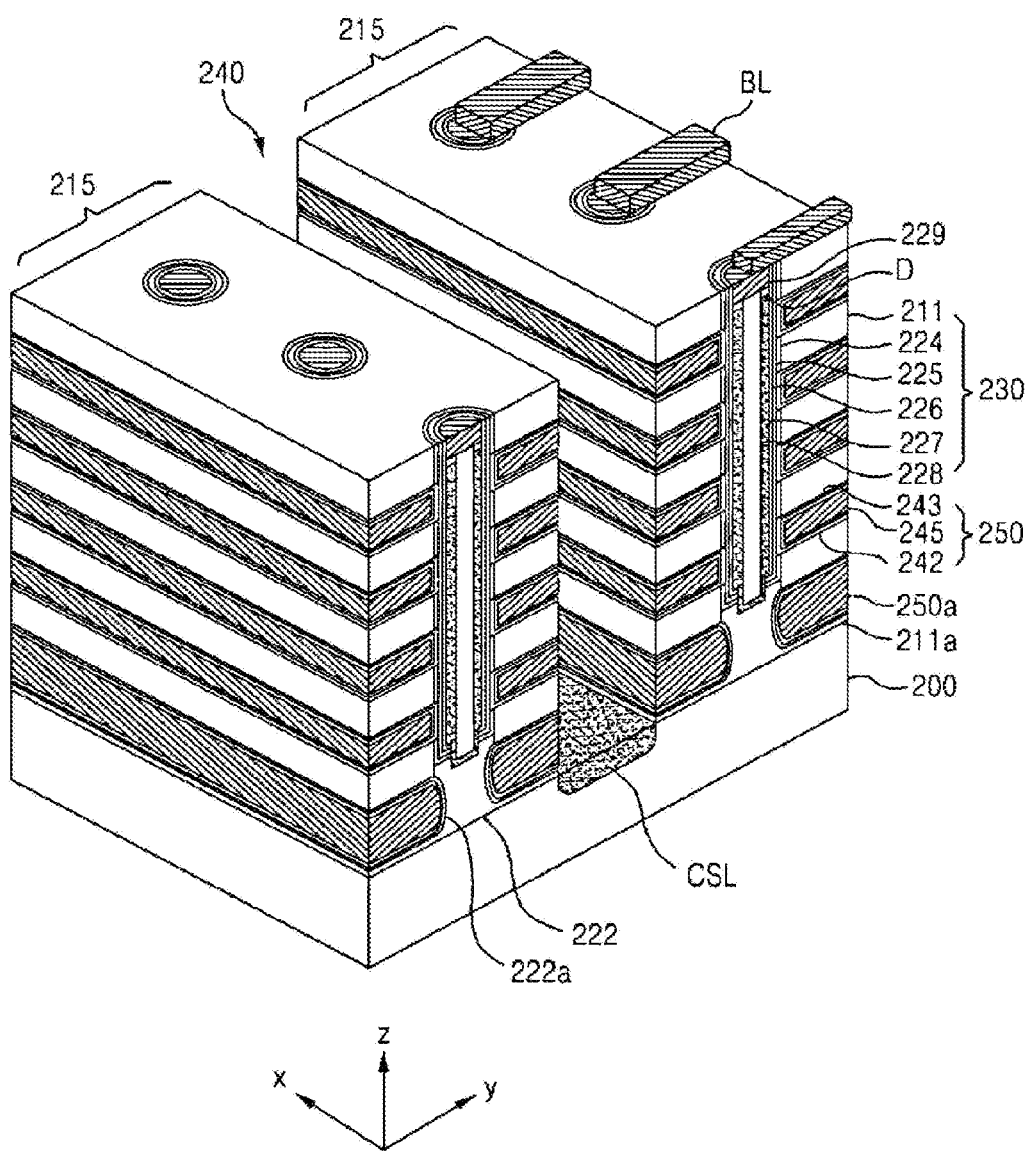
FIG. 2 is a perspective view illustrating a structure of a three-dimensional flash memory of the related art.

Therefore, when the at least one intermediate wiring layer 1410 is connected to the strings 1310 and 1330 adjacent to each other in a diagonal direction among the plurality of strings 1310, 1320, 1330, and 1340, the at least one bit line 1350 may be connected to the strings 1310 and 1320 adjacent to each other in a horizontal direction (the X-axis direction in FIG. 2). An example, where the at least one bit line 1350 is connected to the strings 1310 and 1320 adjacent to each other in the horizontal direction (the X-axis direction in FIG. 2), will be described below in detail with reference to FIGS. 17 and 18.

Hereinabove, it has been described that the at least one bit line 1350 is connected to the strings 1310 and 1320 in a state where the at least one intermediate wiring layer 1410 is connected to the strings 1310 and 1320 adjacent to each other in the horizontal direction, but in a state where the at least one intermediate wiring layer 1410 is connected to the strings 1310 and 1340 adjacent to each other in a vertical direction (the Y-axis direction in FIG. 2), the at least one bit line 1350 may also be connected to the strings 1310 and 1330 adjacent to each other in the diagonal direction among the plurality of strings 1310, 1320, 1330, and 1340.

Figure 15:
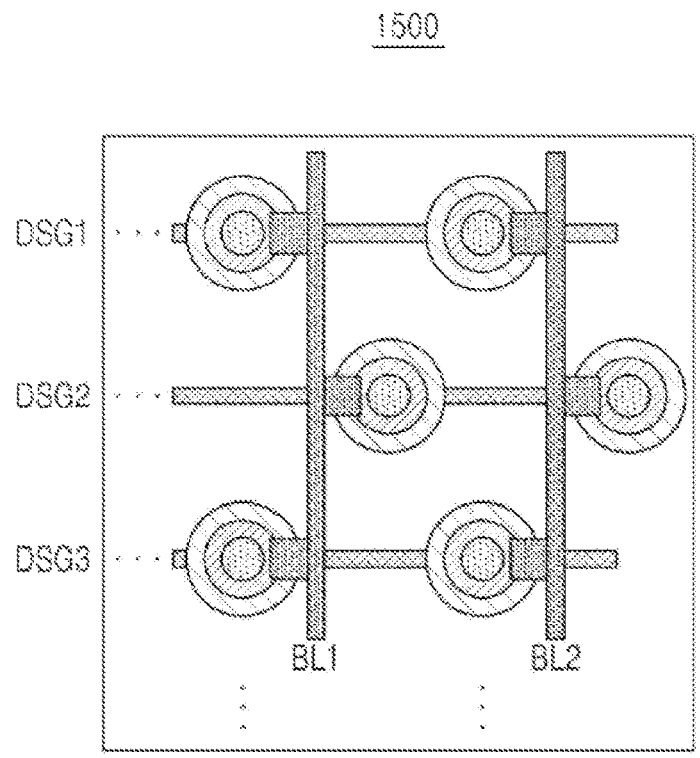
FIGS. 15 and 16 are diagrams illustrating various embodiments to which the bit line structure illustrated in FIG. 13 is applied.
Figure 16:
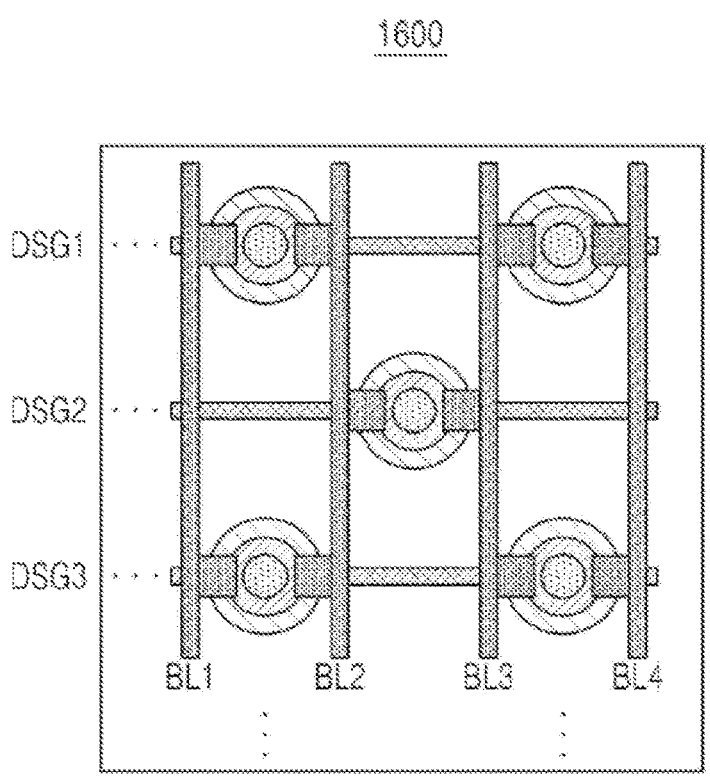

FIGS. 15 and 16 are diagrams illustrating various embodiments to which the bit line structure illustrated in FIG. 13 is applied.

Referring to FIGS. 15 and 16, a three-dimensional flash memory 1300 according to an embodiment is not restricted or limited to that the three-dimensional flash memory 1300 is implemented to have a structure of the at least one bit line 1350 and the plurality of strings 1310, 1320, 1330, and 1340 as illustrated in FIG. 13 and may be variously implemented as in 1500 or 1600. Even when the three-dimensional flash memory 1300 is implemented as in 1500 or 1600, the at least one bit line 1350 has a structure which is shared by adjacent strings 1310 and 1330 of the plurality of strings 1310, 1320, 1330, and 1340.

Figure 17:
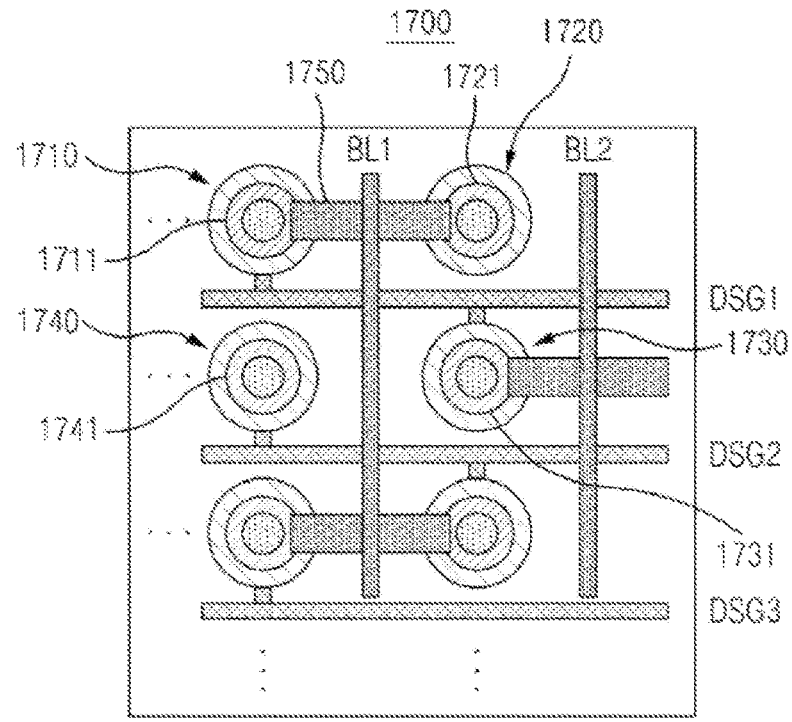
FIG. 17 is a top view illustrating a three-dimensional flash memory having a bit line structure according to another embodiment.

FIG. 17 is a top view illustrating a three-dimensional flash memory having a bit line structure according to another embodiment. In more detail, FIG. 17 is a top view as a three-dimensional flash memory 1700 is seen in the Z-axis direction in FIG. 2.

Referring to FIG. 17, the three-dimensional flash memory 1700 according to another embodiment includes a plurality of strings 1710, 1720, 1730, and 1740 and at least one bit line 1750.

The plurality of strings 1710, 1720, 1730, and 1740 include channel layers 1711, 1721, 1731, and 1741 formed to extend in one direction (for example, the Z-axis direction in FIG. 2), respectively. Each of the plurality of strings 1710, 1720, 1730, and 1740 has the same structure and material as those of the cell string in the three-dimensional flash memory of the related art described above with reference to FIG. 2, and thus, its detailed description is omitted.

The at least one bit line 1750 may be disposed between the plurality of strings 1710, 1720, 1730, and 1740 and on the plurality of strings 1710, 1720, 1730, and 1740 in a direction (for example, the Y-axis direction (hereinafter referred to as a vertical direction) in FIG. 2) perpendicular to one direction. Therefore, the at least one bit line 1750 may be connected to adjacent strings 1710 and 1720 of the plurality of strings 1710, 1720, 1730, and 1740 and may be shared by the adjacent strings 1710 and 1720. For example, the at least one bit line 1750 may be connected to the strings 1710 and 1720 adjacent to each other in a horizontal direction among the plurality of strings 1710, 1720, 1730, and 1740 and may be shared by the strings 1710 and 1720 adjacent to each other in the horizontal direction. In this case, the at least one bit line 1750 is described as being connected to the strings 1710 and 1720 adjacent to each other in the horizontal direction, but may be shared by the strings 1710 and 1740 adjacent to each other in the vertical direction.

Particularly, the strings 1710 and 1720, which is to be connected to the at least one bit line 1750, of the plurality of strings 1710, 1720, 1730, and 1740 may be determined based on a state where at least one intermediate wiring layer (not shown) included in the three-dimensional flash memory 1700 is connected to the plurality of strings 1710, 1720, 1730, and 1740. This will be described below in detail with reference to FIG. 18.

Here, the at least one intermediate wiring layer (not shown) is a wiring layer which is formed at a middle point in one direction (the Z-axis direction in FIG. 2) of each of the plurality of strings 1710, 1720, 1730, and 1740 and is selectively usable as one of a source electrode or a drain electrode and may be formed to extend in a direction (the X-axis direction in FIG. 2) one-dimensionally perpendicular to a direction (the Y-axis direction in FIG. 2) in which the at least one bit line 1750 is formed.

Figure 18:
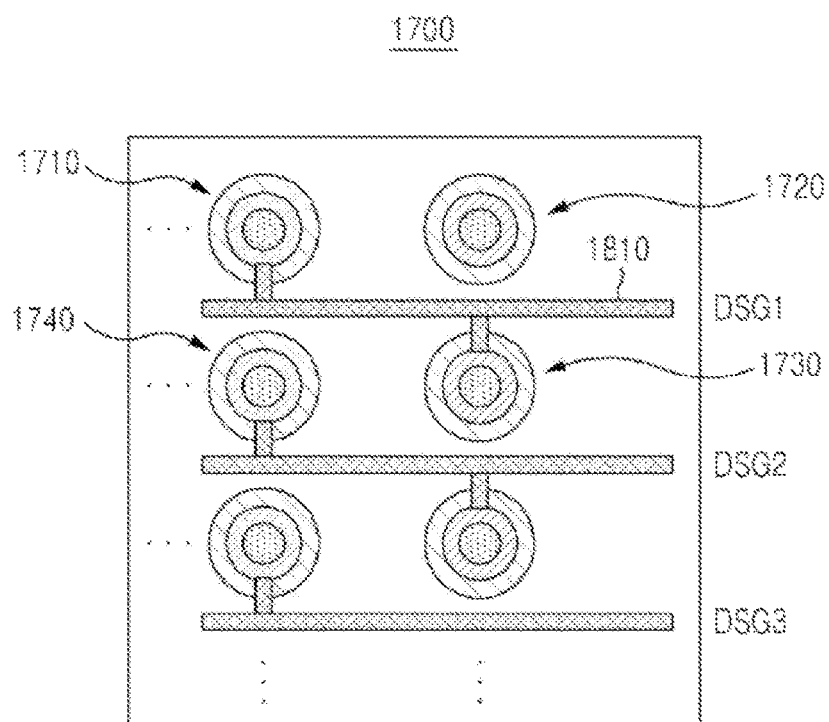
FIG. 18 is a cross-sectional view for describing an intermediate wiring layer structure of the three-dimensional flash memory having a bit line structure illustrated in FIG. 17.

FIG. 18 is a cross-sectional view for describing an intermediate wiring layer structure of the three-dimensional flash memory having the bit line structure illustrated in FIG. 17. In more detail, FIG. 18 illustrates a cross-sectional view at a middle point in the Z-axis direction in FIG. 2, in the three-dimensional flash memory 1700 of FIG. 17.

Referring to FIG. 18, in the three-dimensional flash memory 1700 illustrated in FIG. 17, the at least one bit line 1750 being respectively connected to the strings 1710 and 1720 adjacent to each other in the horizontal direction among the plurality of strings 1710, 1720, 1730, and 1740 is for enabling selective driving of each of the plurality of strings 1710, 1720, 1730, and 1740 in a state where at least one intermediate wiring layer 1810 is connected to the adjacent strings 1710 and 1730 in a diagonal direction as in the drawing. For example, in a state where the intermediate wiring layer 1810 is connected to a first string 1710 and a third string 1730 adjacent to each other in a diagonal direction, the at least one bit line 1750 has to be connected to the strings 1710 and 1720 adjacent to each other in the horizontal direction as in FIG. 17 (or the strings 1710 and 1740 adjacent to each other in a vertical direction), for enabling selective driving of each of the first string 1710, the second string 1720, the third string 1730, and the fourth string 1740.

That is, in the three-dimensional flash memory 1700 according to another embodiment, the at least one bit line 1750 may be connected to each of strings 1710 and 1720 adjacent to each other in a specific direction among the plurality of strings 1710, 1720, 1730, and 1740 on the basis of a state where the at least one intermediate wiring layer 1810 is connected to the plurality of strings 1710, 1720, 1730, and 1740, in order to enable selective driving of each of the plurality of strings 1710, 1720, 1730, and 1740. Hereinabove, it has been described that the at least one bit line 1750 is connected to the strings 1710 and 1720 adjacent to each other in a horizontal direction among the plurality of strings 1710, 1720, 1730, and 1740 as the intermediate wiring layer 1810 is connected to the strings 1710 and 1730 adjacent to each other in a diagonal direction, but the at least one bit line 1750 is not restricted or limited thereto and may be connected to the strings 1710 and 1740 adjacent to each other in a vertical direction.

As described above, a three-dimensional flash memory according to the present invention includes at least one bit line which is connected to and shared by each of strings adjacent to each other in a specific direction among a plurality of strings on the basis of a state where at least one intermediate wiring layer is connected to the plurality of strings, with being disposed between the plurality of strings, and thus, may enable selective driving of each of the plurality of strings and simultaneously may overcome a limitation of miniaturization and integration in a horizontal direction. A method of manufacturing such a three-dimensional flash memory will be described below with reference to FIG. 19.

Figure 19:
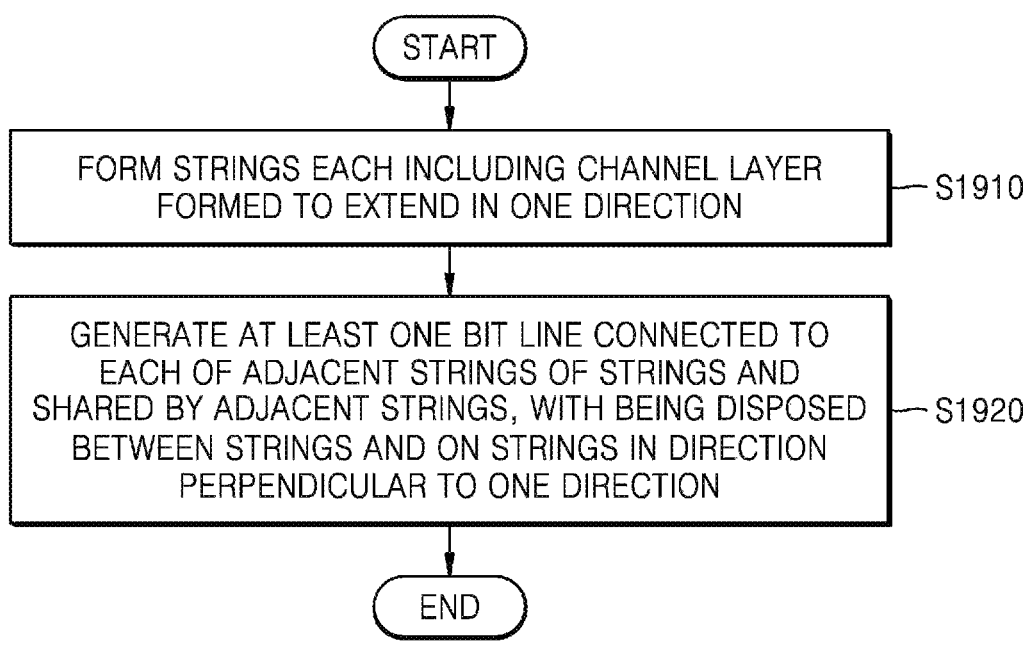
FIG. 19 is a flowchart illustrating a method of manufacturing a three-dimensional flash memory according to an embodiment.

FIG. 19 is a flowchart illustrating a method of manufacturing a three-dimensional flash memory according to an embodiment. Hereinafter, it is assumed that a method of manufacturing a three-dimensional flash memory described with reference to FIG. 19 is performed by an automated and mechanized manufacturing system, and the method denotes a method of manufacturing the three-dimensional flash memories 1300 and 1700 described above with reference to FIGS. 13 to 18.

First, in operation S1910, the manufacturing system forms a plurality of strings each including a channel layer which is formed to extend in one direction.

Subsequently, in operation S1920, the manufacturing system generates at least one bit line shared by adjacent strings respectively connected to adjacent strings among a plurality of strings, with being disposed between the plurality of strings and on the plurality of strings in a direction perpendicular to one direction.

At this time, in operation S1910, the manufacturing system may form at least one intermediate wiring layer, which is selectively usable as one of a source electrode or a drain electrode, at a middle point of each of the plurality of strings in one direction.

Therefore, in operation S1920, the manufacturing system may generate at least one bit line to be connected to each of strings adjacent to each other in a specific direction among the plurality of strings on the basis of a state where the at least one intermediate wiring layer is connected to the plurality of strings, in order to enable selective driving of each of the plurality of strings. For example, when the at least one intermediate wiring layer is connected to strings adjacent to each other in a horizontal direction or a vertical direction among the plurality of strings, the manufacturing system may generate the at least one bit line to be connected to each of strings adjacent to each other in a diagonal direction among the plurality of strings in operation S1920. As another example, when the at least one intermediate wiring layer is connected to strings adjacent to each other in the diagonal direction among the plurality of strings, the manufacturing system may generate the at least one bit line to be connected to each of strings adjacent to each other in the vertical direction or the horizontal direction among the plurality of strings in operation S1920.

Figure 20:
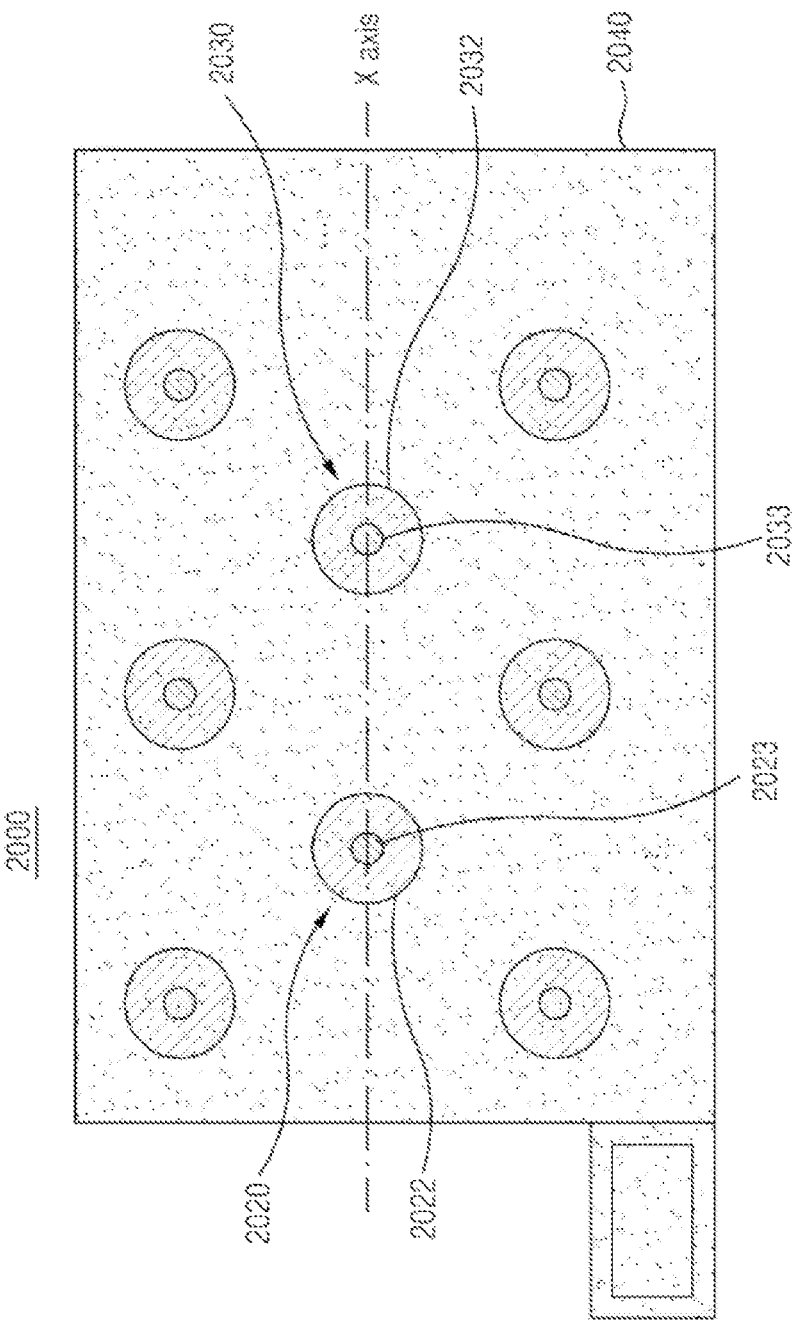
FIG. 20 is a top view with respect to an intermediate wiring layer in a three-dimensional flash memory according to an embodiment.
Figure 21:
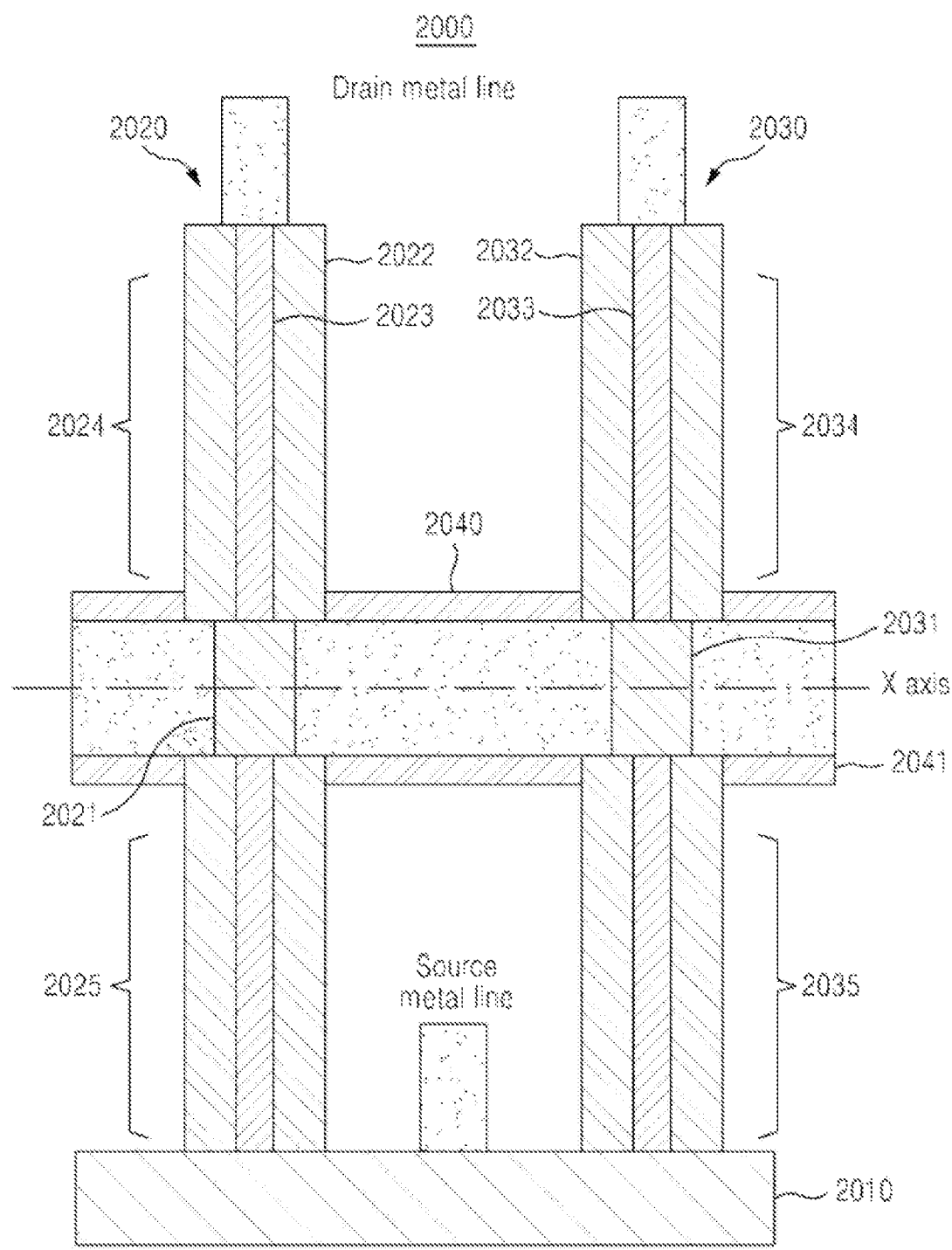
FIG. 21 is a cross-sectional view with respect to an X axis in the three-dimensional flash memory illustrated in FIG. 20.
Figure 22:
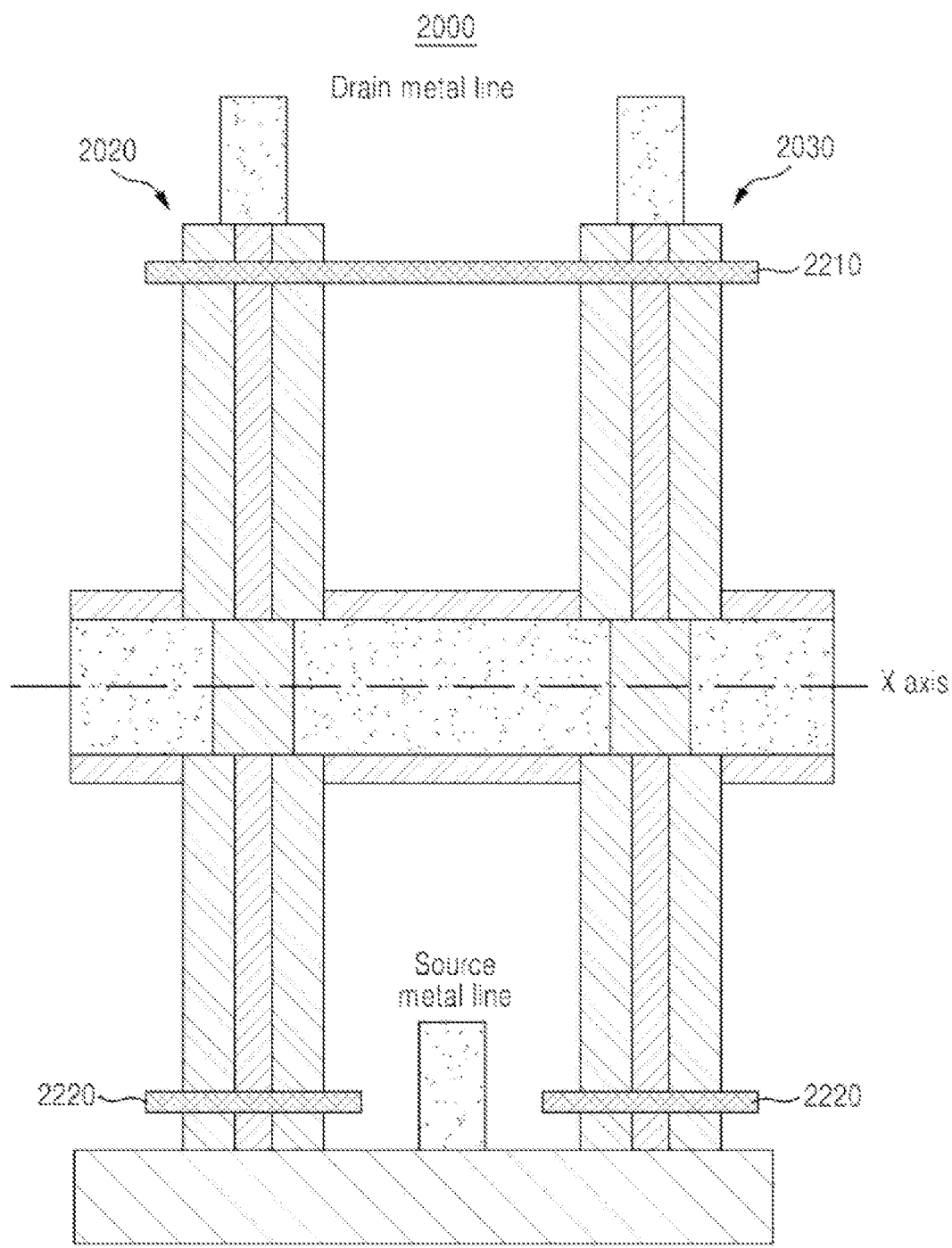
FIG. 22 is a cross-sectional view for describing an arrangement form of an upper selection line (USL) and a lower selection line (LSL) connected to the three-dimensional flash memory illustrated in FIG. 20.
Figure 23:
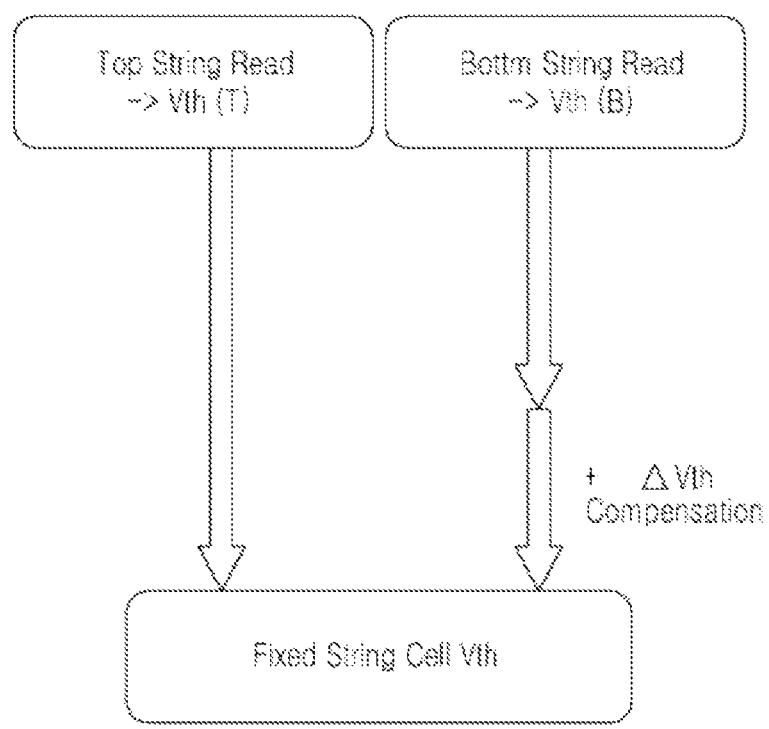
FIG. 23 is a diagram for describing a method of compensating for a cell threshold voltage difference between an upper string and a lower string in the three-dimensional flash memory illustrated in FIG. 20.

FIG. 20 is a top view with respect to an intermediate wiring layer in a three-dimensional flash memory according to an embodiment, FIG. 21 is a cross-sectional view with respect to an X axis in the three-dimensional flash memory illustrated in FIG. 20, FIG. 22 is a cross-sectional view for describing an arrangement form of an upper selection line (USL) and a lower selection line (LSL) connected to the three-dimensional flash memory illustrated in FIG. 20, and FIG. 23 is a diagram for describing a method of compensating for a cell threshold voltage difference between an upper string and a lower string in the three-dimensional flash memory illustrated in FIG. 20.

Referring to FIGS. 20 and 21, a three-dimensional flash memory 2000 according to an embodiment includes a plurality of strings 2020 and 2030 formed to extend in one direction on a substrate 2010, connection portions 2021 and 2031 respectively formed in the plurality of strings 2020 and 2030, and an intermediate wiring layer 2040.

The plurality of strings 2020 and 2030 are described and illustrated as respectively including channel layers 2022 and 2032 extending in one direction, but are not restricted or limited thereto and may also include a plurality of electrode layers (not shown) vertically stacked with respect to the channel layers 2022 and 2032 and a plurality of insulation layers (not shown) each disposed between two adjacent electrode layers of the plurality of electrode layers. Also, the channel layers 2022 and 2032 may be disposed in a hollow tube form, and in this case, buried layers 2023 and 2033 filled into the channel layers 2022 and 2032 may be further disposed.

The connection portions 2021 and 2031 connect upper strings 2024 and 2034 of the plurality of strings 2020 and 2030 to lower strings 2025 and 2035 of the plurality of strings 2020 and 2030 in middle regions of the plurality of strings 2020 and 2030 in a direction in which the plurality of strings 2020 and 2030 are formed to extend, respectively. For example, like the channel layers 2022 and 2032, the connection portions 2021 and 2031 may be formed of an N-type material (for example, N-type polysilicon) through an N-type ion implantation process. However, the connection portions 2021 and 2031 are not restricted or limited thereto and may also be formed of a metal material. As described above, because the connection portions 2021 and 2031 connect the upper strings 2024 and 2034 to the lower strings 2025 and 2035 in the middle regions of the strings 2020 and 2030, all of the channel layers 2022 and 2032 included in the upper strings 2024 and 2034 and the channel layers 2022 and 2032 included in the lower strings 2025 and 2035 may be connected to the substrate 2010, and thus, a bulk-based erase operation may be performed.

The intermediate wiring layer 2040 may be selectively used as one of a source electrode or a drain electrode corresponding to each of the plurality of strings 2020 and 2030, with being formed to surround the respective connection portions 2021 and 2031 of the plurality of strings 2020 and 2030. In more detail, the intermediate wiring layer 2040 may be formed in a plate shape so as to be shared by each of the plurality of strings 2020 and 2030, and thus, a wiring process may be simplified. Hereinafter, the intermediate wiring layer 2040 being shared between the plurality of strings 2020 and 2030 denotes that the intermediate wiring layer 2040 is used as a source electrode with respect to a first string 2020 of the plurality of strings 2020 and 2030, and simultaneously, is used as a source electrode with respect to a second string 2030. To this end, the intermediate wiring layer 2040 may be connected to the connection portion 2021 of the first string 2020 and simultaneously may be connected to the connection portion 2031 of the second string 2030. For example, the intermediate wiring layer 2040 may be formed of a metal material (for example, at least one of tungsten (W), titanium (Ti), tantalum (Ta), copper (Cu), or gold (Au)) in a plate shape so as to be usable as one of a source electrode or a drain electrode corresponding to each of the plurality of strings 2020 and 2030.

As an operation example of the intermediate wiring layer 2040 based on an operation of each of the plurality of strings 2020 and 2030, when a read operation is performed on each of the plurality of strings 2020 and 2030, the intermediate wiring layer 2040 may be used as a source electrode, and when a program operation and an erase operation are performed, the intermediate wiring layer 2040 may maintain a floating state.

Also, although not shown in the drawing, the intermediate wiring layer 2040 may be implemented in plurality. In this case, a plurality of intermediate wiring layers may be sequentially disposed apart from one another in one direction in which the plurality of strings 2020 and 2030 are formed to extend.

Also, as in the drawing, an upper portion and a lower portion of the intermediate wiring layer 2040 may be surrounded by an insulation layer 2041 disposed thereon and thereunder.

Particularly, the intermediate wiring layer 2040 may be formed in the middle region of each of the plurality of strings 2020 and 2030.

In this case, because the intermediate wiring layer 2040 is formed as one wiring plate, an abnormal operation may occur in an unselected memory cell except a selected memory cell in the plurality of strings 2020 and 2030. In order to prevent such a problem, in the three-dimensional flash memory 2000 according to an embodiment, as illustrated in FIG. 22, a plurality of upper selection lines (USL) 2210 and a plurality of lower selection lines (LSL) 2220 connected to the plurality of strings 2020 and 2030 are formed to extend in a direction perpendicular to each other in terms of a plane. That is, a plurality of upper selection lines among the plurality of upper selection lines 2210 may be formed to extend in an X-axis direction in order at a rear portion which is not shown in the drawing, and a plurality of lower selection lines among the plurality of lower selection lines 2220 may be formed to extend in a Y-axis direction as illustrated in the drawing. Hereinafter, in the three-dimensional flash memory 2000, a memory cell denotes a charge storage layer which is an information storage element and an electrode layer directly contacting the charge storage layer.

In the three-dimensional flash memory 2000 having such a structure, in a read operation performed on a memory cell, the upper strings 2024 and 2034 use the intermediate wiring layer 2040 as a source electrode and the lower strings 2025 and 2035 use a wiring layer (not shown), disposed on a substrate 2010, as a source electrode. Therefore, in a case where a read operation is performed on a memory cell included in the lower strings 2025 and 2035, as a resistance of a drain terminal occurs due to lengths of the upper strings 2024 and 2034, a cell current may be reduced, and due to this, a cell threshold voltage difference between the upper strings 2024 and 2034 and the lower strings 2025 and 2035 may occur. In order to solve such a problem, as illustrated in FIG. 23, the three-dimensional flash memory 2000 according to an embodiment may apply a read voltage, having a value to which a compensation voltage value is added, to the respective lower strings 2025 and 2035 of the plurality of strings 2020 and 2030, and thus, may compensate for a cell threshold voltage difference between the respective upper strings 2024 and 2034 and lower strings 2025 and 2035 of the plurality of strings 2020 and 2030.

As described above, the three-dimensional flash memory 2000 according to an embodiment may include the intermediate wiring layer 2040 having a plate shape formed to surround the connection portions 2021 and 2031 connecting the upper strings 2024 and 2034 to the lower strings 2025 and 2035 in each of the plurality of strings 2020 and 2030, and thus, may increase a cell current which is reduced as lengths of the channel layers 2022 and 2032 increase, decrease a degradation in cell characteristic caused by a reduction in a cell current, support a bulk erase operation based on a bulk of the substrate 2010, enhance the degree of integration, and simplify a wiring process.

Figure 24:
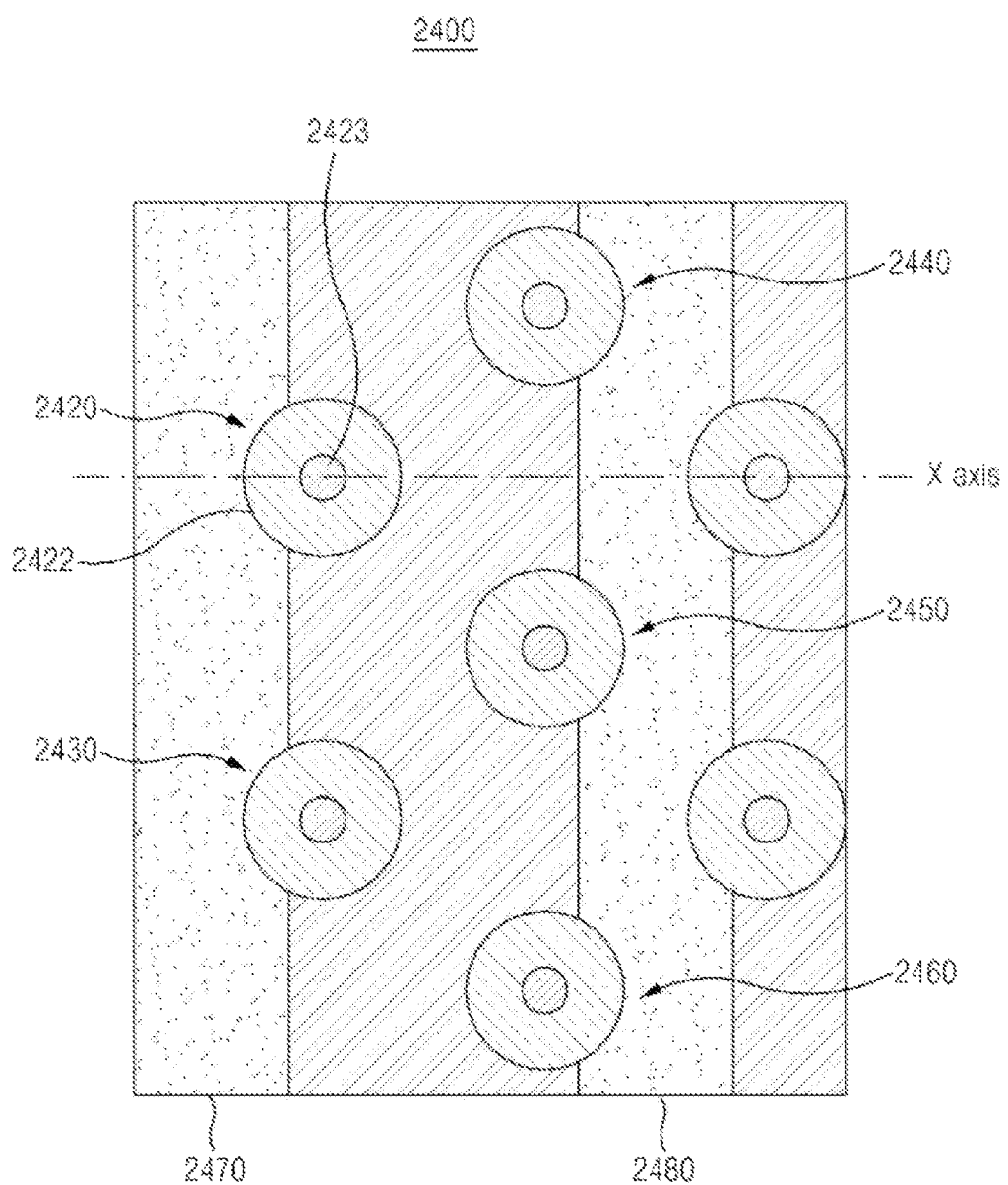
FIG. 24 is a top view with respect to at least one intermediate wiring layer in a three-dimensional flash memory according to another embodiment.
Figure 25:
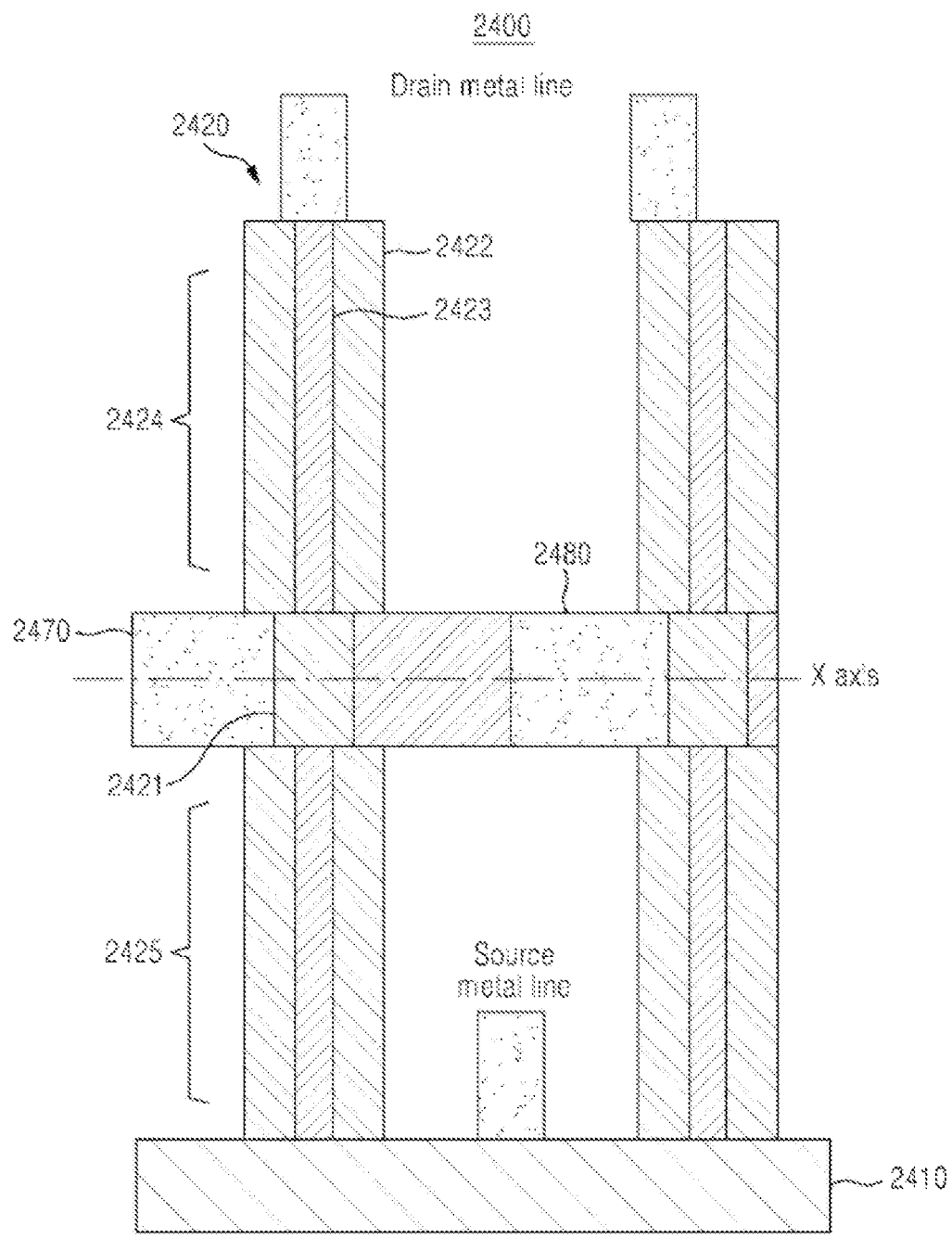
FIG. 25 is a cross-sectional view with respect to an X axis in the three-dimensional flash memory illustrated in FIG. 24.

FIG. 24 is a top view with respect to at least one intermediate wiring layer in a three-dimensional flash memory according to another embodiment, and FIG. 25 is a cross-sectional view with respect to an X axis in the three-dimensional flash memory illustrated in FIG. 24.

Referring to FIGS. 24 and 25, a three-dimensional flash memory 2400 according to another embodiment includes a plurality of strings 2420, 2430, 2440, 2450, and 2460 formed to extend in one direction on a substrate 2410, a connection portion formed in each of the plurality of strings 2420, 2430, 2440, 2450, and 2460, and at least one intermediate wiring layers 2470 and 2480.

Each of the plurality of strings 2420, 2430, 2440, 2450, and 2460 is described and illustrated as respectively including a channel layer 2422 extending in one direction, but is not restricted or limited thereto and may also include a plurality of electrode layers (not shown) vertically stacked with respect to the channel layer 2422 and a plurality of insulation layers (not shown) each disposed between two adjacent electrode layers of the plurality of electrode layers, in addition to the channel layer 2422. Also, the channel layer 2422 may be disposed in a hollow tube form, and in this case, a buried layer 2423 filled into the channel layer 2422 may be further disposed.

The connection portion 2421 connects an upper string 2424 of each of the plurality of strings 2420, 2430, 2440, 2450, and 2460 to a lower string 2425 of the plurality of strings 2420, 2430, 2440, 2450, and 2460 in a middle region of each of the plurality of strings 2420, 2430, 2440, 2450, and 2460 in a direction in which each of the plurality of strings 2420, 2430, 2440, 2450, and 2460 is formed to extend. For example, like the channel layer 2422, the connection portion 2421 may be formed of an N-type material (for example, N-type polysilicon) through an N-type ion implantation process. However, the connection portion 2421 is not restricted or limited thereto and may also be formed of a metal material. As described above, because the connection portion 2421 connects the upper string 2424 to the lower string 2425 in the middle regions of the strings 2420, 2430, 2440, 2450, and 2460, all of a channel layer 722 included in the upper string 2424 and a channel layer 722 included in the lower string 725 may be connected to the substrate 2410, and thus, a bulk-based erase operation may be performed.

The at least one intermediate wiring layers 2470 and 2480 may be formed in a state where at least a portion thereof is buried into each of the plurality of strings 2420, 2430, 2440, 2450, and 2460 to contact the connection portion of each of the plurality of strings 2420, 2430, 2440, 2450, and 2460 and may be selectively used as one of a source electrode or a drain electrode corresponding to each of the plurality of strings 2420, 2430, 2440, 2450, and 2460.

In more detail, in a case where an upper wiring layer (not shown) included in the three-dimensional flash memory 2400 is used as a source electrode, the intermediate wiring layers 2470 and 2480 closest to the upper wiring layer with a memory cell to be controlled therebetween may be used as a drain electrode, and in a case where the upper wiring layer is used as a drain electrode, the intermediate wiring layers 2470 and 2480 closest to the upper wiring layer with a memory cell to be controlled therebetween may be used as a source electrode.

In this case, the at least one intermediate wiring layers 2470 and 2480 may be formed in a line shape so as to be shared by each of the strings 2420 and 2430 and 2440, 2450, and 2460 arranged in one row among the plurality of strings 2420, 2430, 2440, 2450, and 2460. For example, a first intermediate wiring layer 2470 may be connected to contact a connection portion 2421 of the strings 2420 and 2430 arranged in one row among the plurality of strings 2420, 2430, 2440, 2450, and 2460 and may be shared by the strings 2420 and 2430, and a second intermediate wiring layer 2480 may be connected to contact a connection portion 2421 of the strings 2440, 2450, and 2460 arranged in one row among the plurality of strings 2420, 2430, 2440, 2450, and 2460 and may be shared by the strings 2440, 2450, and 2460. Hereinafter, the at least one intermediate wiring layers 2470 and 2480 being shared by each of a plurality of strings 2420 and 2430 and 2440, 2450, and 2460 arranged in one row denotes that the first intermediate wiring layer 2470 is used as a source electrode with respect to a first string 2420 of the strings 2420 and 2430 arranged in one row, and simultaneously, is used as a source electrode with respect to a second string 2430. To this end, the intermediate wiring layer 2470 may be connected to the connection portion 2421 of the first string 2420 and simultaneously may be connected to a connection portion of the second string 2430. For example, the at least one intermediate wiring layers 2470 and 2480 may be formed of a metal material (for example, at least one of tungsten (W), titanium (Ti), tantalum (Ta), copper (Cu), or gold (Au)) in a line shape so as to be selectively usable as one of a source electrode or a drain electrode corresponding to each of the strings 2420 and 2430 and 2440, 2450, and 2460 arranged in one row.

Like the three-dimensional flash memory 2000 described above with reference to FIGS. 20 and 21, in the three-dimensional flash memory 2400 according to another embodiment, the at least one intermediate wiring layers 2470 and 2480 may be implemented in plurality in one direction in which each of the plurality of strings 2420, 2430, 2440, 2450, and 2460 is formed to extend. In this case, a plurality of intermediate wiring layers implemented in one direction in which each of the plurality of strings 2420, 2430, 2440, 2450, and 2460 is formed to extend may be disposed apart from one another in order in one direction (a vertical direction) in which each of the plurality of strings 2420, 2430, 2440, 2450, and 2460 is formed to extend.

For example, when an upper intermediate wiring layer and a lower intermediate wiring layer are implemented in a vertical direction in a first string 2420, the upper intermediate wiring layer may be used as a drain electrode, and thus, the lower intermediate wiring layer closest to the upper intermediate wiring layer with a memory cell to be controlled therebetween may be used as a source electrode. On the other hand, the upper intermediate wiring layer may be used as a source electrode, and thus, the lower intermediate wiring layer closest to the upper intermediate wiring layer with a memory cell to be controlled therebetween may be used as a drain electrode.

That is, the at least one intermediate wiring layers 2470 and 2480 may be adaptively used as one other electrode except one electrode used, in response to that another wiring layer adjacent thereto with a memory cell, which is to be controlled, therebetween in a vertical direction is used as one of a source electrode or a drain electrode. Hereinafter, one wiring layer being used as a drain electrode or used as a source electrode depending on the case denotes that a corresponding wiring layer is formed to be reconfigurable so as to adaptively used as one of a source electrode or a drain electrode. Therefore, the at least one intermediate wiring layers 2470 and 2480 may be formed to be reconfigurable.

Also, an upper portion and a lower portion of each of the at least one intermediate wiring layers 2470 and 2480 may be surrounded by an insulation layer (not shown) disposed thereon and thereunder, and moreover, the at least one intermediate wiring layers 2470 and 2480 may be implemented in a structure where upper, lower, left, and right portions of each of the at least one intermediate wiring layers 2470 and 2480 are surrounded by the insulation layer, whereby the at least one intermediate wiring layers 2470 and 2480 may be connected to a connection portion of each of the plurality of strings 2420, 2430, 2440, 2450, and 2460 through the insulation layer surrounding the upper, lower, left, and right portions of each of the at least one intermediate wiring layers 2470 and 2480.

Particularly, the at least one intermediate wiring layers 2470 and 2480 may be formed in the middle region of each of the plurality of strings 2420, 2430, 2440, 2450, and 2460.

In this case, because an intermediate wiring layer 2440 is formed in a wiring line shape, an abnormal operation does not occur in an unselected memory cell except a selected memory cell in a plurality of strings 2420 and 2430, and thus, a plurality of upper selection lines (USL) and a plurality of lower selection lines (LSL) connected to the plurality of strings 2420, 2430, 2440, 2450, and 2460 may be formed to extend in the same direction in terms of a plane.

In the three-dimensional flash memory 2400 having such a structure, in a case where the upper string 2424 uses the intermediate wiring layer 2470 as a source electrode and the lower string 2425 uses a wiring layer (not shown), disposed on the substrate 2410, as a source electrode in a read operation performed on a memory cell, when a read operation is performed on a memory cell included in the lower string 2425, as a resistance of a drain terminal occurs due to a length of the upper string 2424, a cell current may be reduced, and due to this, a cell threshold voltage difference between the upper string 2424 and the lower string 2425 may occur. In order to solve such a problem, as illustrated in FIG. 23, the three-dimensional flash memory 2400 according to another embodiment may apply a read voltage, having a value to which a compensation voltage value is added, to the lower string 2425 of each of the plurality of strings 2420, 2430, 2440, 2450, and 2460, and thus, may compensate for a cell threshold voltage difference between the upper string 2424 and the lower string 2425 of each of the plurality of strings 2420, 2430, 2440, 2450, and 2460.

As described above, the three-dimensional flash memory 2400 according to an embodiment may include the at least one intermediate wiring layers 2470 and 2480 having a line shape, which are formed with being buried into each of the plurality of strings 2420, 2430, 2440, 2450, and 2460, and thus, may increase a cell current which is reduced as a length of the channel layer 2422 increase, decrease a degradation in cell characteristic caused by a reduction in a cell current, support a bulk erase operation based on a bulk of the substrate 2410, enhance the degree of integration, and simplify a wiring process.

Also, the three-dimensional flash memory 2400 described above may have a structure illustrated with reference to FIGS. 24 to 25 and a modified structure. This will be described below in detail with reference to FIGS. 26A to 26B.

Figure 26A:
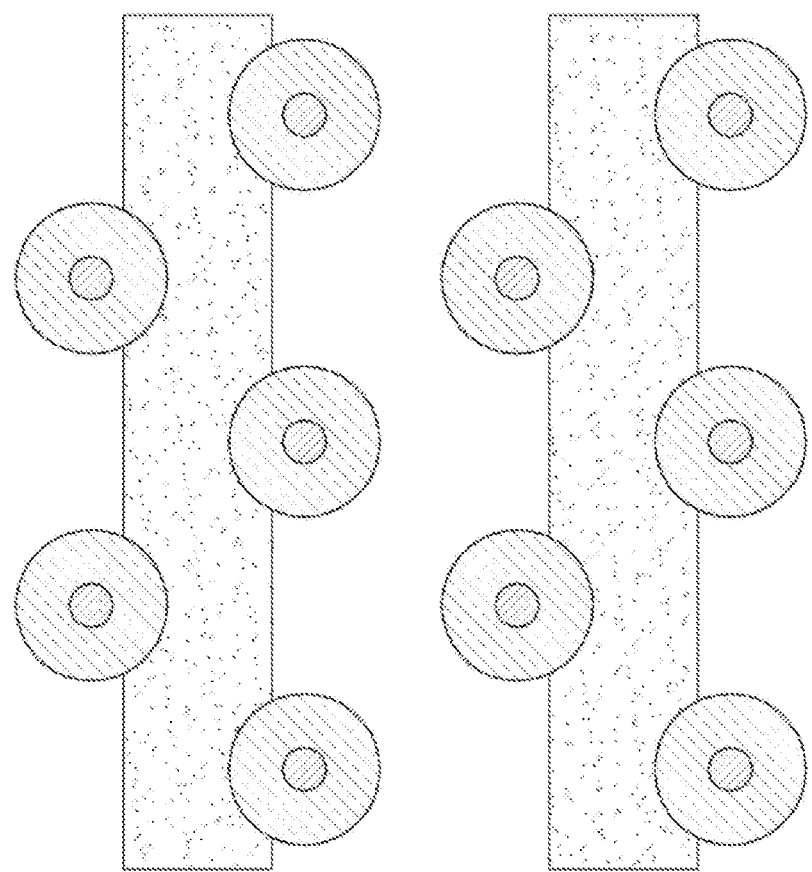
FIGS. 26A and 26B are diagrams for describing various implementation embodiments of the three-dimensional flash memory illustrated in FIG. 24.
Figure 26B:
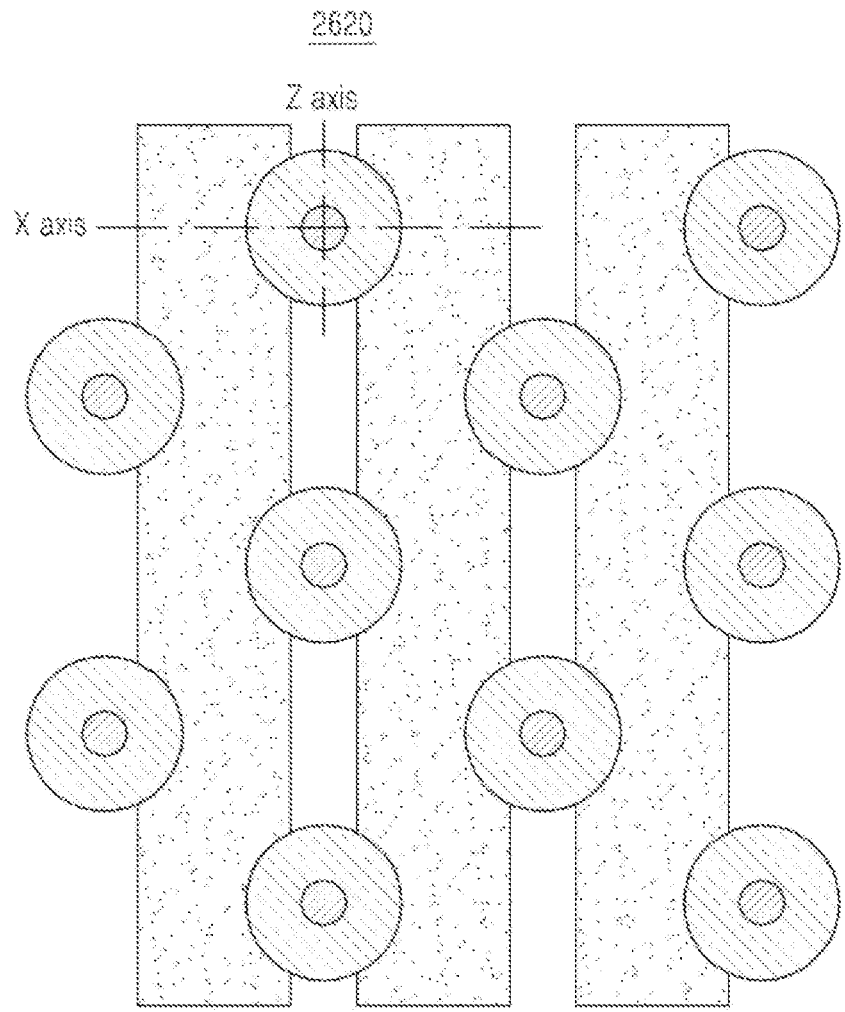

FIGS. 26A and 26B are diagrams for describing various implementation embodiments of the three-dimensional flash memory illustrated in FIG. 24.

Referring to FIGS. 26A and 26B, three-dimensional flash memories 2610 and 2620 may be implemented to have various structures under a condition where at least one intermediate wiring layer is formed in a state where at least a portion thereof is buried into each of a plurality of strings to contact a connection portion of each of the plurality of strings and is shared by each of strings arranged in one row among the plurality of strings. However, the three-dimensional flash memories 2610 and 2620 according to another embodiment are not restricted or limited to an embodiment illustrated in the drawing.

Figure 27A:
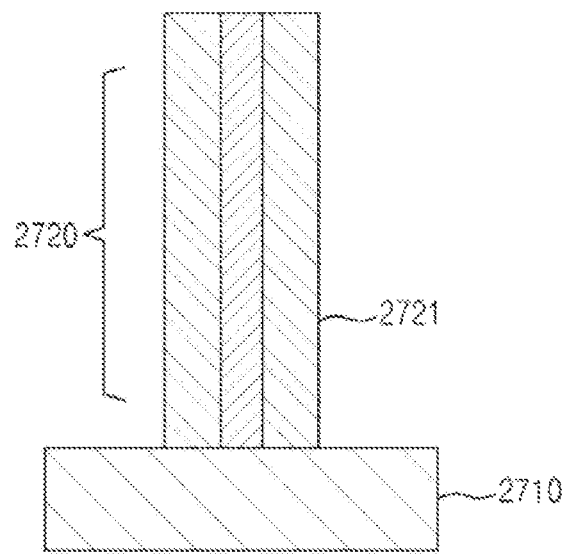
FIGS. 27A to 27H are diagrams for describing a method of manufacturing the three-dimensional flash memory illustrated in FIG. 26B.
Figure 27B:
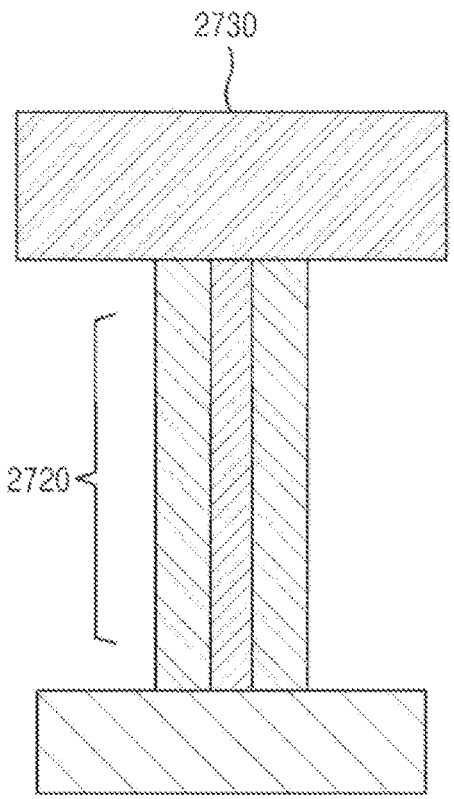
Figure 27C:
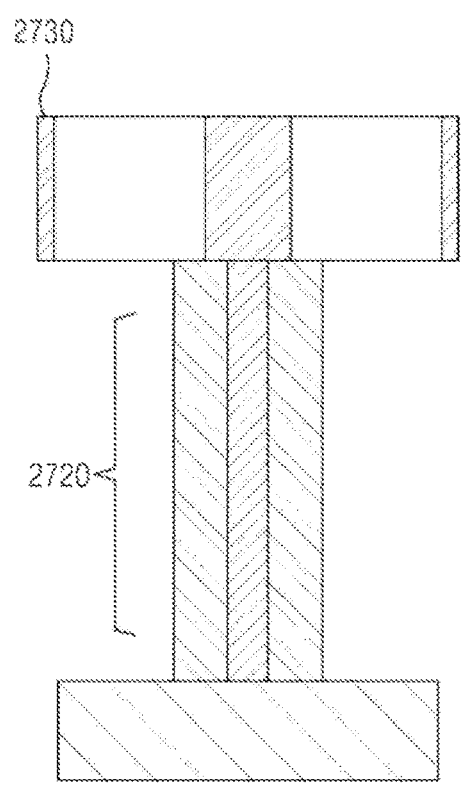
Figure 27D:
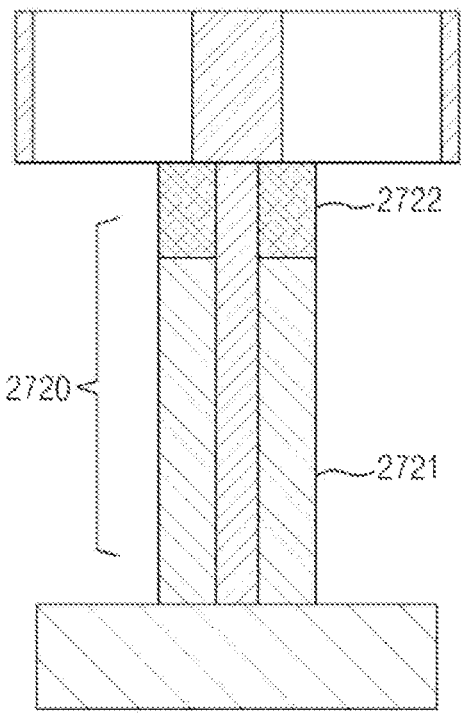
Figure 27E:
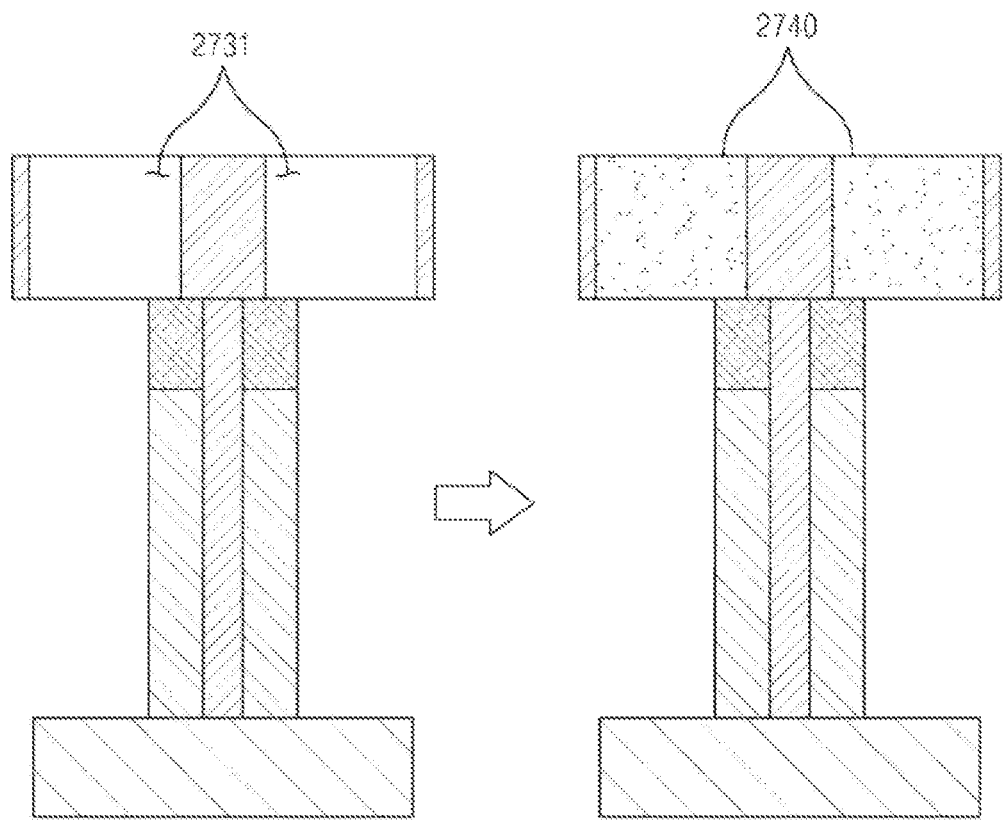
Figure 27F:
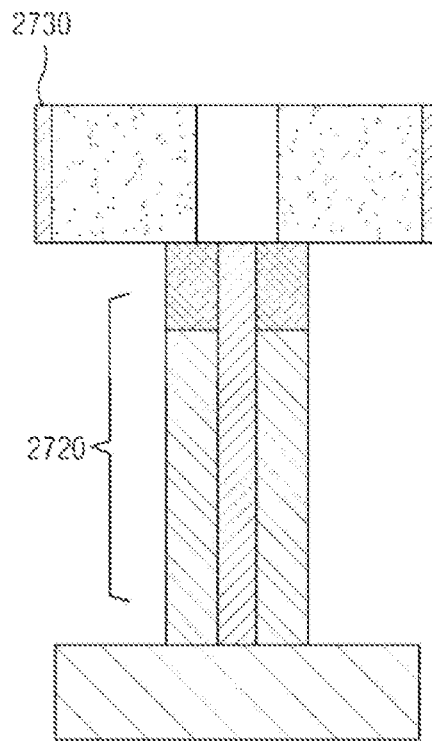
Figure 27G:
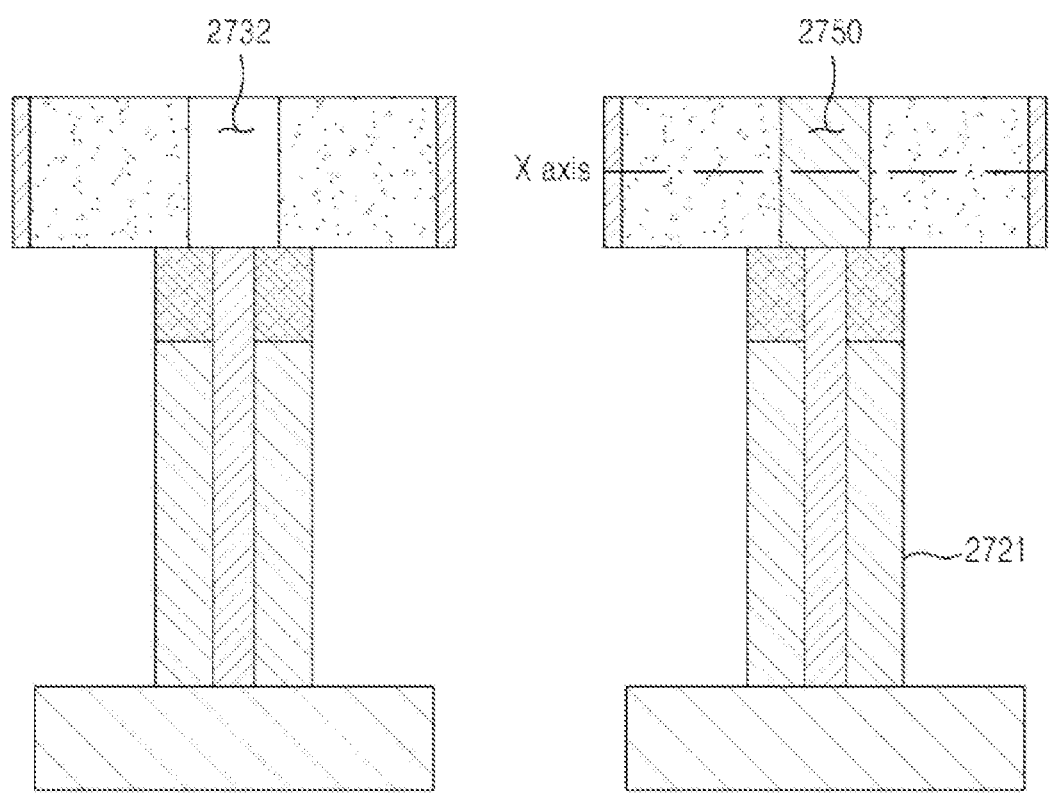
Figure 27H:
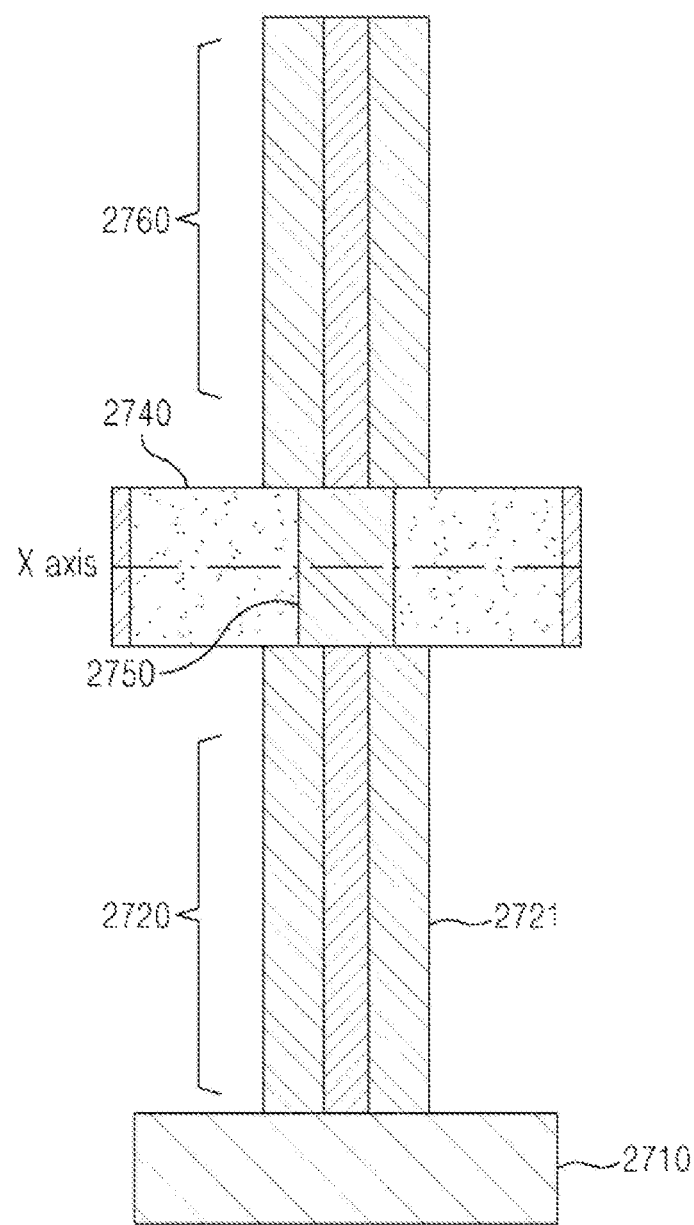
Figure 27I:
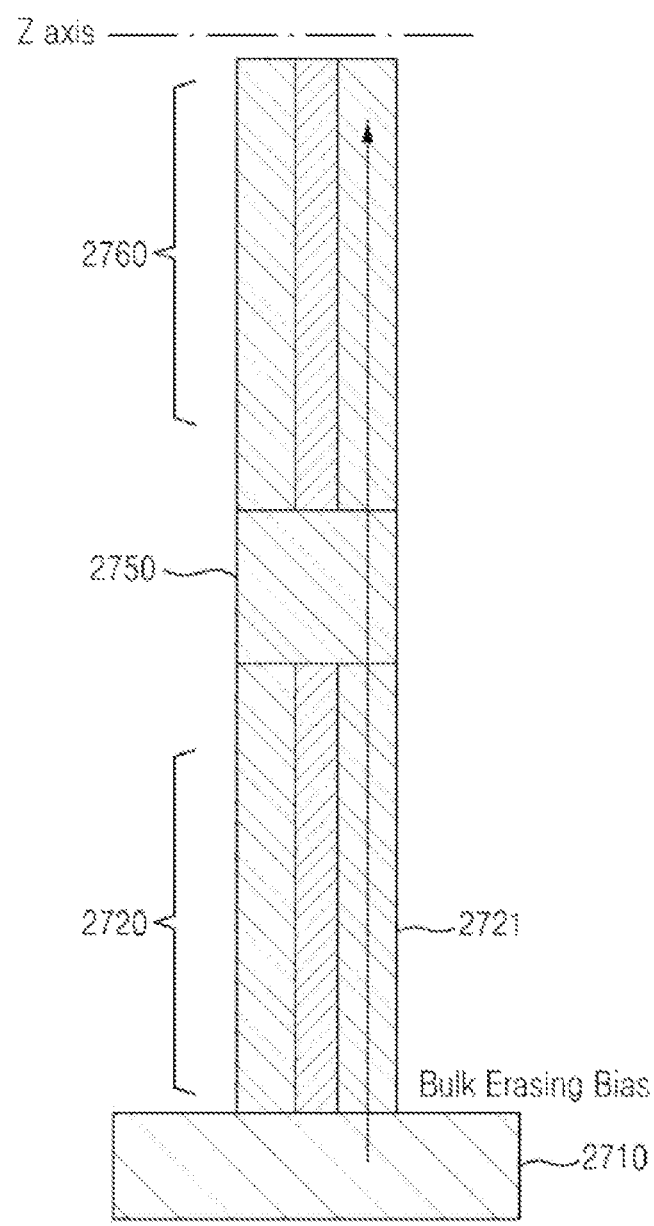
FIG. 27I is a cross-sectional view taken in a Z-axis direction with respect to a string of the three-dimensional flash memory illustrated in FIG. 26B.

FIGS. 27A to 27H are diagrams for describing a method of manufacturing a three-dimensional flash memory illustrated in FIG. 26B, and FIG. 27I is a cross-sectional view taken in a Z-axis direction with respect to a string of the three-dimensional flash memory illustrated in FIG. 26B. However, the present invention is not restricted or limited thereto, and a method of manufacturing a three-dimensional flash memory (for example, the three-dimensional flash memory described above with reference to FIG. 24), implemented in various structures under a condition where at least one intermediate wiring layer is formed in a state where at least a portion thereof is buried into each of a plurality of strings to contact a connection portion of each of the plurality of strings and is shared by each of strings arranged in one row among the plurality of strings, may also be performed through the same processes. A method of manufacturing a three-dimensional flash memory described below may be performed by an automated and mechanized manufacturing system.

Also, hereinafter, the cross-sectional views of FIGS. 27A to 27H denote cross-sectional views taken in an X-axis direction with respect to the strings illustrated in FIG. 26B for describing a method of manufacturing a three-dimensional flash memory.

First, as in FIG. 27A, the manufacturing system forms a lower string 2720 to extend in one direction on a substrate 2710. In this case, the lower string 2720 may be formed to include a channel layer 2721 which is formed to extend in one direction.

Subsequently, as in FIG. 27B, the manufacturing system generates an insulation layer 2730 on the lower string 2720.

Subsequently, as in FIG. 27C, the manufacturing system etches an edge, other than a center, of the insulation layer 2730 which is arranged on the lower string 2720.

Subsequently, as in FIG. 27E, the manufacturing system forms at least one intermediate wiring layer 2740 in an etched edge space 2731. At this time, before forming the at least one intermediate wiring layer 2740, as in FIG. 27D, the manufacturing system may form, through an N+-type ion implantation process, an N+-type region 2722 in a region, contacting a region where the at least one intermediate wiring layer 2740 is to be formed, of a channel layer 2721 of the lower string 2720.

Subsequently, as in FIG. 27F, the manufacturing system etches a center of the insulation layer 2730 which is arranged on the lower string 2720.

Subsequently, as in FIG. 27G, the manufacturing system forms a connection portion 2750 in an etched center space 2732. Here, like the channel layer 2721, the connection portion 2750 may be formed of an N-type material (for example, N-type polysilicon) through an N-type ion implantation process.

Subsequently, as in FIG. 27H, the manufacturing system extends and forms an upper string 2760 in one direction on the connection portion 2750.

In a three-dimensional flash memory formed through such processes, the at least one intermediate wiring layer 2740 may be formed in a line shape to contact a connection portion between the upper string 2760 and the lower string 2720 buried into the strings 2720 and 2760, thereby accomplishing an effect of increasing a cell current which is reduced as a length of a channel layer increases, decreasing a degradation in cell characteristic caused by a reduction in a cell current, enhancing the degree of integration, and simplifying a wiring process.

Also, the three-dimensional flash memory 2620 manufactured through such processes may perform an erase operation based on a bulk of the substrate 2710 on the basis of a bulk erase bias applied in an upward direction from the bulk of the substrate 2710 as in FIG. 27I illustrating a cross-sectional view taken in a Z-axis direction with respect to the string of the three-dimensional flash memory 2620 illustrated in FIG. 26B.

Hereinabove, a method of manufacturing the three-dimensional flash memory 2620 illustrated in FIG. 26B has been described, but a method of manufacturing the three-dimensional flash memory 2000 described above with reference to FIGS. 20 and 21 and a method of manufacturing a three-dimensional flash memory described below with reference to FIG. 28 may also be performed through similar processes by using the same principle.

Figure 28:
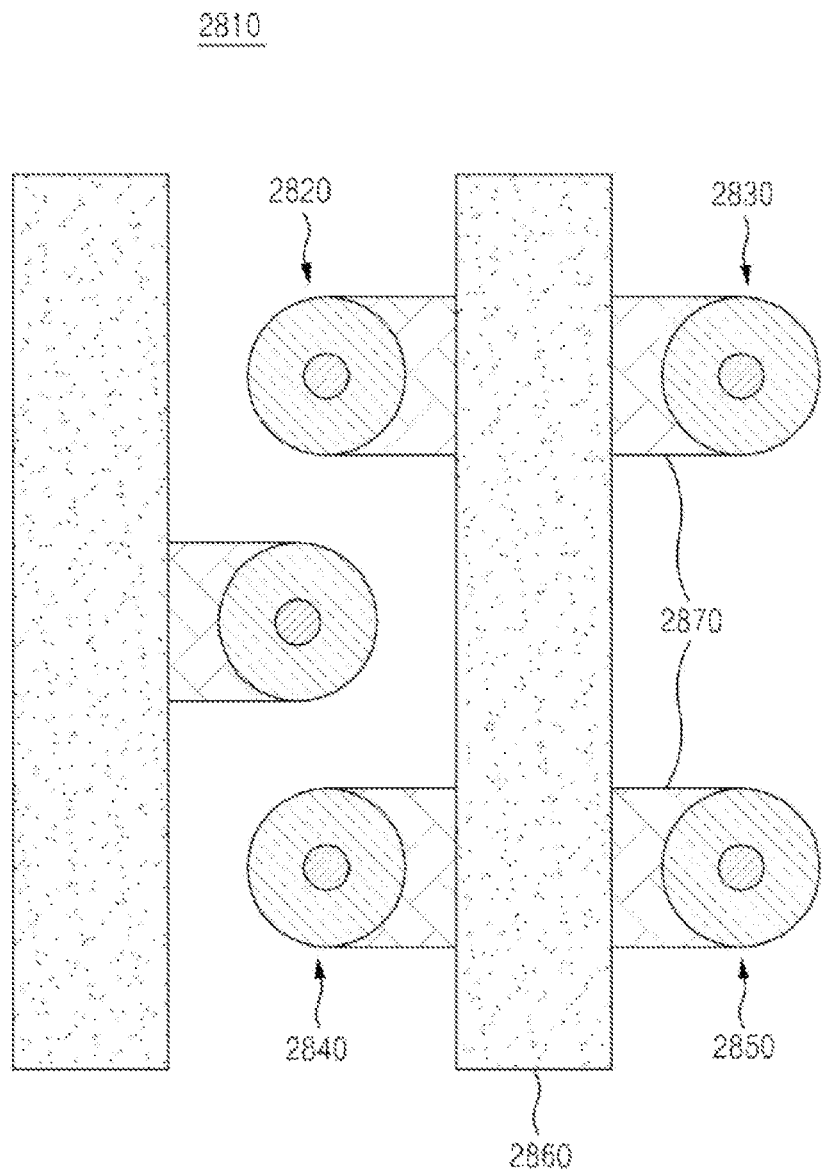
FIG. 28 is a top view illustrating a three-dimensional flash memory according to another embodiment.

FIG. 28 is a top view illustrating a three-dimensional flash memory according to another embodiment.

Referring to FIG. 28, a three-dimensional flash memory 2810 according to another embodiment may has a structure similar to that of the three-dimensional flash memory 2400 described above with reference to FIGS. 24 and 25, but has only a difference in that at least one intermediate wiring layer 2860 is disposed between a plurality of strings 2820, 2830, 2840, and 2850 formed to extend in one direction on a substrate, and the at least one intermediate wiring layer 2860 is connected to each of the plurality of strings 2820, 2830, 2840, and 2850 through a lower buffer layer 2870. In more detail, in the three-dimensional flash memory 2810 according to another embodiment, the at least one intermediate wiring layer 2860 may be formed to be connected to a connection portion of each of the plurality of strings 2820, 2830, 2840, and 2850 by the lower buffer layer 2870, with being disposed in a center region of each of the plurality of strings 2820, 2830, 2840, and 2850 in a direction in which each of the plurality of strings 2820, 2830, 2840, and 2850 is formed to extend, and may be selectively used as one of a source electrode or a drain electrode corresponding to each of the plurality of strings 2820, 2830, 2840, and 2850.

A structure and a function in each element are the same as those of the three-dimensional flash memory 2400 described above with reference to FIGS. 24 and 25, and thus, their detailed descriptions are omitted.

As described above, the embodiments have been described based on a limited embodiment and the drawings, but those of ordinary skill in the art may implement various corrections and modifications from the description. For example, although technologies described above are performed in order which differs from a method described above, and/or elements such as a system, a structure, a device, and a circuit each described above are coupled or combined in a form which differs from the method described above, or are replaced or substituted by another element or an equivalent element, an appropriate result may be achieved.

Therefore, other implementations, other embodiments, and equivalents of claims are within the scope of claims described below.

The invention claimed is:

1. A three-dimensional flash memory comprising:
a plurality of strings each including a channel layer that extends in one direction on a substrate;
a connection portion connecting an upper string of each of the plurality of strings to a lower string of each of the plurality of strings in a middle region of each of the plurality of strings in a direction in which each of the plurality of strings extends; and
an intermediate wiring layer selectively usable as one of a source electrode or a drain electrode corresponding to each of the plurality of strings, and surrounding a connection portion of each of the plurality of strings.

2. The three-dimensional flash memory of claim 1, wherein the intermediate wiring layer is in a plate form and is shared by each of the plurality of strings.

3. The three-dimensional flash memory of claim 1, wherein a plurality of upper selection lines (USL) and a plurality of lower selection lines (LSL) connected to the plurality of strings extend in directions perpendicular to each other in a plane.

4. The three-dimensional flash memory of claim 1, wherein the three-dimensional flash memory is configured to apply a read voltage, having a value to which a compensation voltage value is added, to the lower string of each of the plurality of strings, to compensate for a cell threshold voltage difference between the upper string and the lower string of each of the plurality of strings.

5. A memory device comprising:
a first memory block on a first substrate, the first memory blocking including a lower memory string extending in a first direction perpendicular to a top surface of the first substrate;
a second memory block on the first memory block, the second memory block including an upper memory string extending in the first direction; and
an intermediate conductive region between the first memory block and the second memory block, the intermediate conductive region connecting the lower memory string to the upper memory string.

6. The memory device of claim 5, further comprising a second substrate on the second memory block,
wherein between the first substrate and the second substrate, the first memory block, the intermediate conductive region, and the second memory block is positioned along the first direction.

7. The memory device of claim 5, wherein the first memory block includes:
a first channel layer extending in the first direction;
a plurality of first electrode layers on a sidewall of the first channel layer, the plurality of first electrode layers being spaced apart from each other in the first direction; and
a first charge storage layer between each of the plurality of first electrode layers and the first channel layer,
wherein the second memory block includes:
a second channel layer extending in the first direction;
a plurality of second electrode layers on a sidewall of the second channel layer, the plurality of second electrode layers being spaced apart from each other in the first direction; and
a second charge storage layer between each of the plurality of second electrode layers and the second channel layer.

8. The memory device of claim 7, further comprising a channel connection portion between the first channel layer and the second channel layer,
wherein the intermediate conductive region surrounds at least a portion of a sidewall of the channel connection portion.

9. The memory device of claim 8,
wherein the first channel layer includes N-type polysilicon, wherein the second channel layer includes N-type polysilicon, and wherein the channel connection portion includes N-type polysilicon.

10. The memory device of claim 8, wherein the intermediate conductive region has a plate shape or a line shape.

11. The memory device of claim 7, wherein a the plurality of first electrode layers and the plurality of second electrode layers include a first material, wherein the intermediate conductive region includes a second material, and wherein the second material is substantially the same as the first material.

12. The memory device of claim 5, wherein the intermediate conductive region is selectively usable as one of a drain electrode to the lower memory string or a source electrode to the upper memory string.

13. A memory device comprising:

a plurality of strings on a substrate, the plurality of strings extending in a first direction perpendicular to a top surface of the substrate, wherein each of the plurality of strings comprises:

a lower string on the top surface of the substrate, the lower string extending in the first direction;

an upper string extending in the first direction, the upper string being positioned at a vertical level higher than the lower string with respect to the top surface of the substrate; and a channel connection portion connecting the lower string to the upper string.

14. The memory device of claim 13, wherein the lower string includes:

a first channel layer extending in the first direction;

a plurality of first electrode layers on a sidewall of the first channel layer, the plurality of first electrode layers being spaced apart from each other in the first direction; and a first charge storage layer between each of the plurality of first electrode layers and the first channel layer, wherein the upper string includes:

a second channel layer extending in the first direction;

a plurality of second electrode layers on a sidewall of the second channel layer, the plurality of second electrode layers being spaced apart from each other in the first direction; and a second charge storage layer between each of the plurality of second electrode layers and the second channel layer.

15. The memory device of claim 14, wherein the channel connection portion is in contact with a top surface of the first channel layer and a bottom surface of the second channel layer.

16. The memory device of claim 14, wherein the first channel layer includes N-type polysilicon, wherein the second channel layer includes N-type polysilicon, and wherein the channel connection portion includes N-type polysilicon.

17. The memory device of claim 13, further comprising an intermediate conductive region between the lower string and the upper string, the intermediate conductive region surrounding at least a portion of a sidewall of the channel connection portion.

18. The memory device of claim 17, wherein the intermediate conductive region has a plate shape or a line shape.

19. The memory device of claim 17, wherein the intermediate conductive region surround sidewalls of two adjacent channel connection portions respectively included in two adjacent strings from the plurality of strings.

20. The memory device of claim 17, wherein the intermediate conductive region is selectively usable as one of a drain electrode to the lower string or a source electrode to the upper string.

* * * * *